(12) United States Patent
Park et al.

(10) Patent No.: US 8,570,808 B2
(45) Date of Patent: Oct. 29, 2013

(54) NONVOLATILE MEMORY DEVICE WITH 3D MEMORY CELL ARRAY

(75) Inventors: Jung-hoon Park, Hwaseong-si (KR);
Kyung-Hwa Kang, Seoul (KR);
Chi-Weon Yoon, Seoul (KR);
Sang-Wan Nam, Hwaseong-si (KR);
Sung-Won Yun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 132 days.

(21) Appl. No.: 13/186,987

(22) Filed: Jul. 20, 2011

(65) Prior Publication Data

US 2012/0033501 A1 Feb. 9, 2012

(30) Foreign Application Priority Data

Aug. 9, 2010 (KR) .................. 10-2010-0076537
Feb. 9, 2011 (KR) .................. 10-2011-0011609

(51) Int. Cl.
*G11C 16/04* (2006.01)

(52) U.S. Cl.
USPC ............ 365/185.18; 365/185.19; 365/189.09; 365/189.16

(58) Field of Classification Search
USPC .............. 365/185.18, 185.19, 189.09, 189.16
See application file for complete search history.

(56) References Cited

U.S. PATENT DOCUMENTS

| 7,257,024 | B2 | 8/2007 | Rudeck et al. | |
| 7,295,478 | B2 | 11/2007 | Wan et al. | |
| 7,372,754 | B2 | 5/2008 | Hwang et al. | |
| 7,447,086 | B2 | 11/2008 | Wan et al. | |
| 8,125,817 | B2 * | 2/2012 | Takagi et al. | 365/148 |
| 8,203,187 | B2 * | 6/2012 | Lung et al. | 257/390 |
| 2011/0286283 | A1 * | 11/2011 | Lung et al. | 365/185.28 |

FOREIGN PATENT DOCUMENTS

| JP | 2006-114078 | 4/2006 |
| JP | 2007-035249 | 2/2007 |
| JP | 2009-146942 | 7/2009 |
| JP | 2009-266281 | 11/2009 |
| JP | 2010-102755 | 5/2010 |
| KR | 1020070013601 A | 1/2007 |

* cited by examiner

*Primary Examiner* — Pho M Luu
(74) *Attorney, Agent, or Firm* — Volentine & Whitt, PLLC

(57) ABSTRACT

A nonvolatile memory device includes a 3D memory cell array having words lines that extend from a lowest memory cell array layer closest to a substrate to a highest memory cell array layer farthest from the substrate, a voltage generator circuit generating first and second voltage signals, and a row selecting circuit that simultaneously applies the first voltage signal to a selected word line and the second voltage signal to an unselected word line. The selected word line and the unselected word line have different resistances, yet the first voltage signal is applied to the selected word line and the second voltage signal is applied to the unselected word line with a same rising slope over a defined period of time.

19 Claims, 53 Drawing Sheets

Fig. 18

| MC | | State | On/Off | Channel |
|---|---|---|---|---|
| | MC7 | E | On | VBL |
| | MC6 | E | | |
| | MC5 | E | | |
| | MC4 | E | | |
| | MC3 | P3 | Off | Off |
| | MC2 (Selected) | E | On | Vss |
| | MC7 | E | | |

NONVOLATILE MEMORY DEVICE WITH 3D MEMORY CELL ARRAY

CROSS-REFERENCE TO RELATED APPLICATIONS

A claim of priority under 35 U.S.C §119 is made to Korean Patent Application Nos. 10-2010-0076537 filed Aug. 9, 2010, and 10-2011-0011609 filed Feb. 9, 2010, the collective subject matter of which is hereby incorporated by reference.

BACKGROUND

The inventive concept relates generally to semiconductor memory devices and nonvolatile memory devices in particular.

Semiconductor memory devices may be broadly classified as volatile or non-volatile in their operative nature. Volatile memory devices lose stored data in the absence of applied power, and include Static RAM (SRAM), Dynamic RAM (DRAM), Synchronous DRAM (SDRAM), and the like. Non-volatile memory devices retain stored data even in the absence of applied power. Non-volatile memory devices include Read Only Memory (ROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM), and the like. Flash memory is currently an important type of non-volatile memory and includes NOR-type flash memory and NAND-type flash memory.

Increasing demand for data storage density per unit area occupied by semiconductor memory devices has motivated the development of semiconductor memory device having three-dimensional (3D) memory cell array architectures. However, the effective design and fabrication of 3D memory cell arrays are difficult tasks.

SUMMARY

In one embodiment, the inventive concept is directed to a nonvolatile memory device comprising; a three-dimensional memory cell array including a plurality of memory cells arranged in a plurality memory cell array layers stacked on a substrate, such that a plurality of words lines extends across the plurality of memory cell array layers from a lowest memory cell array layer closest to the substrate to a highest memory cell array layer farthest from the substrate, a voltage generator circuit that generates a first voltage signal and a second voltage signal, and a row selecting circuit that simultaneously applies the first voltage signal to a selected word line among the plurality of word lines and the second voltage signal to an unselected word line among the plurality of word lines. The selected word line and the unselected word line have different resistances, but the first voltage signal is applied to the selected word line and the second voltage signal is applied to the unselected word line with a same rising slope over a defined period of time.

In another embodiment, the inventive concept is directed to a nonvolatile memory device comprising; a three-dimensional (3D) memory cell array including a plurality of memory cells arranged in a plurality memory cell array layers stacked on a substrate, such that a plurality of words lines extends across the plurality of memory cell array layers from a lowest memory cell array layer closest to the substrate to a highest memory cell array layer farthest from the substrate, wherein the 3D memory cell array comprises a pillar that extends through the plurality of memory cell array layers and that progressively narrows in width as it extends from the highest memory cell array layer to the lowest memory cell array layer, a voltage generator circuit that generates a first voltage signal and a second voltage signal, and a row selecting circuit that simultaneously applies the first voltage signal to a selected word line among the plurality of word lines and the second voltage signal to an unselected word line among the plurality of word lines. Each one of the plurality of words lines intersects the pillar with a different cross-sectional area, such that the selected word line and the unselected word line have different resistances, and the first voltage signal is applied to the selected word line and the second voltage signal is applied to the unselected word line with a same rising slope over a defined period of time.

BRIEF DESCRIPTION OF THE DRAWINGS

The above and other features will become apparent from the following description with reference to the following figures.

FIG. 18 is a table summarizing memory cells states that together describe a read disturbance due to driving signals having different rising slopes.

DETAILED DESCRIPTION

Figure 1:
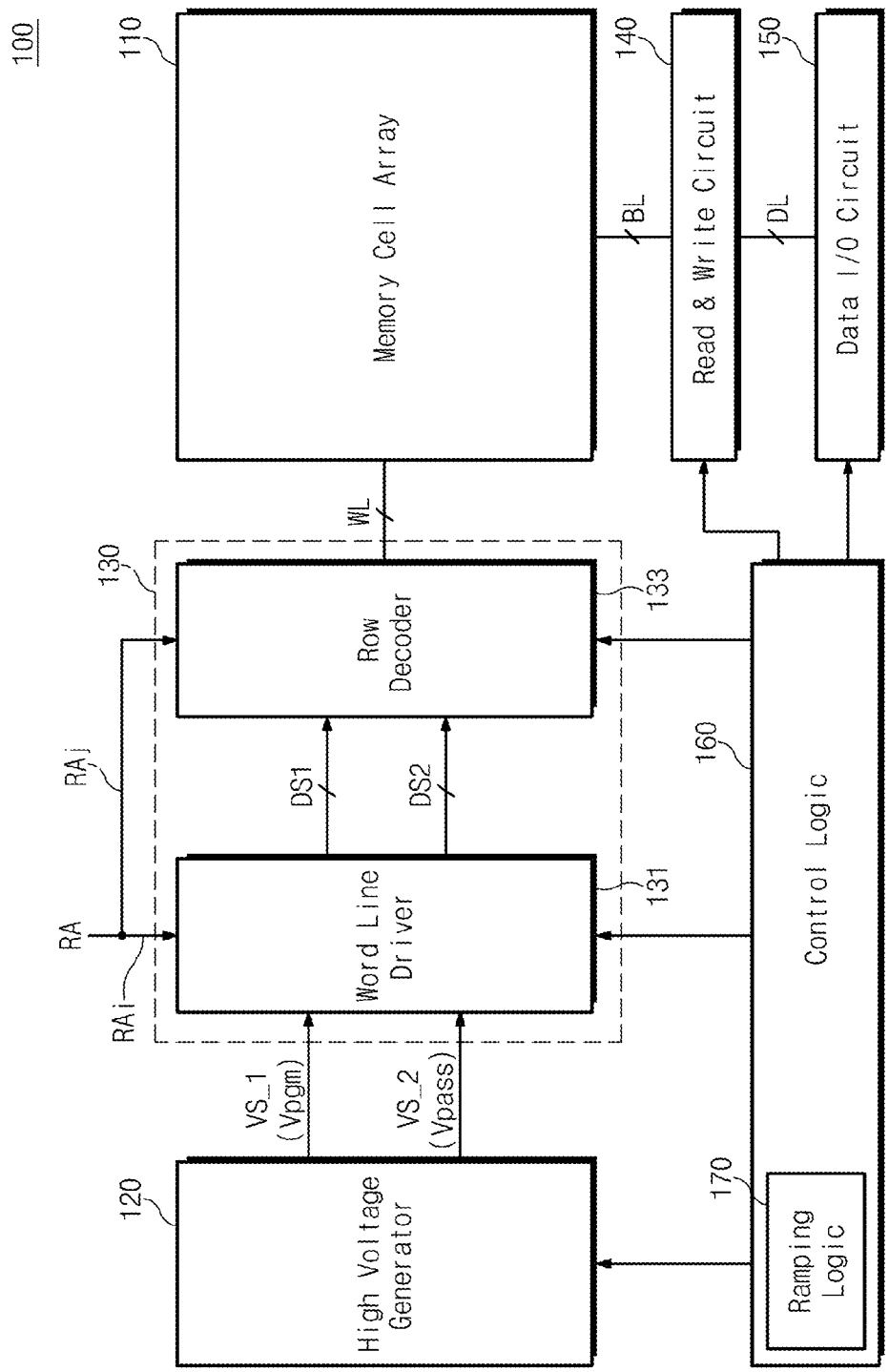
FIG. 1 is a block diagram illustrating a nonvolatile memory device according to an embodiment of the inventive concept.

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Among other challenges associated with design and fabrication of three dimensional (3D) memory cell arrays, it has been noted that certain driving signals, such as those provided to word lines during program, read and erase operations, may have different rising slopes due to variations in fabrication processes and/or operating factors. Read margin may be reduced due to these differences in the rising slop of driving signals. Decreased read margin may in extreme circumstances result in read failures.

Nonvolatile memory devices according to certain embodiments of the inventive concept are capable of maintaining substantially constant rising slopes for driving signals using a ramping technique. Accordingly, it is possible to prevent the loss of read margin. For simplicity of description and in order to avoid repetition, a nonvolatile memory device according to embodiments of the inventive concept will be described in the context of a program operation. In this context, a "program operation" is any operation that inputs data to one or more nonvolatile memory cells. Those skilled in the art will understand how considerations of stable driving signal (i.e., constant rising slope) described hereafter may readily be applied to all types of driving signals, such as those analogously used during read and erase operations.

FIG. 1 is a block diagram showing a nonvolatile memory device according to an embodiment of the inventive concept. Referring to FIG. 1, a nonvolatile memory device 100 generally comprises in relevant part; a memory cell array 110, a high voltage generator 120, a row selecting circuit 130, a read/write circuit 140, a data input/output (I/O) circuit 150, and control logic 160.

The memory cell array 110 is connected to the row selecting circuit 130 via a plurality of word lines (collectively and separately indicated as "WL"). The memory cell array 110 is connected to the R/W circuit 140 via a plurality of bit lines (collectively and separately indicated as "BL"). The memory cell array 110 includes a plurality of memory cells, each respectively capable of storing one or more bits of data.

In the example of FIG. 1, the high voltage generator 120 is configured to generate a first voltage signal VS_1 and a second voltage signal VS_2 in response to the control of pumping logic 170. Herein, the first voltage signal VS_1 may be a voltage signal indicating that a target voltage is a program voltage Vpgm, and the second voltage signal VS_2 may be a voltage signal indicating that a target voltage is a pass voltage.

During a program operation, the high voltage generator 120 increases a voltage level of the first voltage signal VS_1 up to a program voltage Vpgm using a constant ramp function (e.g., a constant voltage rise over a defined time period) under the control of the ramping logic 170. The first voltage signal VS_1 may thus be provided to a selected word line via the row selecting circuit 130. That is, the selected word line may be supplied with the first voltage signal VS_1 as it ramps up to the program voltage Vpgm. The stable ramping function thus described may be alternately described as having a constant ramping step (e.g., a rise in voltage over run in time).

Also during the program operation, the high voltage generator 120 increase a voltage level of the second voltage signal VS_2 up to a pass voltage Vpass using a constant ramping step under the control of the ramping logic 170. The second voltage signal VS_2 may thus be provided to unselected word lines via the row selecting circuit 130. The constant ramping step(s) used to define the first voltage signal VS_1 and the second voltage signal VS_2 may be the same or different.

The row selecting circuit 130 receives the first and second voltage signals VS_1 and VS_2 from the high voltage generator 120. In the illustrated example of FIG. 1, the row selecting circuit 130 include a word line driver 131 and a row decoder 133.

The word line driver 131 receives the first and second voltage signals VS_1 and VS_2 from the high voltage generator 120, and provides appropriate signal lines with either the first voltage signal VS_1 or the second voltage signal VS_2 in accordance with an applied row address RA, or more particularly a first portion RAi of the row address RA. During a program operation, for example, the word line driver 131 may provide the first voltage signal VS_1 as a driving signal DS to a signal line corresponding to a selected word line. The word line driver 131 may provide the second voltage signal VS_2 as driving signals DS to signal lines each corresponding to unselected word lines.

The row decoder 133 receives the variously defined driving signals DS from the word line driver 131, and in response to the row address RA, or more particularly a second portion RAj of the row address RA, applies the driving signals DS to the word lines of the memory cell array 110.

In certain embodiments of the inventive concept, the second portion of the address RAj provided to the row decoder 133 may be an address selecting a particular memory block (BLKi) from among a plurality of memory blocks (BLK1 through BLKz). In such a case, the row decoder 133 effectively transfers the driving signals DS to the word lines associated with a selected memory block. Accordingly, the first voltage signal VS_1 being a first driving signal DS1 may be provided to a selected word line, and the second voltage signal VS_2 being a second driving signal DS2 may be provided to unselected word lines.

The R/W circuit 140 is connected to the memory cell array 110 via the bit lines BL and to the data I/O circuit 150 via data lines DL. The R/W circuit 140 is capable of receiving data from the data I/O circuit 150 to write the received data in the memory cell array 110. The R/W circuit 140 is also capable of receiving data read from the memory cell array 110 and transferring the read data to the data I/O circuit 150. In certain embodiments, the R/W circuit 140 may include constituent and conventionally understood elements such as a page buffer (or, a page register) capable of reading and/or writing data, a column selecting circuit selecting bit lines, and the like.

As noted, the data I/O circuit 150 is connected to the R/W circuit 140 via a plurality of data lines DL. The data I/O circuit 150 operates under the control of the control logic 160 in order to exchange data between one or more external device(s) and the R/W circuit 140. In certain embodiments, the data I/O circuit 150 may include constituent and conventionally understood elements such as a data buffer, etc.

The control logic 160 controls the overall operation of the nonvolatile memory device 100 including at least the high voltage generator 120, the row selecting circuit 130, the R/W circuit 140, and the data I/O circuit 150. In the example illustrated in FIG. 1, the control logic 160 includes the ramping logic 170 which, as noted above, may control the high voltage generator 120 to generate the first and second voltage signals VS_1 and VS_2.

Since the first and second voltage signals VS_1 and VS_2 stepwise increase according to a defined ramping step, the driving signals DS ultimately applied to the word lines WL may be maintained with a constant rising slope regardless of variable loading caused, for example, different word line resistances. Accordingly, it is possible to prevent a loss of read margin due to differences in programming speed among word lines. Hereafter, the memory cell array 110 according to certain embodiments of the inventive concept will be described in some additional detail.

Figure 2:
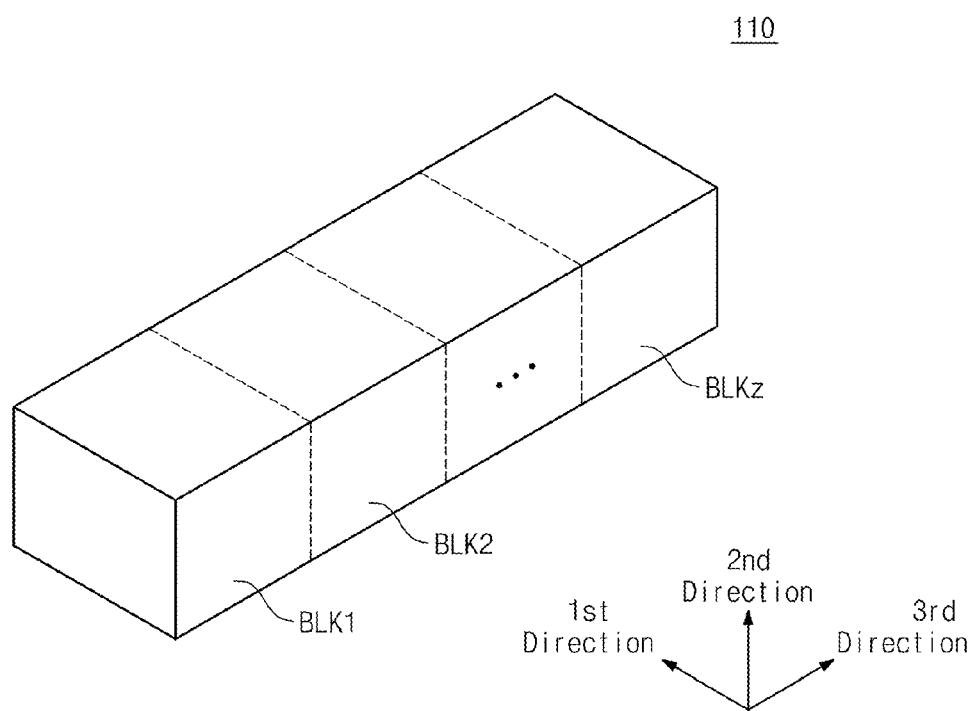
FIG. 2 is a conceptual block diagram further illustrating the memory cell array of FIG. 1.

FIG. 2 is a general block diagram of the memory cell array 110 of FIG. 1. Referring to FIG. 2, a memory cell array 110 includes a plurality of memory blocks BLK1 to BLKz, each of which has a 3D structure or a vertical structure. In this context, the term "vertical" arbitrarily assumes a memory cell array orientation, wherein rows and columns of individual memory cell layers are arranged in X-Y planes and multiple memory cell layers are then vertically stacked one upon the other in an orthogonal Z direction. Hence, each memory block BLK may be said to extend in first, second and third directions.

In certain embodiments of the inventive concept, each memory block BLK includes a plurality of NAND strings (NS) extending along one of the first, second, or third directions. Each NAND string may be coupled to a bit line BL, a string selection line SSL, a ground selection line GSL, word lines WL, and a common source line CSL. That is, each memory block may be coupled with a plurality of bit lines BL, a plurality of string selection lines SSL, a plurality of ground selection lines GSL, a plurality of word lines WL, and a common source line CSL. The memory blocks BLK1 to BLKz will be described in some additional detail with reference to FIG. 3.

In the embodiments illustrated in FIGS. 1 and 2, for example, the memory blocks BLK1 to BLKz may be uniquely or collectively selected by the row selecting circuit 130. For example, the row selecting circuit 130 may select a particular memory block BLKi corresponding to a decoded row address among the memory blocks BLK1 to BLKz.

Figure 3:
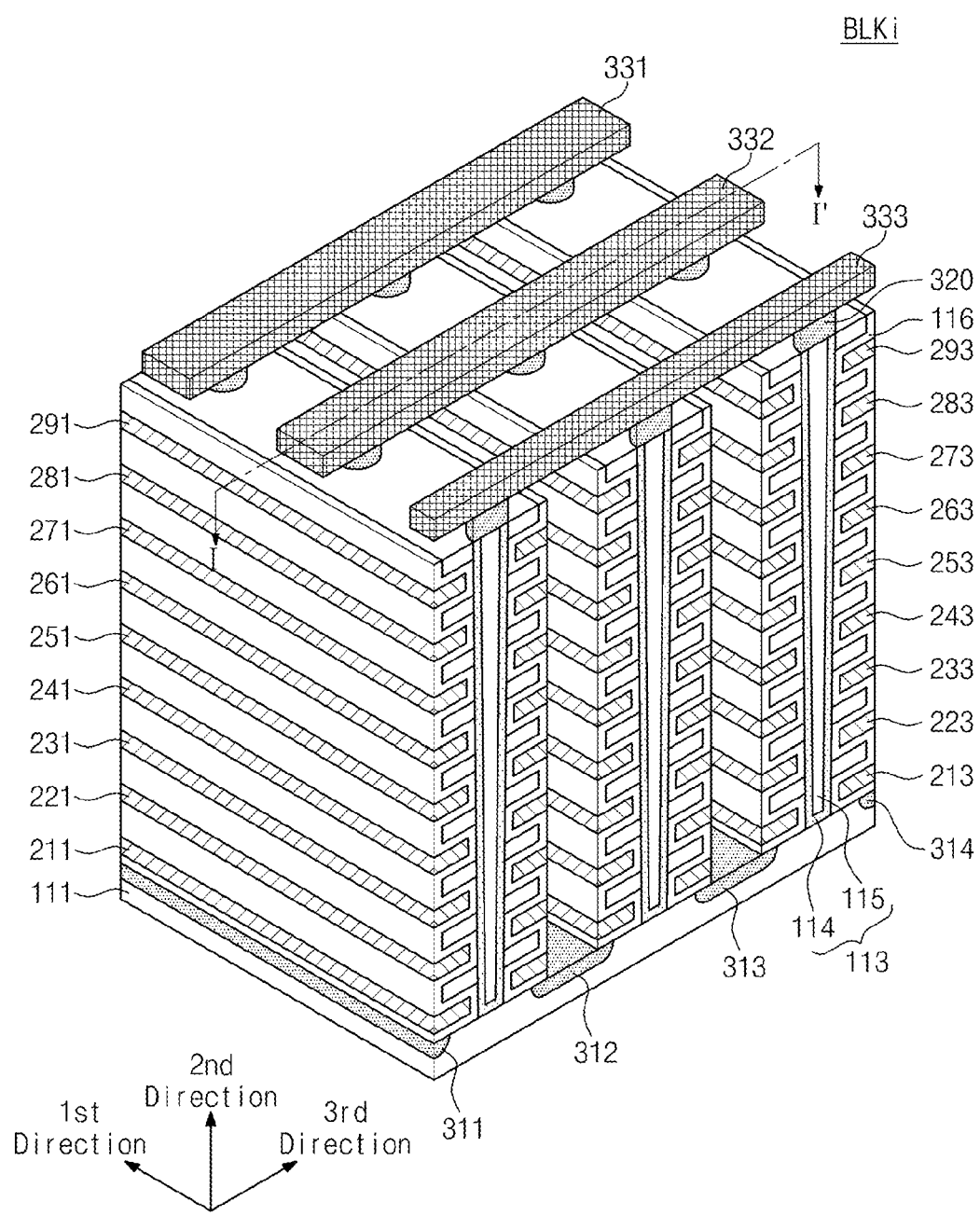
FIG. 3 is a perspective view further illustrating the memory blocks of FIG. 2 according to certain embodiments of the inventive concept.
Figure 4:
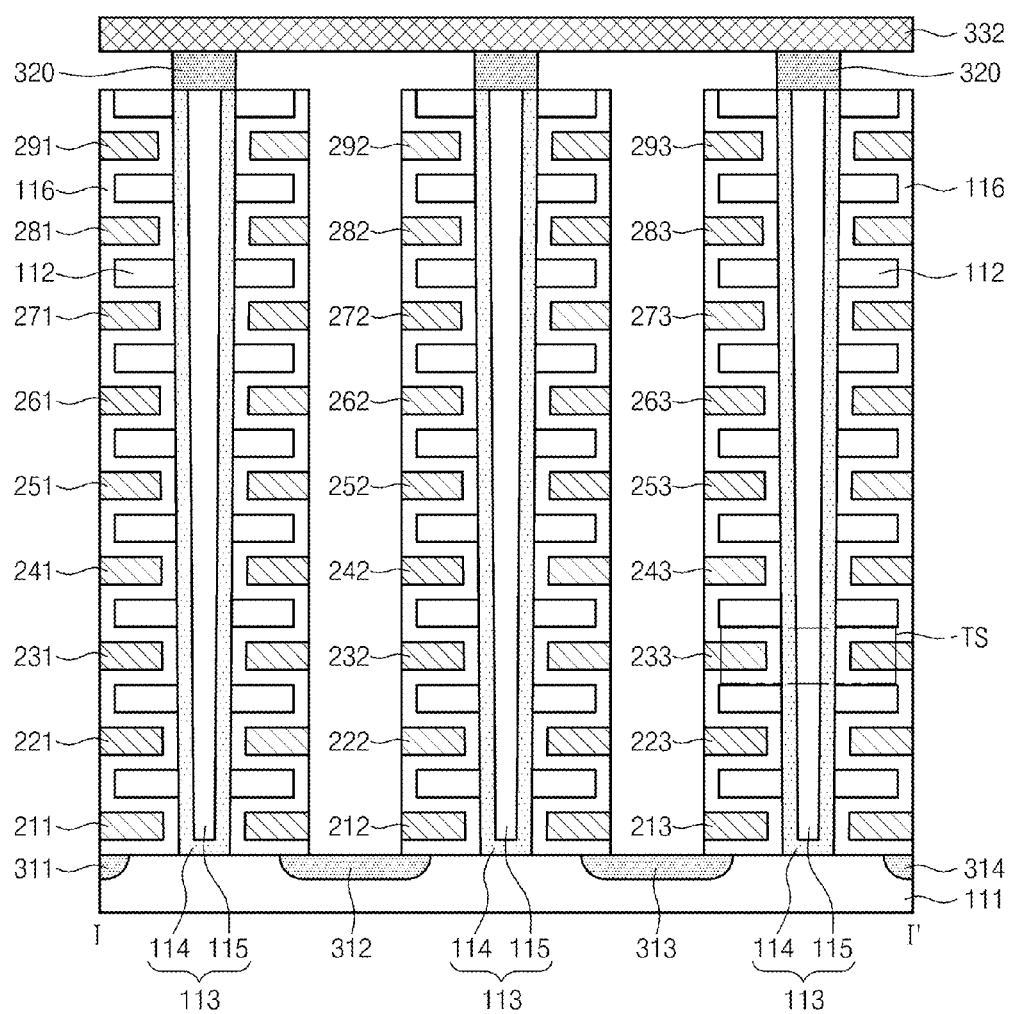
FIG. 4 is a cross-sectional view of a memory block taken along a line I-I' in FIG. 3.

FIG. 3 is a perspective view further illustrating one of the memory blocks of FIG. 2 according to an embodiment of the inventive concept. FIG. 4 is a cross-sectional view of the memory block taken along a line I-I' in FIG. 3.

Referring to FIGS. 3 and 4, a memory block BLKi includes structures extending in first, second and third directions.

A semiconductor device implementing the memory block BLKi may be formed on a substrate 111. Exemplarily, the substrate 111 may be a well region formed from impurities of first type. For example, the substrate 111 may be a p-well formed by injecting one or more group-V element(s) such as boron (B). As an example, the substrate 111 may be a pocket p-well provided in an n-well. Hereinafter, it is assumed that the substrate 111 is a p-well. However, the substrate 111 is not limited thereto.

A plurality of doping regions 311 to 314 extending along the first direction may be provided in the substrate 111. For example, a plurality of doping regions 311 to 314 may have a second type different from that of the substrate 111, respectively. For example, the doping regions 311 to 314 may be n-type. Hereinafter, it is assumed that the first to fourth doping regions 311 to 314 are n-type. However, the first to fourth doping regions 311 to 314 are not limited thereto.

On a region of the substrate 111 between the first and second doping regions 311 and 312, a plurality of insulating materials 112 extending along the first direction may be sequentially provided along the second direction. For example, the plurality of insulating materials 112 may be spaced apart from one another along the second direction. Exemplarily, the insulating materials 112 may include an insulating material such as silicon oxide.

On the region of the substrate 111 between the first and second doping regions 311 and 312, a plurality of pillars 113 may be disposed along the first direction and may be formed to pass through the insulating materials 112 along the second direction. Exemplarily, each of the pillars 113 may be connected to the substrate 111 through the insulating materials 112.

Exemplarily, each pillar 113 may be formed of a plurality of materials. For example, a surface layer 114 of each pillar 113 may include a silicon material having a first type. For example, the surface layer 114 of each pillar 113 may include a silicon material having the same type as the substrate 111. Hereinafter, it is assumed that the surface layer 114 of each pillar 113 includes p-type silicon. However, the surface layer 114 of each pillar 113 may not be limited thereto.

An inner layer 115 of each pillar 113 may be formed of an insulating material. For example, the inner layer 115 of each pillar 113 may include an insulating material such as silicon oxide. As an example, the inner layer 115 of each pillar 113 may include an air gap.

Between the first and second doping regions 311 and 312, an insulation layer 116 may be provided along exposed surfaces of the substrate 11, the insulating materials 112, and the pillars 113. For example, there may be removed the insulating layer 116 which is provided on an exposed surface (placed toward the second direction) of the last insulating material 112 provided along the second direction.

For example, the thickness of the insulation layer 116 may be less than one-half of a distance between the insulating materials 112. That is, a region, in which a material other than the insulating materials 112 and the insulation layer 116 is disposed, may be provided between an insulation layer 116 provided at a lower surface of a first insulating material among the insulating materials 112 and an insulation layer 116 provided at an upper surface of a second insulating material in the lower portion of the first insulating material.

Between the first and second doping regions 311 and 312, conductive materials 211 to 291 may be provided on an exposed surface of the insulation layer 116. For example, the conductive material 211 extending along the first direction may be provided between the substrate 111 and the insulating material 112 adjacent to the substrate 111. More specifically, the conductive material 211 extending along the first direction may be provided between the substrate 111 and the insulation layer 116 of a lower surface of the insulating material 112 adjacent to the substrate 111.

Hereinafter, heights of the first conductive materials 211 to 291, 212 to 292, and 213 to 293 may be defined. The first conductive materials 211 to 291, 212 to 292, and 213 to 293 may be defined to have first to ninth heights sequentially from the substrate 111. That is, the first conductive materials 211 to 213 adjacent to the substrate 111 may have the first height. The first conductive materials 291 to 293 adjacent to the second conductive materials 331 to 333 may have the ninth height. As a distance between the first conductive material and the substrate 111 increases, the height of the first conductive material may increase.

A first conductive material extending along the first direction may be provided between the insulation layer 116 of an upper surface of a specific insulating material among the insulating materials 112 and the insulation layer 116 of a lower surface of an insulating material disposed at an upper portion of the specific insulating material. Exemplarily, the first conductive materials 221 to 281 extending along the first direction may be provided between the insulating materials 112. Exemplarily, the first conductive materials 211 to 291 may be metal materials. Exemplarily, the first conductive materials 211 to 291 may be conductive materials such as polysilicon.

The same structure as a structure on the first and second doping regions 311 and 312 may be provided between the second and third doping regions 312 and 313. Between the second and third doping regions 312 and 313, exemplarily, provided are the insulating materials 112 extending along the first direction, the pillars 113 sequentially disposed along the first direction and passing through the insulating materials 112 along the third direction, the insulation layer 116 provided exposed surfaces of the pillars 113 and the insulating materials 112, and the first conductive materials 212 to 292 extending along the first direction.

The same structure as a structure on the first and second doping regions 311 and 312 may be provided between the third and fourth doping regions 313 and 314. Between the third and fourth doping regions 313 and 314, exemplarily, provided are the insulating materials 112 extending along the first direction, the pillars 113 sequentially disposed along the first direction and passing through the insulating materials 112 along the third direction, the insulation layer 116 provided on exposed surfaces of the pillars 113 and the insulating materials 112, and the first conductive materials 213 to 293 extending along the first direction.

Drains 320 may be provided on the pillars 113, respectively. Exemplarily, the drains 320 may be second-type silicon materials. For example, the drains 320 may be n-type silicon materials. Hereinafter, it is assumed that the drains 320 include n-type silicon. However, the drains 320 are not limited thereto. Exemplarily, the width of each of the drains 320 may be wider than that of a corresponding pillar 113. For example, each drain 320 may be provided on an upper surface of a corresponding pillar 113 to have a pad shape.

Second conductive materials 331 to 333 extending along the third direction may be provided on the drains 320. The second conductive materials 331 to 333 may be sequentially disposed along the first direction. Each of the second conductive materials 331 to 333 may be connected to corresponding drains 320, respectively. Exemplarily, the drains 320 and the second conductive material 333 extending along the third direction may be connected through contact plugs. Exemplarily, the second conductive materials 331 to 333 may be metal materials. Exemplarily, the second conductive materials 331 to 333 may be conductive materials such as polysilicon.

In FIGS. 3 and 4, each pillar 113 may form a string together with an adjacent region of the insulation layer 116 and an adjacent region among a plurality of first conductive lines 211 to 291, 212 to 292, and 213 to 293. For example, each pillar 113 may form a NAND string NS together with an adjacent region of the insulation layer 116 and an adjacent region among a plurality of first conductive lines 211 to 291, 212 to 292, and 213 to 293. The NAND string NS may include a plurality of transistor structures TS. The transistor structure TS will be described below in more detail with reference to FIG. 5.

Figure 5:
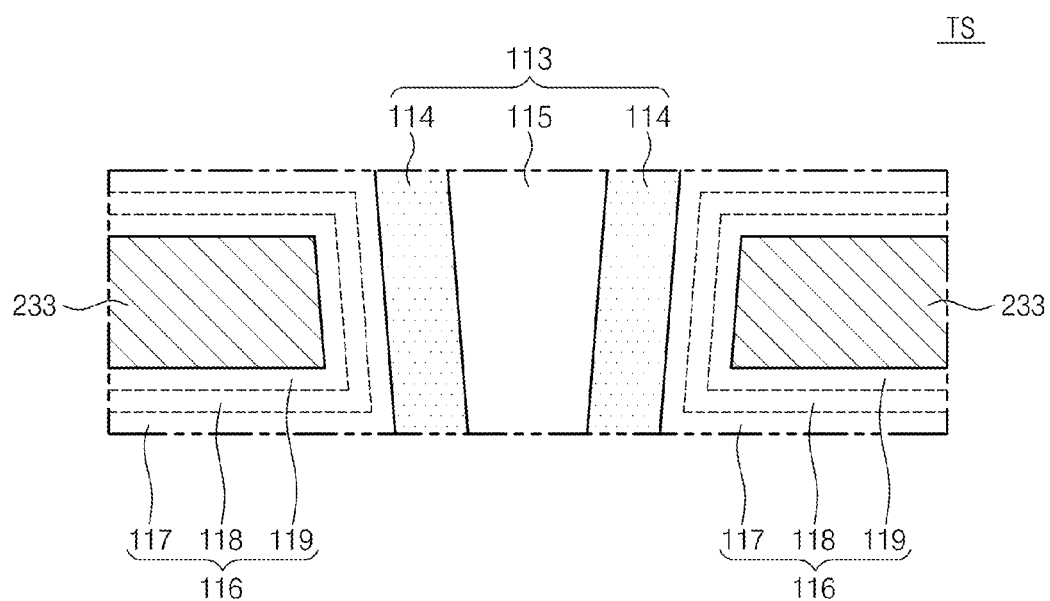
FIG. 5 is a cross-sectional view further illustrating the transistor structure of FIG. 4.

FIG. 5 is a cross-sectional view further illustrating a transistor structure of the type that may be used in the configuration of FIG. 4. Referring to FIGS. 3, 4 and 5, an insulation layer 116 may include first to third sub-insulation layers 117 to 119.

A surface layer, including p-type silicon, of a pillar 113 may serve as a body. The first sub-insulation layer 117 adjacent to the pillar 113 may serve as a tunneling insulation layer. For example, the first sub-insulation layer 117 adjacent to the pillar 113 may include a thermal oxide layer.

The second sub-insulation layer 118 may serve as a charge storage layer. For example, the second sub-insulation layer 118 may serve as a charge trapping layer. For example, the second sub-insulation layer 118 may include a nitride layer or metal oxide layer (for example, an aluminum oxide layer, or a hafnium oxide layer).

The third sub-insulation layer 119 adjacent to the first conductive material 233 may serve as a blocking insulation layer. Exemplarily, the third sub-insulation layer 119 adjacent to the conductive material 233 extending along the first direction may be formed of a single layer or a multi-layer. The third sub-insulation layer 119 may be a high dielectric layer (for example, an aluminum oxide layer, a hafnium oxide layer, etc.) having a higher dielectric constant than the first and second sub-insulation layers 117 and 118.

The first conductive material 233 may serve as a gate (or a control gate). That is, the first conductive material 233 serving as the gate (or the control gate), the third sub-insulating layer 119 serving as a blocking insulation layer, the second sub-insulation layer 118 serving as a charge storage layer, the first sub-insulation layer 117 serving as a tunneling insulation layer, and the surface layer 114 including p-type silicon and serving as a body may constitute a transistor (or a memory cell transistor structure). Exemplarily, the first to third sub-insulation layers 117 to 119 may form oxide-nitride-oxide (ONO). Hereinafter, the surface layer 114, including p-type silicon, of the pillar 113 may be referred to as a second-direction body.

The memory block BLKi may include the plurality of pillars 113. That is, the memory block BLKi may include a plurality of NAND strings NS. In more detail, the memory block BLKi may include a plurality of NAND strings NS extending along the second direction (or a direction vertical to the substrate). Each NAND string NS may include a plurality of transistor structures TS disposed along the second direction. At least one of the transistor structures TS in each NAND string NS may serve as a string selection transistor SST. At least one of the transistor structures TS of each NAND string NS may serve as a ground selection transistor GST.

Gates (or control gates) may correspond to the first conductive materials 211 to 291, 212 to 292, and 213 to 293 extending along the first direction. That is, the gates (or the control gates) may extend along the first direction and may form word lines and at least two selection lines (e.g., at least one string selection line SSL and at least one ground selection line GSL).

The second conductive materials 331 to 333 extending along the third direction may be connected to one ends of the NAND strings NS, respectively. Exemplarily, the second conductive materials 331 to 333 extending along the third direction may serve as bit lines BL. That is, in one memory block BLKi, a plurality of NAND strings may be connected to one bit line BL.

Second-type doping regions 311 to 314 extending along the first direction may be provided to the other ends of the NAND strings. The second-type doping regions 311 to 314 extending along the first direction may serve as the common source line CSL.

To sum up the above description, the memory block BLKi may include a plurality of NAND strings extending along a direction (i.e., the second direction) vertical to the substrate 111, and may server as a NAND flash memory block (for example, a charge trapping type) where the plurality of NAND strings NS is connected to one bit line BL.

In FIGS. 3, 4 and 5, an exemplary case has been described wherein the first conductive lines 211 to 291, 212 to 292, and 213 to 293 are provided in nine (9) respective layers. However, the first conductive lines 211 to 291, 212 to 292, and 213 to 293 are not limited thereto. For example, the first conductive lines may be provided on at least eight layers forming memory cells and at least two layers forming selection transistors. The first conductive lines may be provided on at least sixteen layers forming memory cells and at least two layers forming selection transistors. Also, the first conductive lines may be provided on a plurality of layers forming memory cells and at least two layers forming selection transistors. For example, the first conductive lines can be provided on a layer forming dummy memory cells.

In FIGS. 3, 4 and 5, an exemplary case has been described wherein three (3) NAND strings NS are connected to one (1) bit line BL. However, the inventive concept may not be limited thereto. Exemplarily, in the memory block BLKi, m NAND strings NS may be connected to one bit line BL. In this case, the number of conductive materials 211 to 291, 212 to 292, and 213 to 293 extending along the first direction and the number of doping regions 311 to 314 serving as the common source line CSL may also be controlled in proportion to the number of NAND strings NS connected to one bit line BL.

In FIGS. 3, 4 and 5, an exemplary case has been described wherein three (3) NAND strings NS are connected to one first conductive material extending along the first direction. However, the inventive concept is not limited thereto. For example, n NAND strings NS may be connected to one first conductive material. In this case, the number of bit lines 331 to 333 may be controlled in proportion to the number of NAND strings NS that are connected to one first conductive material.

For example, the closer to the substrate 111, the less of an area pillar 113 must take along the first/third direction. For example, the area of the pillar 113 taken along the first/third direction may be varied due to process characteristics or errors.

Exemplarily, the pillar 113 may be formed by providing materials such as a silicon material and an insulating material in a hole formed by etching. As an etching depth increases, the effective area of a hole formed via an etching process taken along the first/third direction may decrease. That is, as the distance in the second direction to the substrate 111 decreases, the area occupied by the pillar 113 in the first and/or third directions shrinks.

Figure 6:
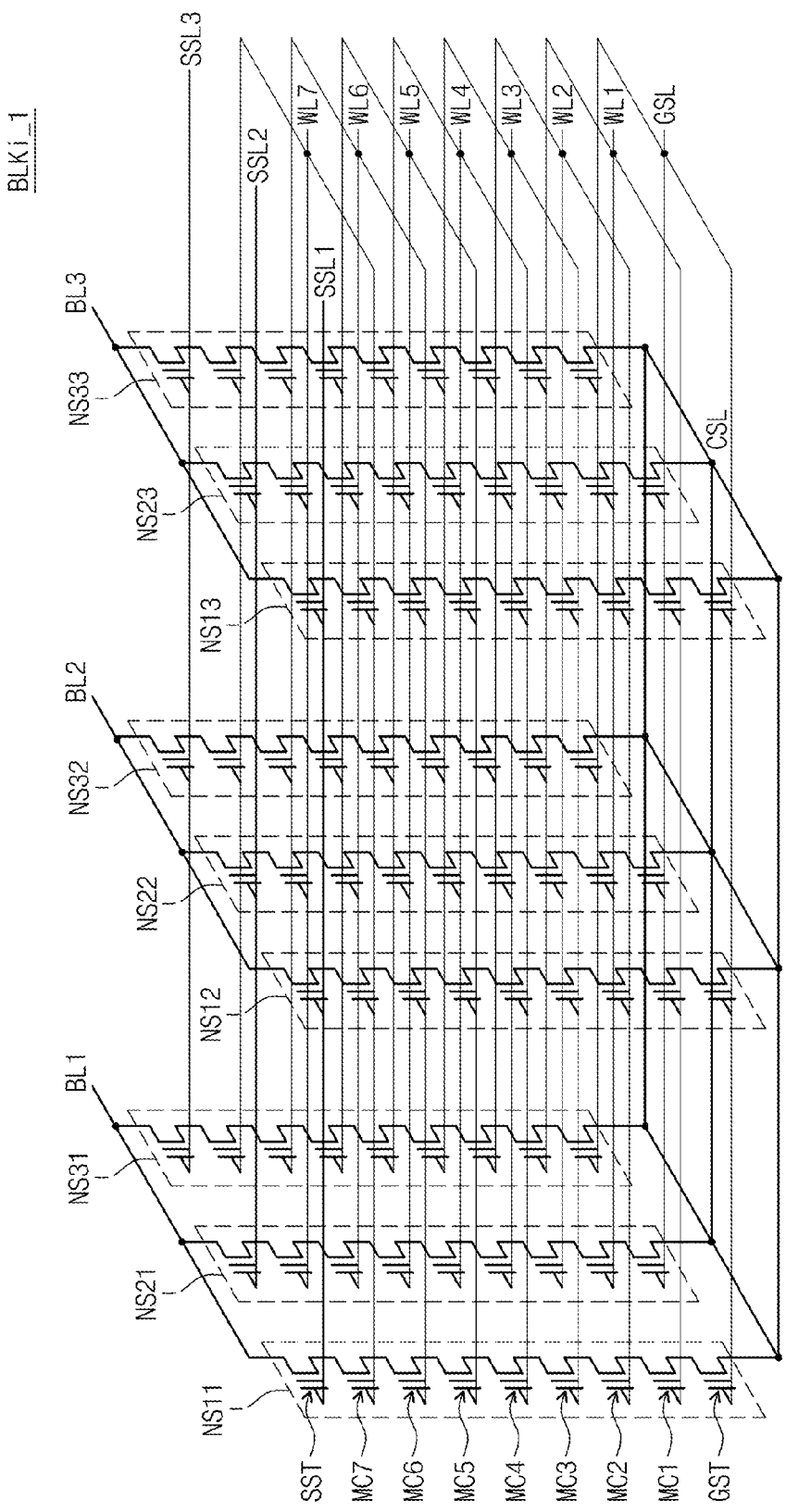
FIG. 6 is an equivalent circuit diagram of a memory block shown, for example, in FIGS. 3, 4 and 5 according to certain embodiments of the inventive concept.

FIG. 6 is an equivalent circuit for the memory block in FIGS. 3, 4 and 5 according to an embodiment of the inventive concept.

Referring to FIGS. 3 through 6, NAND strings NS11 to NS31 may be provided between a first bit line BL1 and a common source line CSL. NAND strings NS12 to NS32 may be provided between a second bit line BL2 and the common source line CSL. NAND strings NS13 to NS33 may be provided between a third bit line BL3 and the common source line CSL. The first to third bit lines BL1 to BL3 may correspond to the second conductive materials 331 to 333 extending along the third direction, respectively.

The string selection transistor SST of each NAND string NS may be connected to a corresponding bit line BL. The ground selection transistor GST of each NAND string NS may be connected to the common source line CSL. Memory cells MC may be provided between the string selection transistor SST and the common source line CSL in each NAND string NS.

Hereinafter, NAND strings NS may be defined in row and column units. The NAND strings NS connected in common to one bit line may form one column. For example, the NAND strings NS11 to NS31 connected to the first bit line BL1 may correspond to a first column. The NAND strings NS12 to NS32 connected to the second bit line BL2 may correspond to a second column. The NAND strings NS13 to NS33 connected to the third bit line BL3 may correspond to a third column.

The NAND strings connected to one string selection line SSL may form one row. For example, the NAND strings NS11 to NS13 connected to a first string selection line SSL1 may form a first row. The NAND strings NS21 to NS23 connected to a second string selection line SSL2 may form a second row. The NAND strings NS31 to NS33 connected to a third string selection line SSL3 may form a third row.

In each NAND string NS, a height is defined. Consistent with the illustrated examples, in each NAND string NS, the height of the ground selection transistor GST may be defined as layer or level 1, or simply "1". The height of a memory cell MC1 adjacent to the ground selection transistor GST may be defined as 2. The height of the string selection transistor SST may be defined as 9. The height of a memory cell MC7 adjacent to the string selection transistor SST may be defined as 8. As a distance between the memory cell MC and the ground selection transistor GST increases, the height of the memory cell MC may increase. That is, the first through seventh memory cells MC1 to MC7 may be defined to have second to eighth heights, respectively.

The NAND strings NS may share a ground selection line GSL. The ground selection line GSL may correspond to first conductive lines 211 to 213 having the first height. That is, ground selection transistors GST may have the first height, respectively.

Memory cells, having the same height, in NAND strings NS of the same row may share a word line WL. Word lines WL, having the same height, of NAND strings NS of different rows may be connected in common. That is, memory cells having the same height may share a word line WL.

The first conductive lines 221 to 223 having a second height may be connected in common to form a first word line WL1. The first conductive lines 231 to 233 having a third height may be connected in common to form a second word line WL2. The first conductive lines 241 to 243 having a fourth height may be connected in common to form a third word line WL3. The first conductive lines 251 to 253 having a fifth height may be connected in common to form a fourth word line WL4. The first conductive lines 261 to 263 having a sixth height may be connected in common to form a fifth word line WL5. The first conductive lines 271 to 273 having a seventh height may be connected in common to form a sixth word line WL6. The first conductive lines 281 to 283 having an eighth height may be connected in common to form a seventh word line WL7.

The NAND strings NS of the same row may share a string selection line SSL. The NAND strings NS of different rows may be connected to string selection lines SSL1 to SSL3, respectively. The first to third string selection lines SSL1 to SSL3 may correspond to the first conductive lines 291 to 293 having a ninth height, respectively.

Hereinafter, first string selection transistors SST1 may be defined as string selection transistors SST connected to the first string selection line SSL1. Second string selection transistors SST2 may be defined as string selection transistors SST connected to the second string selection line SSL2. Third string selection transistors SST3 may be defined as string selection transistors SST connected to the third string selection line SSL3.

The common source line CSL may be connected to the NAND strings NS in common. For example, the first to fourth doping regions 311 to 314 may be connected at an active region of the substrate 111 to form the common source line CSL.

As illustrated in FIG. 6, the word lines WL having the same height may be connected in common. Accordingly, when a specific word line WL is selected, all NAND strings NS connected to the specific word line WL may be selected.

The NAND strings NS of different rows may be connected to different string selection lines SSL, respectively. By selecting and unselecting the string selection lines SSL1 to SSL3, the NAND strings NS of an unselected row among NAND strings NS connected to the same word line WL may be separated from a corresponding bit line, and the NAND strings of a selected row may be connected to a corresponding bit line.

During read and program operations executed in the foregoing exemplary structures, one of the string selection lines SSL1 and SSL2 may be selected. That is, the programming and reading may be performed by the row of the NAND strings NS11 to NS13, NS21 to NS23, and NS31 to NS33.

That is, during read and program operations, a selection voltage may be applied to a selected word line in a selected row, and a non-selection voltage may be applied to unselected word lines. For example, a selection voltage may be a program voltage Vpgm or a selection read voltage Vrd. As an example, a non-selection voltage may be a pass voltage Vpass or a non-selection read voltage Vread. That is, the programming and reading may be performed in the word line of the selected row of the NAND strings NS11 to NS13, NS21 to NS23, and NS31 to NS33.

Figure 7:
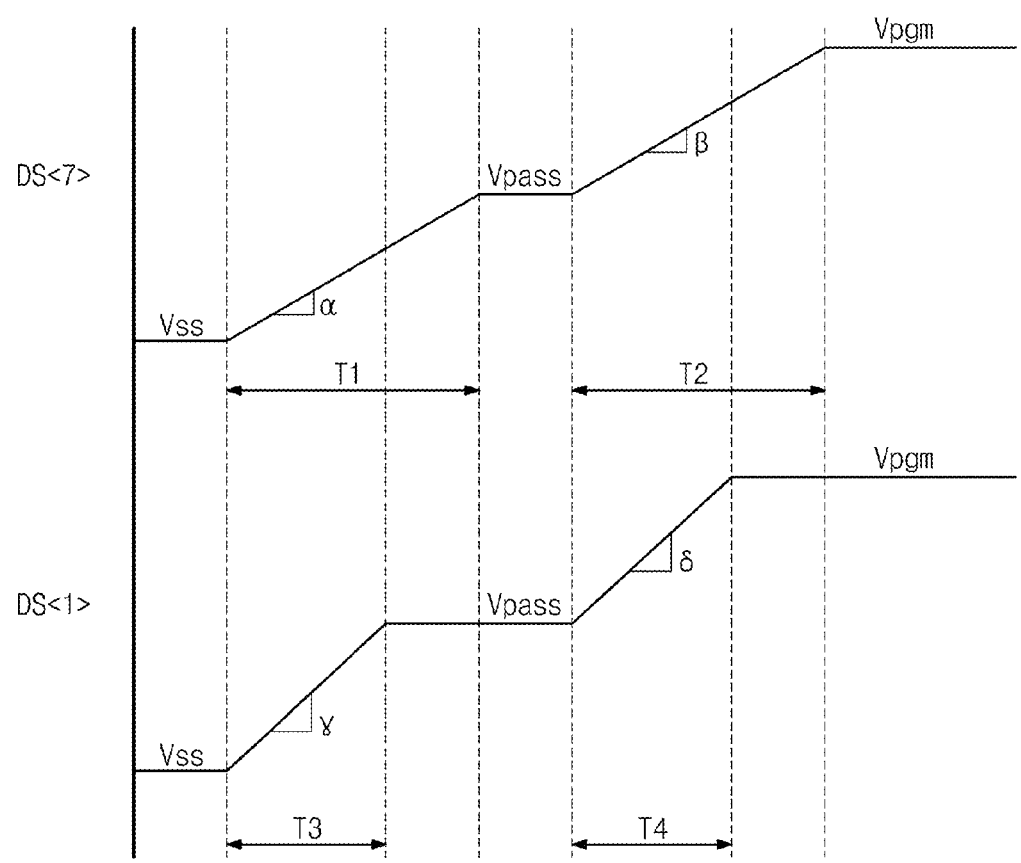
FIG. 7 is a waveform diagram illustrating rising slopes of typical driving signals.

FIG. 7 is a waveform diagram illustrating rising slopes for driving signals typically applied to signal lines in memory cell arrays.

As described with reference to FIGS. 3, 4 and 5, the area (e.g., X-Y) occupied by a pillar 113 tends to decrease with etching distance (Z) towards the substrate 111. For example, the area of the pillar 113 within a plane defined by the first and third directions of FIG. 2 shrinks with the second direction extension of the pillar 113 towards the substrate 111.

Reduction of the area of the pillar 113 causes an increase in the areas of the first conductive lines taken along the second/third direction. That is, the closer to the substrate 111, the wider areas of word lines taken along the second/third direction. For example, as illustrated in FIG. 4, areas of the first conductive lines 221 to 223 (taken along the second/third direction) having the second height may be wider than those of the first conductive lines 281 to 283 (taken along the second/third direction) having the eight height. Referring to FIG. 6, an area of the first word line WL1 (taken along the second/third direction) having the second height may be wider than that of the seventh word line WL7 (taken along the second/third direction) having the eight height. Accordingly, since word line resistance is inversely proportional to area, the resistance of the first word line WL1 will be less than that of the seventh word line WL7 under the foregoing conditions.

Hence, respective word line resistance throughout a 3D memory cell array tends to vary as a function of relative vertical height (or by layer height) within the structure. Accordingly, conventional nonvolatile memory devices including 3D memory cell arrays exhibit driving signals with different rising slopes that vary with word line height. This difference in rising slope may result in different programming speeds that in turn may result in loss of read margin.

For example, referring to FIG. 7 and assuming a conventional program operation, a first driving signal DS<1> applied to a first word line WL1 has a first rising slope of 'γ' until its level reaches a level defined as the pass voltage Vpass. In contrast, the seventh driving signal DS<7> applied to the seventh word line WL7 has a second rising slope of 'α', markedly less steep than the first rising slope γ, until its level reaches the pass voltage Vpass.

Similarly, the first and seventh driving signals DS<1> and DS<7> may have corresponding third and fourth rising slopes of 'β' and 'δ' when rising from the pass voltage Vpass to a program voltage Vpgm. Here again, the third rising slope of the first driving signal DS<1> is much steeper than the fourth rising slope of the seventh driving signal DS<7>.

Accordingly, during a program operation directed to memory cells respectively connected to the first and seventh word lines WL1 and WL7, certain memory cells connected to the first word line WL1 will be more rapidly programmed than other memory cells connected to the seventh word line W7. Hence, a program-speed difference may conventionally arise and cause a reduction in read margin.

In order to prevent the above-described phenomenon, the nonvolatile memory device 100 in FIG. 1 according to embodiments of the inventive concept may be configured to generate a first voltage signal VS_1 stepwise increasing up to a program voltage Vpgm and a second voltage signal VS_2 stepwise increasing up to a pass voltage Vpass in response to the control of ramping logic 170 in FIG. 1. The nonvolatile memory device 100 may provide the first voltage signal VS_1 to a selected word line and the second voltage signal VS_2 to unselected word lines, as a driving signal DS. Hereafter, examples of the high voltage generator 120 and ramping logic 170 will be described in some additional detail.

Figure 8:
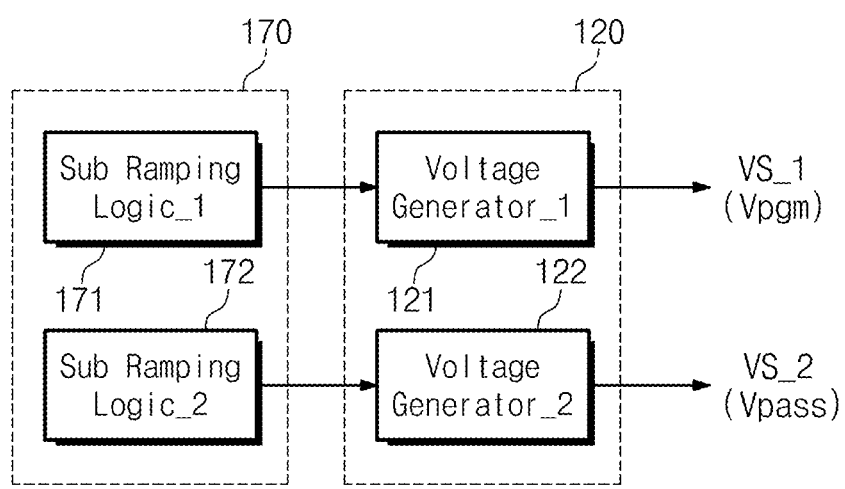
FIG. 8 is a block diagram illustrating one possible example of a high voltage generator and ramping logic that may be used to generate driving signals consistent with certain embodiments of the invention.

FIG. 8 is a block diagram illustrating one possible example of a high voltage generator and ramping logic that may be used to generate driving signals consistent with certain embodiments of the invention. Referring to FIG. 8, the high voltage generator 120 includes a first high voltage generator 121 and a second high voltage generator 122, and the ramping logic 170 includes first sub-ramping logic 171 and second sub-ramping logic 172.

The first voltage generator 121 may be used to generate the first voltage signal VS_1 stepwise increasing up to a program voltage Vpgm under the control of the first sub-ramping logic 171. During a program operation, the first voltage signal VS_1 may be provided to a selected word line as a driving signal DS.

The second voltage generator 122 may be used to generate the second voltage signal VS_2 stepwise increasing up to a pass voltage Vpass under the control of the second sub-ramping logic 172. During a program operation, the second voltage signal VS_2 may be provided to an unselected word line as a driving signal DS.

Figure 9:
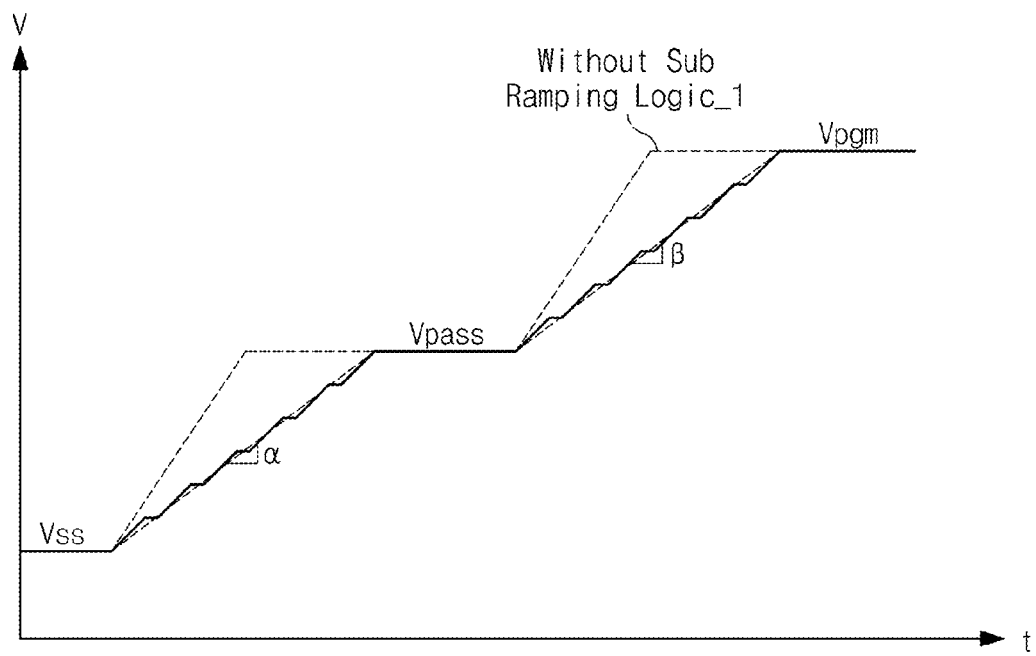
FIG. 9 is a waveform diagram illustrating a first voltage signal generated by the first voltage generator of FIG. 8.

FIG. 9 is a waveform diagram illustrating the first voltage signal VS_1 generated by the first voltage generator 121 of FIG. 8.

Referring to FIGS. 7 and 9, a rising slope of the first voltage signal VS_1 may be set to be slow relative to, or different than that conventionally expected (i.e., in a case wherein the first sub-ramping logic 171 of FIG. 8 is not provided in conjunction with the first voltage generator 121). As illustrated in FIG. 9, a first rising slope for the first voltage signal VS_1 may be set, for example, in view of a maximum practical rising slope of the slowest voltage signal (e.g., the seventh driving signal DS<7>). In this context, the "slowest" voltage signal is a voltage signal having under conventional conditions a least steep slope given the horizontal cross-sectional areas of the respective vertical pillar at a particular height (e.g., the highest height above the substrate).

In the example illustrated in FIG. 9, the rising slope of the first voltage signal VS_1 (and potentially all other voltage signals VS_2 through VS-7) may be set to be equal to the rising slop of the slowest voltage signal (e.g., the seventh driving signal DS<7>) provided to the word line having the greatest resistance (e.g., the seventh word line WL7). Accordingly, the rising slope of the first voltage signal VS_1 applied to the first word line WL1 may be constantly maintained with respect to all other (or some other) voltage signals (VS_2 through VS_7) applied to all other (or some other) word lines (first to sixth word lines WL1 to WL6), each exhibiting relatively less resistance as compared with the highest resistance word line (seventh word line WL7).

Figure 10:
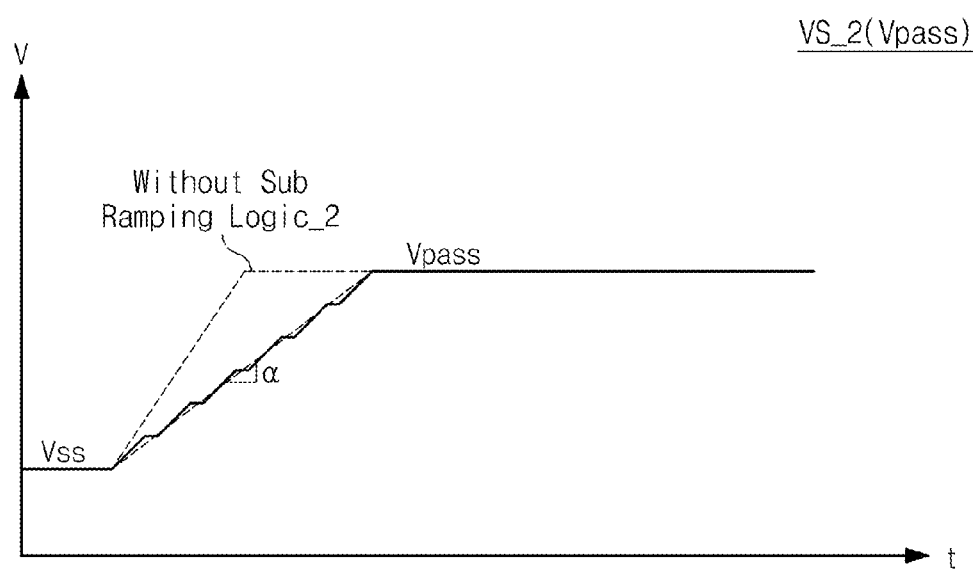
FIG. 10 is a waveform diagram illustrating a second voltage signal generated by the second voltage generator of FIG. 8.

FIG. 10 is a waveform diagram illustrating the second voltage signal VS_2 generated by the second voltage generator 122 of FIG. 8.

Referring to FIG. 10, a rising slope for the second voltage signal VS_2 may be similarly adjusted per the foregoing using the second sub-ramping logic 172 of FIG. 8. Like a first voltage signal VS_1 described in FIG. 9, the rising slope of the second voltage signal VS_2 may be set in view of a slowest driving signal (e.g., the seventh driving signal DS<7>). Accordingly, in similar manner, the rising slope of the second voltage signal VS_2 may be maintained constantly with respect to all other (or some other) word lines (i.e., first to seventh word lines WL1 to WL7 in FIG. 6) exhibiting relatively less resistance as compared with a highest resistance word line (e.g., the seventh word line WL7). In regard to the foregoing a "slowest" driving signal among all driving signals and/or a highest resistance word line among all word lines may be empirically or conceptually determined.

As described in FIGS. 8, 9 and 10, the first and second voltage generators 121 and 122 may be used to generate the first and second voltage signals VS_1 and VS_2 having a constant and rationally defined rising slope(s) under the control of first and second sub-ramping logics 171 and 172.

The row selecting circuit 130 of FIG. 1 capable of providing the first and second voltage signals VS_1 and VS_2 to respective word lines as driving signals will now be described in some additional detail with reference to FIGS. 11 and 12.

Figure 11:
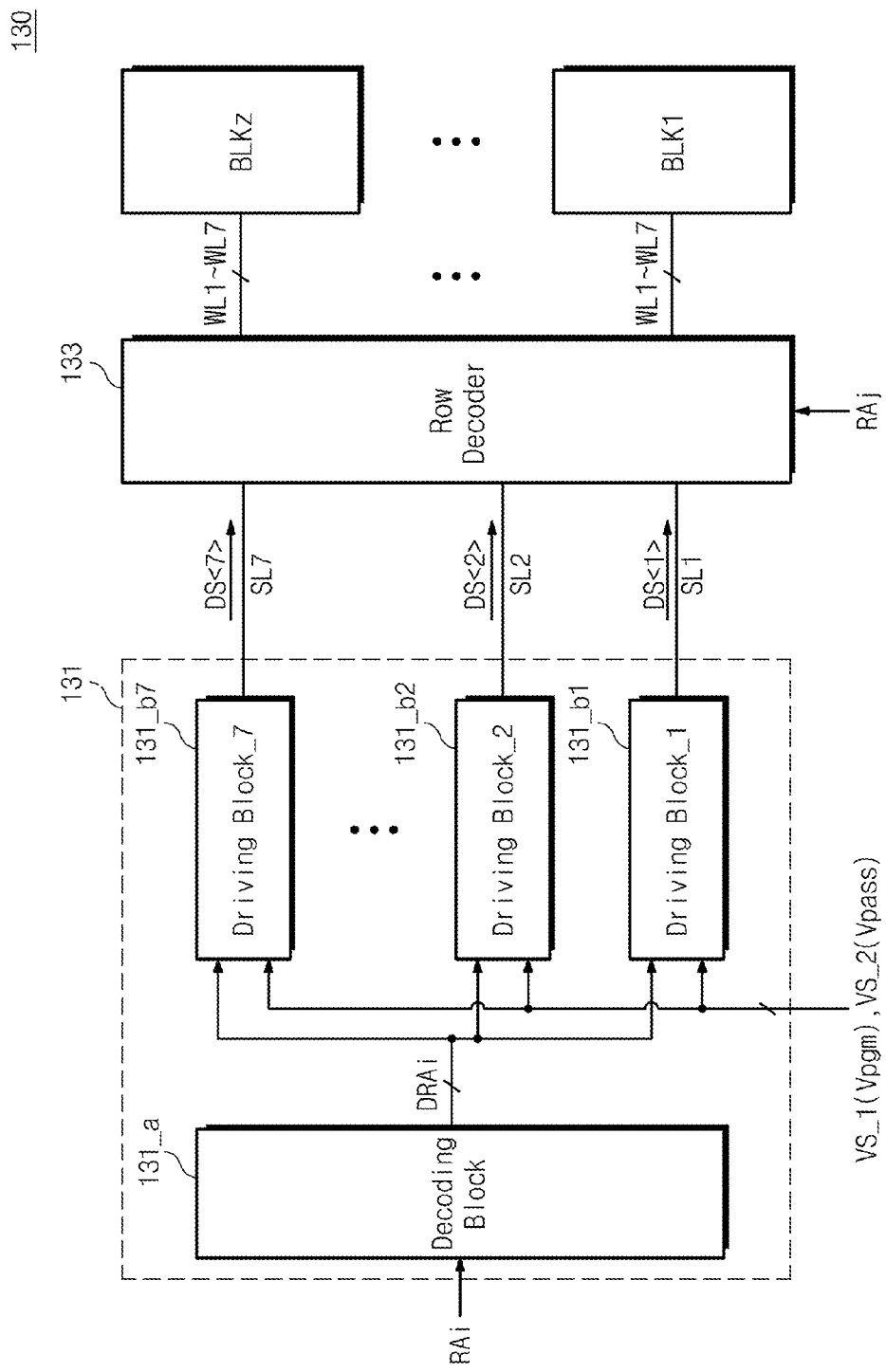
FIG. 11 is a block diagram further illustrating the row selecting circuit of FIG. 1.

FIG. 11 is a block diagram further illustrating the row selecting circuit 130 of FIG. 1. Referring to FIG. 11, the row selecting circuit 130 comprises a word line driver 131 and a row decoder 133, wherein the word line driver 131 includes a decoding block 131_a, and first to seventh driving blocks 131_b1 to 131_b7.

The decoding block 131_a is configured to receive the first row address portion RAi. The decoding block 131_a then decodes the first row address portion RAi to generate a decoded row address DRAi. The decoding block 131_a then provides the decoded row address DRAi to the first to seventh driving blocks 131_b1 to 131_b7, respectively.

Each of the first to seventh driving blocks 131_b1 to 131_b7 receive the decoded row address DRAi, and output one of the first and second voltage signals VS_1 and VS_2 as a driving signal in response to the decoded row address DRAi. Individual driving blocks 131_b will be described in some additional detail with reference to FIG. 12.

In the illustrated example of FIG. 11, the row decoder 133 is connected to the word line driver 131 via signal lines SL1 to SL7. The row decoder 133 may also be connected to the plurality of memory blocks BLK1 to BLKz (FIG. 2), each of which is connected to the row decoder 133 via respective word lines WL1 to WL7. The row decoder 133 may select a memory block in response to the second row address portion RAj. With this configuration, the row decoder 133 may provide word lines WL1 to WL7 of the selected memory block with driving signals DS<1> to DS<7> transferred via the signal lines SL1 to SL7, respectively.

Figure 12:
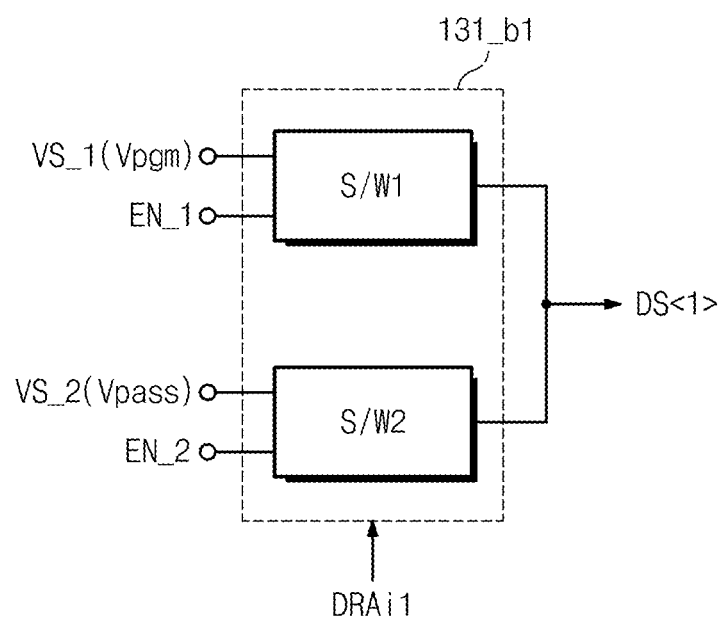
FIG. 12 is a block diagram further illustrating the driving block of FIG. 11.

FIG. 12 is a block diagram further illustrating the driving blocks 131_bn in the context of a first driving block 131_b1.

Referring to FIGS. 1 and 12, the first driving block 131_b1 includes a first switch S/W1 and a second switch S/W2. The first switch S/W1 receives the first voltage signal VS_1 from a high voltage generator 120 and a first enable signal EN_1 from control logic 160. The second switch S/W2 receives a second voltage signal VS_2 from the high voltage generator 120 and a second enable signal EN_2 from the control logic 160. The first and second switches S/W1 and S/W2 functionally combine to output one of the first and second voltage signals VS_1 and VS_2 as a first driving signal DS<1> in response to the decoded row address DRAi1 provided from the decoding block 131_a of FIG. 11.

Figure 13:
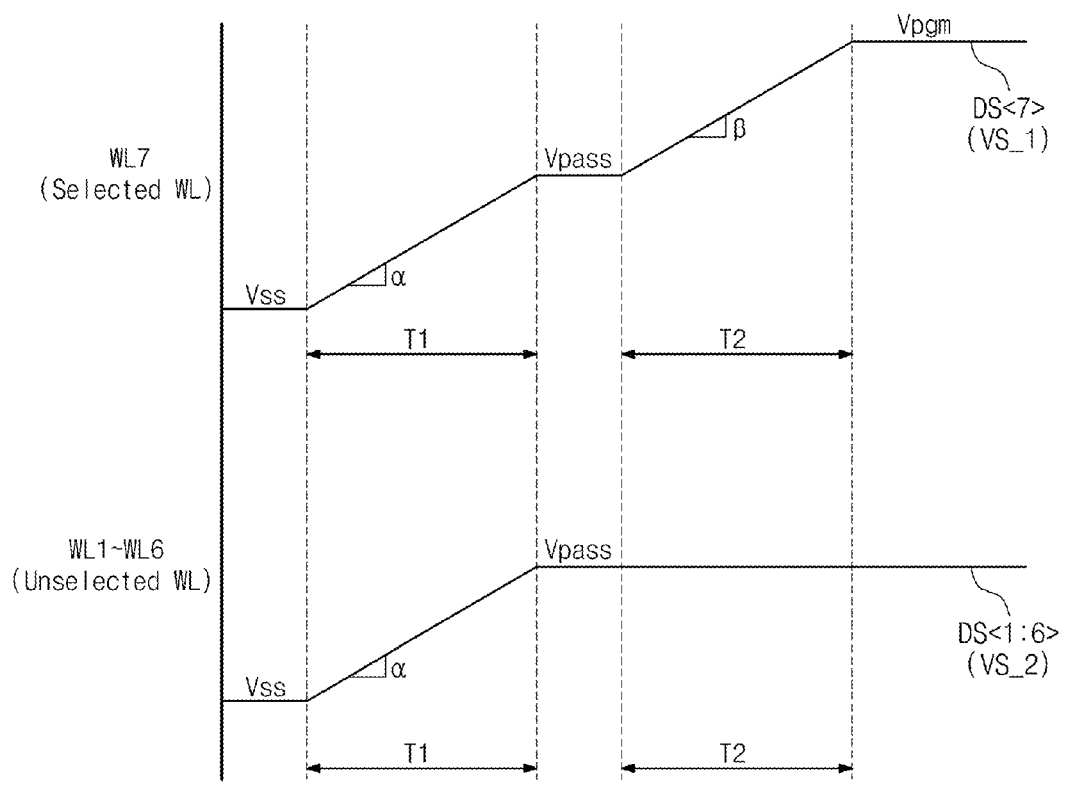
FIGS. 13 and 14 are waveform diagrams illustrating rising slopes of driving signals when voltage signals generated by the high voltage generator of FIG. 1 are provided to word lines as driving signals.
Figure 14:
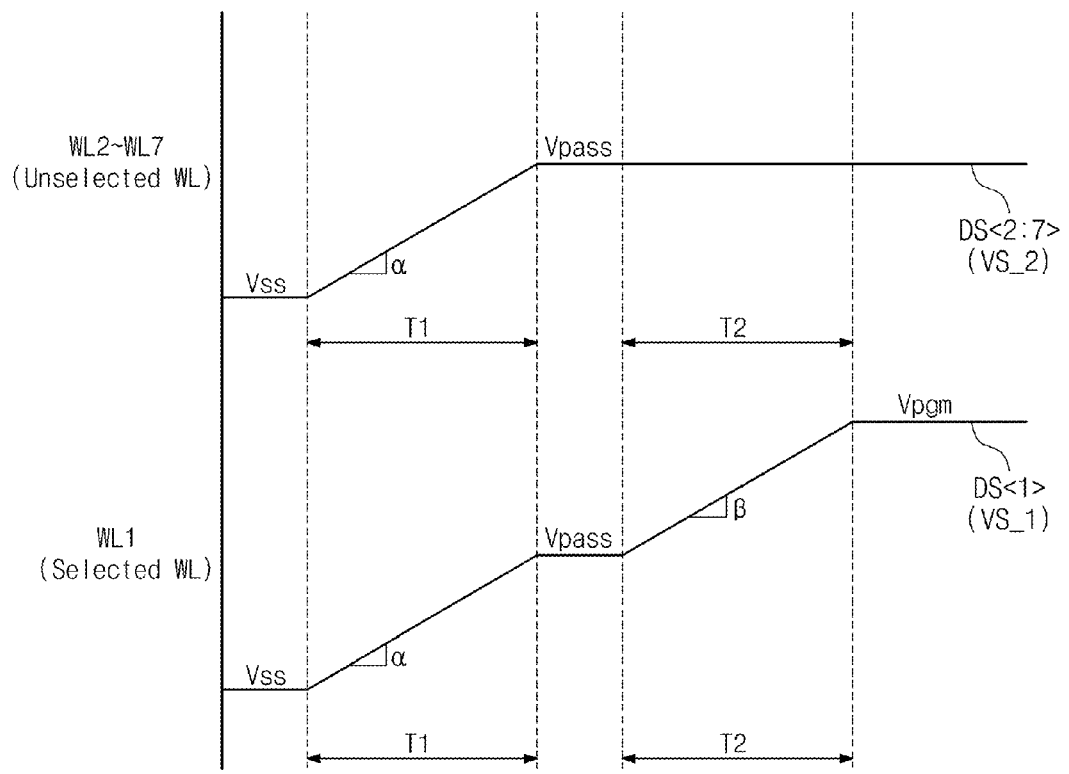

FIGS. 13 and 14 are waveform diagrams showing rising slopes for driving signals when voltage signals generated by the high voltage generator of FIG. 1 are provided to word lines as driving signals.

In FIG. 13, an exemplary case is illustrated in which the first voltage signal VS_1 is provided to a selected seventh word line WL7 as a driving signal, and the second voltage signal VS_2 is provided to unselected word lines (e.g., first to sixth word lines WL1 to WL6) as driving signals. In FIG. 14, an exemplary case is illustrated in which the first voltage signal VS_1 is provided to a selected first word line WL1 as a driving signal and the second voltage signal VS_2 is provided to unselected word lines (e.g., second to seventh word lines WL2 to WL7) as driving signals.

As illustrated in FIG. 13, in the event that the seventh word line WL7 is selected during a program operation, a corresponding seventh driving signal DS<7> having a rising slope of 'α' when rising up to a pass voltage Vpass from a ground voltage Vss and a rising slope of 'β' when rising up to a program voltage Vpgm from the pass voltage Vpass. In this case, unselected word lines WL1 to WL6 may be supplied with driving signals DS<1> to DS<6> having a rising slope of 'α' when rising up to the pass voltage Vpass, respectively.

As illustrated in FIG. 14, in the event that the first word line WL1 is selected at a program operation, a first driving signal DS<1> having a rising slope of 'α' when rising up to a pass voltage Vpass from a ground voltage Vss and a rising slope of 'β' when rising up to a program voltage Vpgm from the pass voltage Vpass. In this case, unselected word lines WL2 to WL7 may be supplied with driving signals DS<2> to DS<7> having a rising slope of 'α' when rising up to the pass voltage Vpass, respectively.

In this manner, according to certain embodiment of the inventive concept, a nonvolatile memory device may provide a plurality of word lines with respective driving signals having substantially the same rising slope regardless of a resistance difference between the word lines. As a result, nonvolatile memory devices according to the inventive concept are able to prevent loss of read margin due to a program-speed differences.

Figure 15:
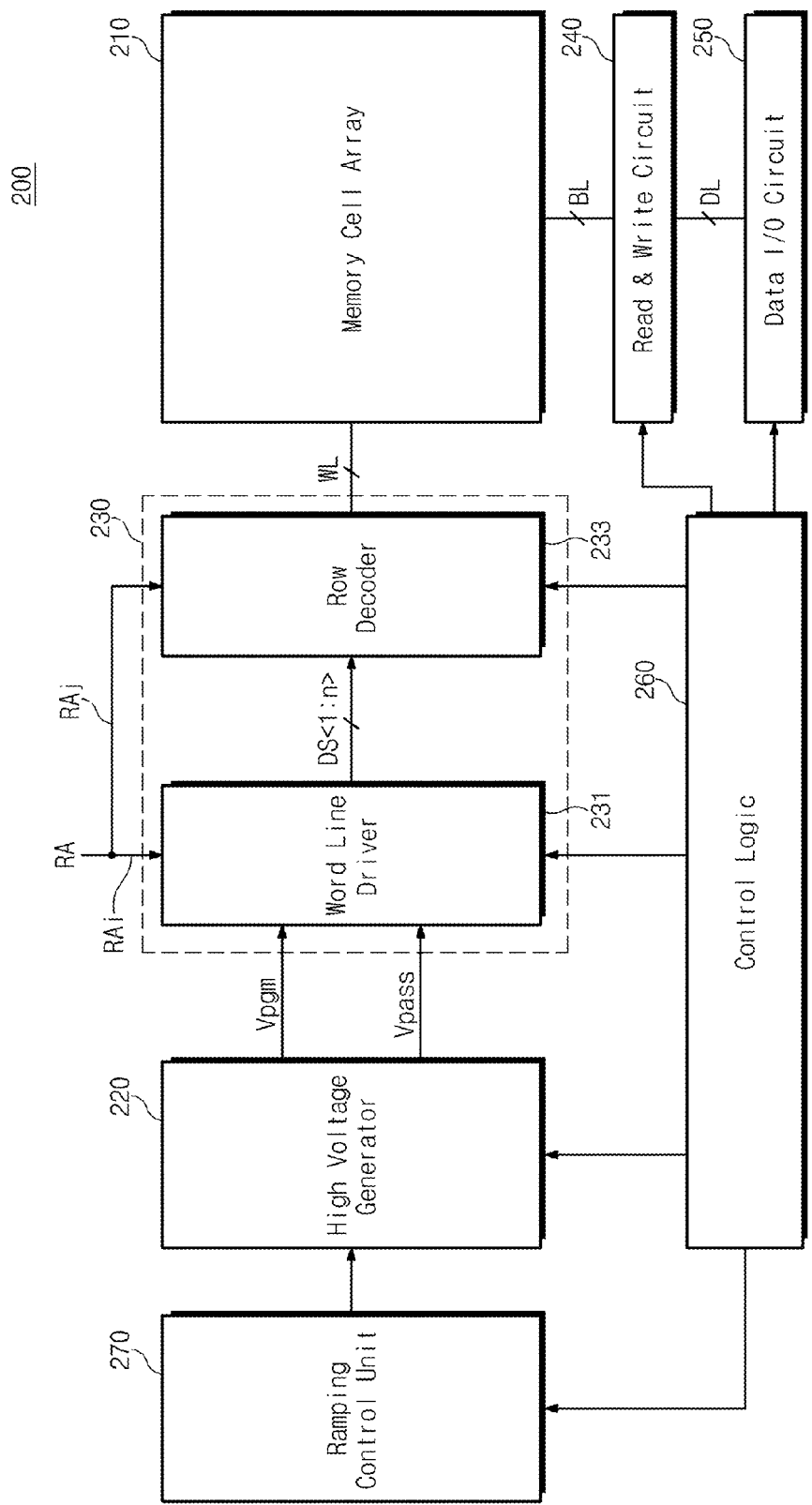
FIG. 15 is a block diagram illustrating a nonvolatile memory device according to another embodiment of the inventive concept.

FIG. 15 is a block diagram illustrating a nonvolatile memory device according to another embodiment of the inventive concept. A nonvolatile memory device in FIG. 15 is similar to the nonvolatile memory device of FIG. 1 except that a separate ramping control unit 270 is provided outside of control logic 260. In certain embodiments of the inventive concept the ramping control unit 270 may be implemented by a module or integrated circuit chip independent from that implementing the control logic 260.

In such configurations, the ramping control unit 270 may operate under the control of the control logic 260, such that a high voltage generator 220 generates the first and second voltage signals VS_1 and VS_2 increasing stepwise in response to the control by the ramping control unit 270. Otherwise, the high voltage generator 220 may be similar to the high voltage generator 120 of FIG. 1.

The embodiments illustrated in FIGS. 1 through 15 are exemplary of nonvolatile memory devices that may be configured to provide word line driving signals having substantially the same rising slope during a program operation regardless of word line resistance differences. Such nonvolatile memory devices may be used in conjunction with different types of 2D and 3D memory cell arrays and may be incorporated within a variety of memory systems, host devices and/or used in different applications.

Figure 16:
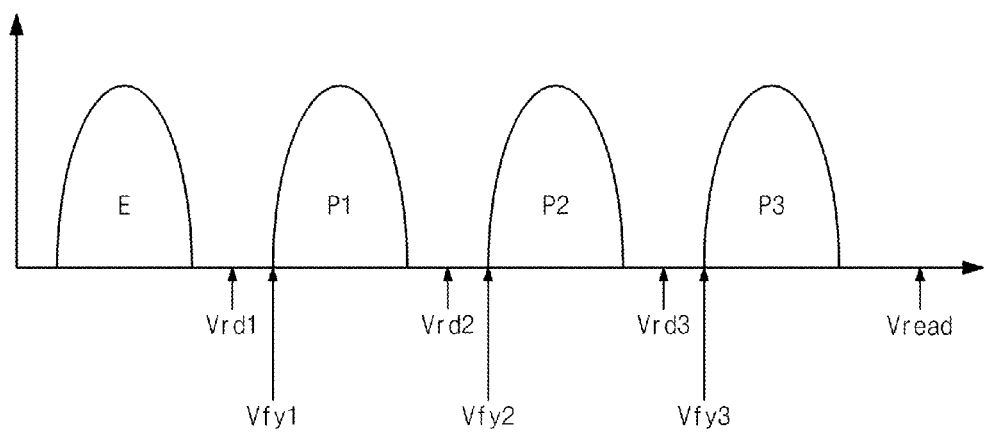
FIG. 16 conceptually illustrates exemplary voltage distributions for a multi-level memory cell that may be incorporated within embodiments of the inventive concept.
Figure 17:
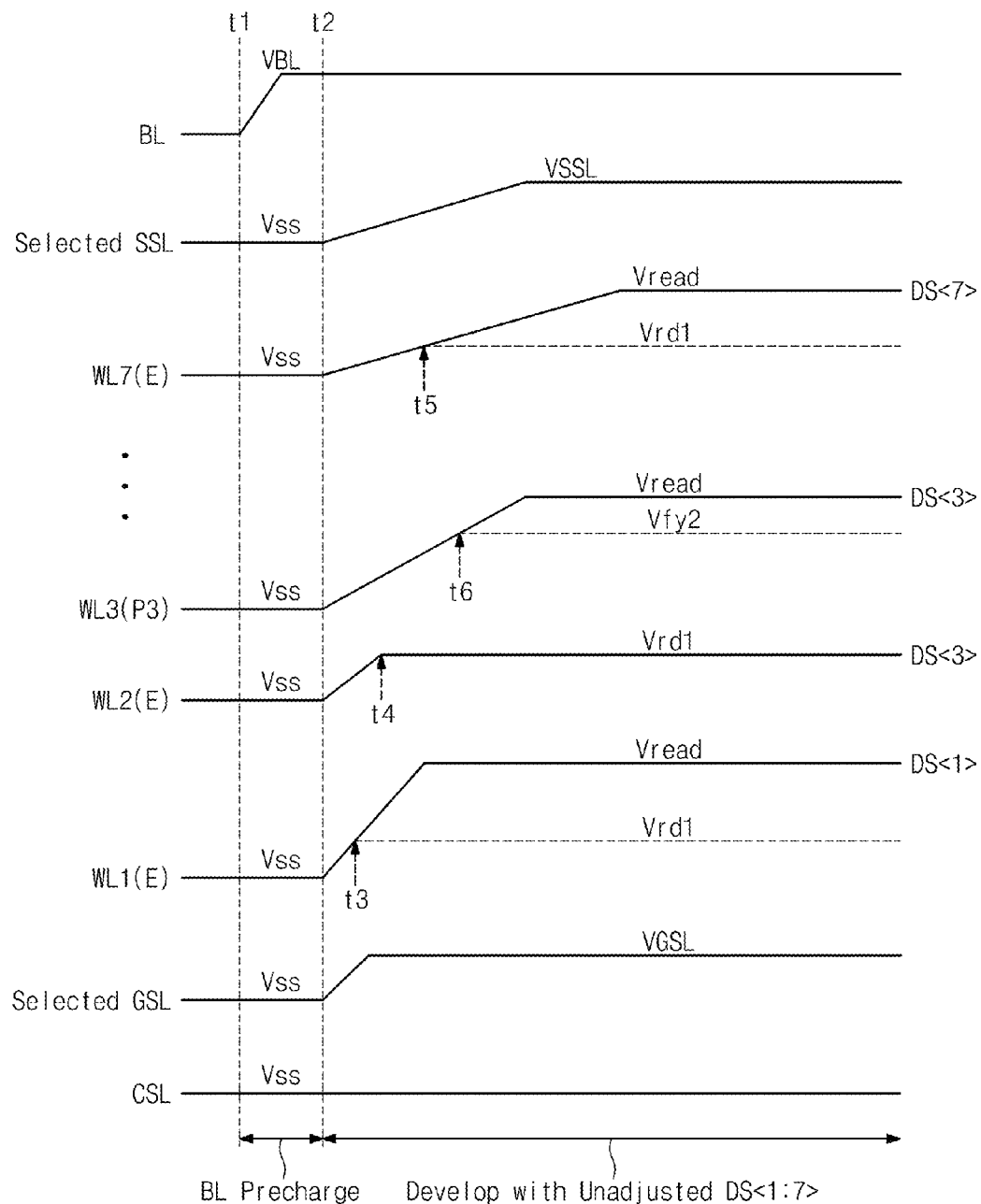
FIG. 17 is an exemplary collection of control signal waveforms.

FIGS. 16, 17 and 18 are diagrams that will now be sued to further describe a read disturbance potentially caused when word line driving signals having different rising slopes are used.

In FIG. 16, threshold voltage distributions for memory cells MC are shown. Four (4) threshold voltage distributions each corresponding to four logical states E, P1, P2, and P3 are illustrated. That is, each memory cell may store 2-bit data, but the scope of the inventive concept is not limited to the use of only 2-bit memory cells.

FIG. 17 a collection of timing diagram describing a read operation executed when word line driving signals having different rising slopes are used. It is assumed that the closer to a substrate, the larger rising slopes of driving signals provided to first to seventh word lines WL1 to WL7. Further, it is assumed that a read operation directed to memory cells connected to the second word line WL2 is performed.

FIG. 18 is a table summarizing channel voltages for a selected NAND string corresponding to a selected string selection line in FIG. 17. In particular, FIG. 18 shows a channel voltage of a NAND string at a sixth time t6 (refer to FIG. 17). First to seventh memory cells MC1 to MC7 may correspond to memory cells in the same NAND string among memory cells of the first to seventh word lines WL1 to WL7. It is assumed that the third memory cell MC3 has a threshold voltage corresponding to a logical state P3 and that the first, second, and fourth to seventh memory cells MC1, MC2, and MC4 to MC7 have a threshold voltage corresponding to a logical state E, that is, an erase state.

Referring to FIGS. 16, 17 and 18, a bit line BL may be pre-charged to a bit line pre-charge voltage VBL. Afterwards, a string selection voltage VSSL and a ground selection voltage VGSL may be provided to a selected string selection line and a ground selection line GSL, respectively. Further, a first selection read voltage Vrd1 may be applied to the second word line WL2, and a non-selection read voltage Vread may be applied to unselected word lines WL1 and WL3 to WL7, respectively.

The closer to a substrate, the larger a rising slope. For this reason, the first to seventh driving signals DS<1> to DS<7> provided to the first to seventh word lines WL1 to WL7 may reach a voltage level of the first selection read voltage Vrd1 sequentially and respectively. In this case, since memory cells MC1, MC2, and MC4 to MC7 other than the memory cell MC3 have a threshold voltage of the erase state E, they may be sequentially turned on. For example, the first memory cell MC1 may be turned on at a third time t3 which is fastest as compared with other memory cells having the erase state, and the seventh memory cell MC7 is turned on at a sixth time t6 which is slowest as compared with other memory cells having the erase state.

Since the third memory cell MC3 has a threshold voltage corresponding to a logical state P3, it is turned on if the third driving signal DS<3> applied to the third word line WL3 reaches the non-selection read voltage Vread, for example. Accordingly, the third memory cell MC3 may be turned on at the time t6 being slowest as compared with remaining memory cells MC1, MC2, and MC4 to MC7.

In this case, as illustrated in FIG. 18, a channel voltage of a NAND string including the first to seventh memory cells MC1 to MC7 may be divided on the basis of the third memory cell MC3. That is, at the time t6, since the third memory cell MC3 is turned off and remaining memory cells MC1, MC2, and MC4 to MC7 are turned on, the channel voltage of the NAND string may be divided into a ground voltage Vss and a bit line pre-charge voltage VBL on the basis of the third memory cell MC3. A difference between channel voltages Vss and VBL may cause the read disturbance due to the hot electron injection. This means that the read margin is reduced.

In order to prevent the above-described read disturbance, nonvolatile memory devices according to embodiments of the inventive concept may be configured that generate voltage signals stepwise increasing to a target voltage during a read operation, wherein the voltage signals are provided to word lines as a driving signal. This approach will be described in some additional detail with reference to FIGS. 19 and 20.

Figure 19:
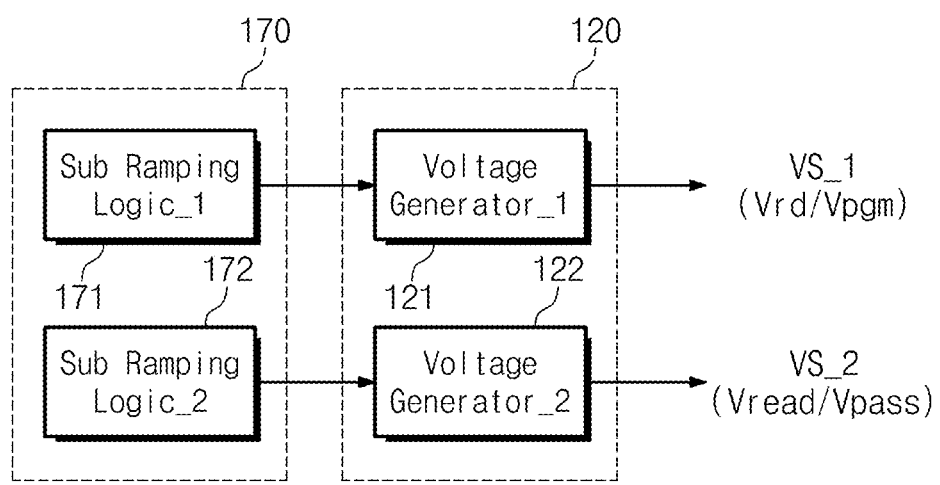
FIG. 19 is a block diagram further illustrating the high voltage generator and ramping logic of FIG. 1.

FIG. 19 is a block diagram further illustrating the high voltage generator and ramping logic of FIG. 1. Referring to FIG. 19, the high voltage generator 120 comprises the first voltage generator 121 and the second voltage generator 122. The ramping logic 170 comprises the first and second sub-ramping logics 171 and 172.

As illustrated in FIG. 19, the first voltage generator 121 may be used to generate a first voltage signal VS_1 under the control of the first sub-ramping logic 171. The first voltage signal VS_1 may stepwise increase up to a selection read voltage Vrd. That is, the first voltage generator 121 may generate the first voltage signal VS_1 stepwise increasing up to a program voltage Vpgm during a program operation and up to the selection read voltage Vrd during a read operation. The first voltage signal VS_1 generated by the first voltage generator 121 may then be provided to a selected word line as a driving signal.

Likewise, the second voltage generator 122 may be used to generate a second voltage signal VS_2 under the control of the second sub-ramping logic 172. The second voltage generator 122 may generate the second voltage signal VS_2 stepwise increasing up to a pass voltage Vpass during a program operation and up to a non-selection read voltage Vread during a read operation. The second voltage signal VS_2 generated by the second voltage generator 122 may then be provided to an unselected word line as a driving signal.

As described above, the first and second voltage generators 121 and 122 may generate the first and second voltage signals VS_1 and VS_2 stepwise increasing at a read operation, respectively, thus preventing a read disturbance.

As described in FIG. 19, the first and second voltage generators 121 and 122 may be configured to operate both during a program operation and a read operation. However, a high voltage generator 120 might alternately be implemented by one voltage generator operating during program operations and another voltage generator operating during read operations. This approach will be more fully described with reference to FIG. 20.

Figure 20:
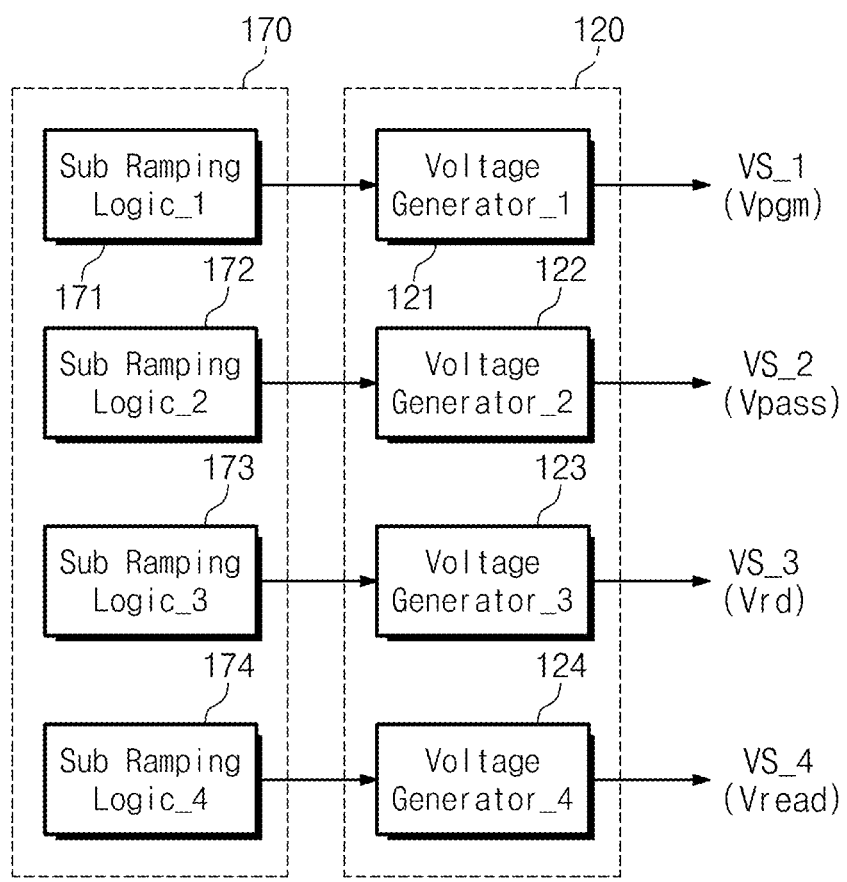
FIG. 20 is a block diagram further illustrating the high voltage generator and ramping logic of FIG. 1 according to another embodiment of the inventive concept.

FIG. 20 is a block diagram further illustrating the high voltage generator and ramping logic of FIG. 1 according to another embodiment of the inventive concept. Referring to FIG. 20, the high voltage generator 120 comprises first to fourth voltage generators 121 to 124, and ramping logic 170 comprises first to fourth sub-ramping logics 171 to 174.

As illustrated in FIG. 20, the first and second voltage generators 121 and 122 may operate during program operations to generate the first voltage signal VS_1 and the second voltage signal VS_2 under the control of the first and second sub-ramping logics 171 and 172, respectively. The first voltage signal VS_1 may increase stepwise up to a program voltage Vpgm, and the second voltage signal VS_2 may increase stepwise up to a pass voltage Vpass.

The third and fourth voltage generators 123 and 124 of FIG. 20 may operate during read operations to generate a third voltage signal VS_3 and a fourth voltage signal VS_4 under the control of the third and fourth sub-ramping logics 173 and 174, respectively. The third voltage signal VS_3 may increase stepwise up to a selection read voltage Vrd, and the fourth voltage signal VS_4 may increase stepwise up to a non-selection read voltage Vread. Accordingly, it is possible to prevent both a decrease in a read margin during program operations and read disturbances during read operations.

The voltage generating circuits described in relation to FIGS. 19 and 20 may be applied to nonvolatile memory devices 100 and 200 of FIGS. 1 and 15.

FIGS. 1 to 20 are exemplarily described under the assumption that the nonvolatile memory devices 100 and 200 generate first and second voltage signals VS_1 and VS_2 increasing stepwise up to a target voltage. However, the nonvolatile memory devices 100 and 200 may be configured such that the second voltage signal VS_2 to be provided to unselected word lines stepwise increases up to a target voltage.

The ramping logic 170 may flexibly adjust a magnitude of a ramping step of each of the first and second voltage signals VS_1 and VS_2 according to an operation of the nonvolatile memory device 100. For example, the ramping logic 170 may control the high voltage generator 120 such that the first and second voltage signals VS_1 and VS_2 have different ramping steps according to target levels of the first and second voltage signals VS_1 and VS_2.

Figure 21:
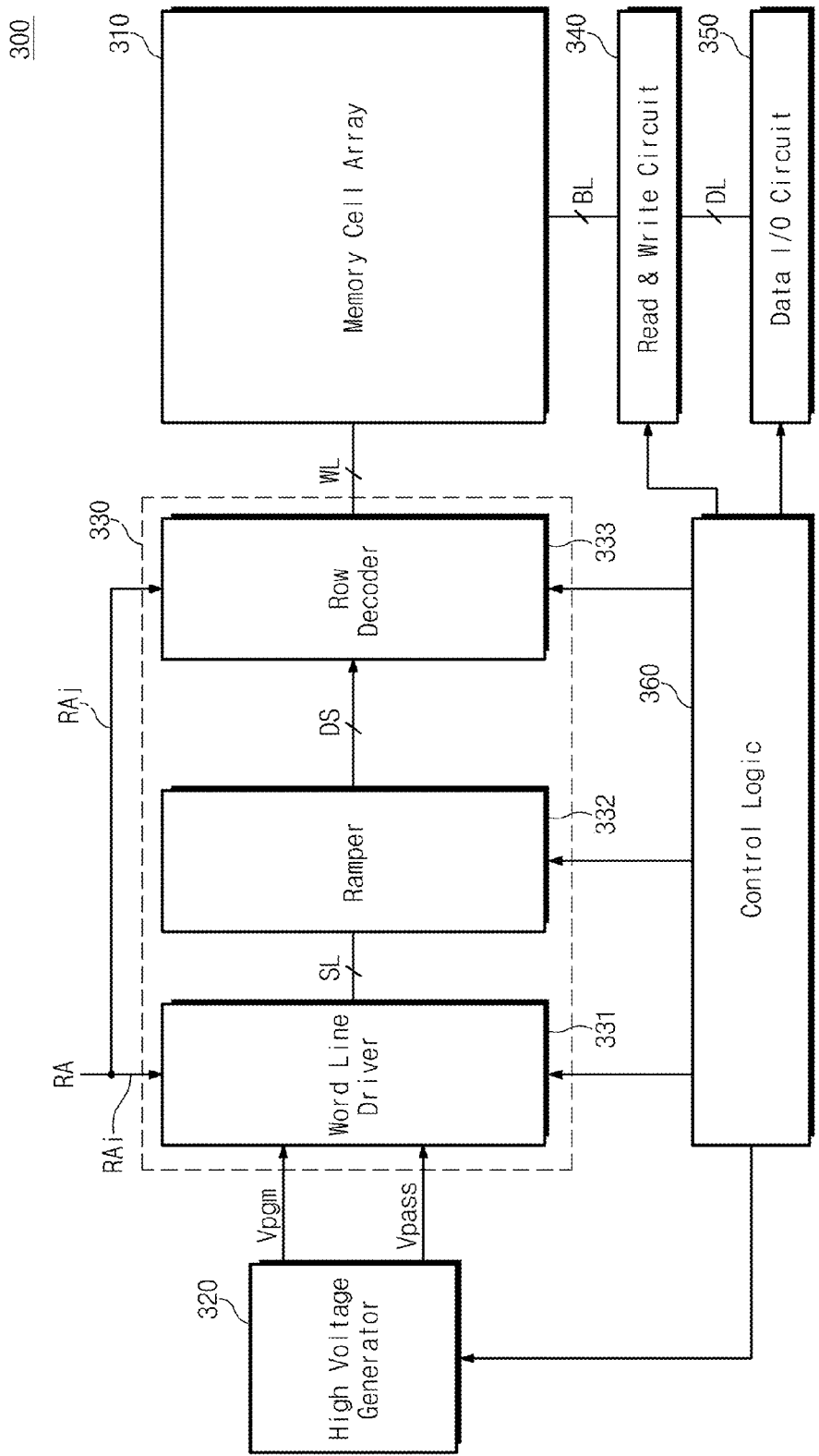
FIG. 21 is a block diagram showing a nonvolatile memory device according to still another exemplary embodiment of the inventive concept.

FIG. 21 is a block diagram showing a nonvolatile memory device according to still another embodiment of the inventive concept. Referring to FIG. 21, a nonvolatile memory device 300 comprises a memory cell array 310, a high voltage generator 320, a row selecting circuit 330, a read/write (R/W) circuit 340, a data input/output circuit (I/O) 350, and control logic 360.

The memory cell array 310 may be connected to the row selecting circuit 330 through word lines WL and to the R/W circuit 340 through bit lines BL. The memory cell array 310 may include a plurality of memory cells. In an exemplary embodiment, the memory cell array 310 may be formed of memory cells each storing one or more bits of data. The memory cell array 310 may similar to the memory cell arrays of FIGS. 2 to 6.

The high voltage generator 320 may generate a program voltage Vpgm and a pass voltage Vpass to be used for programming, and may transfer the program and pass voltages Vpgm and Vpass to a word line driver 331. The high voltage generator 320 may operate responsive to the control of control logic 360. In an exemplary embodiment, the high voltage generator 320 may be formed of a plurality of transistors and a plurality of pumping capacitors.

The row selecting circuit 330 may be supplied with the program and pass voltages Vpgm and Vpass from the high voltage generator 320. During a program operation, the row selecting circuit 330 may provide the program voltage Vpgm to a selected word line and the pass voltage Vpass to unselected word lines. The row selecting circuit 330 may include a word line driver 331, a ramper 332, and a row decoder 333.

The program and pass voltages Vpgm and Vpass from the high voltage generator 320 may be applied to the word line driver 331. The word line driver 331 may respond to a first row address portion RAi to transfer the program or pass voltage Vpgm or Vpass to each signal line SL. For example, during a program operation, the word line driver 331 may provide the program voltage Vpgm to a signal line corresponding to a selected word line and the pass voltage Vpass to a signal line corresponding to an unselected word line.

The ramper 332 may be supplied with the program voltage Vpgm or the pass voltage Vpass corresponding to each word line from the word line driver 331. The ramper 332 may generate driving signals DS each being increased stepwise up to a target voltage level. For example, when supplied with the program voltage Vpgm, the ramper 332 may generate a driving signal whose voltage level is increased stepwise up to the program voltage Vpgm. When supplied with the pass voltage Vpass, the ramper 332 may generate a driving signal whose voltage level is increased stepwise up to the pass voltage Vpass.

The row decoder 333 may receive driving signals DS from the ramper 332. The row decoder 333 may respond to a second row address portion RAj to select word lines WL to which the driving signals DS are to be applied. For example, the received address RAj may be an address for selecting a memory block. In this case, the row decoder 333 may select a memory block in response to the second row address portion RAj. The row decoder 333 may transfer the driving signals DS to word lines of the selected memory block, respectively.

The R/W circuit 340 is connected to the memory cell array 310 through the bit lines BL and with the data I/O circuit 350 through data lines DL. The R/W circuit 340 may receive data from the data input/output circuit 350 to write the received data in the memory cell array 310. The R/W circuit 340 may read data from the memory cell array 310 to transfer the read data to the data input/output circuit 350. In an exemplary embodiment, the R/W circuit 340 may include constituent elements such as a page buffer (or, a page register) for reading and writing data, a column selecting circuit for selecting bit lines, and the like.

The data I/O circuit 350 is connected to the R/W circuit 340 through the data lines DL. The data I/O circuit 350 may operate responsive to the control of the control logic 360. The data I/O circuit 350 may be configured to exchange data with an external device. The data input/output circuit 350 may transfer externally provided data to the read/write circuit 340 through the data lines DL. The data I/O circuit 350 may output data transferred from the R/W circuit 340 through the data lines DL to the external device. In an exemplary embodiment, the data I/O circuit 350 may include constituent elements such as a data buffer, etc.

The control logic 360 may control an overall operation of the nonvolatile memory device 300. The control logic 360 may be configured to control the constituent elements 320, 330, 340, and 350. The control logic 360 may operate responsive to a control signal CTRL from the external device.

The nonvolatile memory device 300 may be configured to supply word lines with driving signals DS<n:1> having a constant rising slope. Since the driving signals DS<n:1> have a constant rising slope, the nonvolatile memory device 300 may prevent reduction of the read margin due to a program-speed difference. Accordingly, the reliability of the nonvolatile memory device 300 may be improved.

Figure 22:
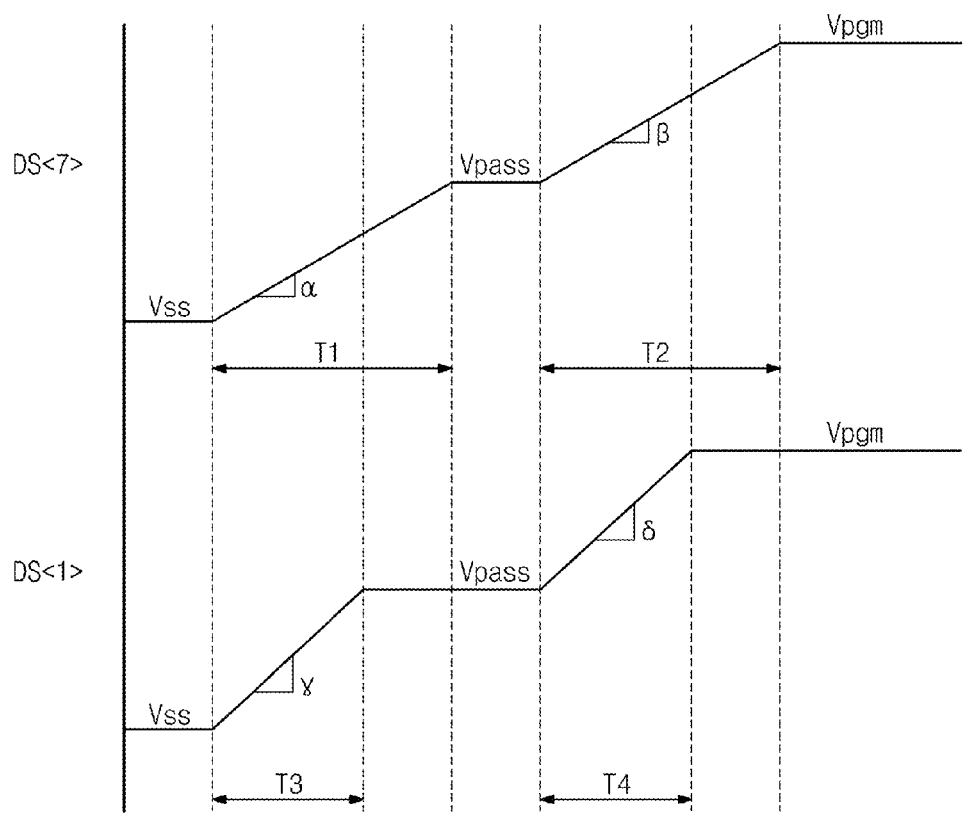
FIG. 22 is a waveform diagram illustrating rising slopes of driving signals of a typical case.

FIG. 22 is a waveform diagram showing rising slopes for driving signals typically applied to word lines of the memory cell array.

Referring to FIG. 22, during a program operation, a first driving signal DS<1> applied to a first word line WL1 has a first rising slope of 'γ' until its level reaches a pass voltage Vpass, and the seventh driving signal DS<7> applied to the seventh word line WL7 has a rising slope of 'α' until its level reaches a pass voltage Vpass. That is, while a voltage level of a driving signal rises up to the pass voltage Vpass, a rising slope of the first driving signal DS<1> is steeper than that of the seventh driving signal DS<7>. The first and seventh driving signals DS<1> and DS<7> have rising slopes of 'β' and 'δ' when rising from the pass voltage Vpass to a program voltage Vpgm. That is, upon rising to the program voltage Vpgm, the rising slope of the first driving signal DS<1> is steeper than that of the seventh driving signal DS<7>. Accordingly, during programming of memory cells connected with the first and seventh word lines WL1 and WL7, memory cells connected with the first word line WL1 will be programmed more rapidly than memory cells connected with the seventh word line W7, and a program-speed difference may cause a reduction in read margin.

In order to prevent the above-described phenomenon, the nonvolatile memory device 300 of FIG. 21 may be configured to adjust one or more rising slope(s) for various driving signal(s) using the ramper 332. For example, using the ramper 332, the nonvolatile memory device 300 may control the rising slope of a first driving signal DS<1> such that a rising slope (γ) of the first driving signal DS<1> is substantially the same as (α) of a seventh driving signal DS<7>. Further, using the ramper 332, the nonvolatile memory device 300 may control the rising slope of the first driving signal DS<1> such that a rising slope (δ) of the first driving signal DS<1> is substantially the same as (β) of the seventh driving signal DS<7>.

Figure 23:
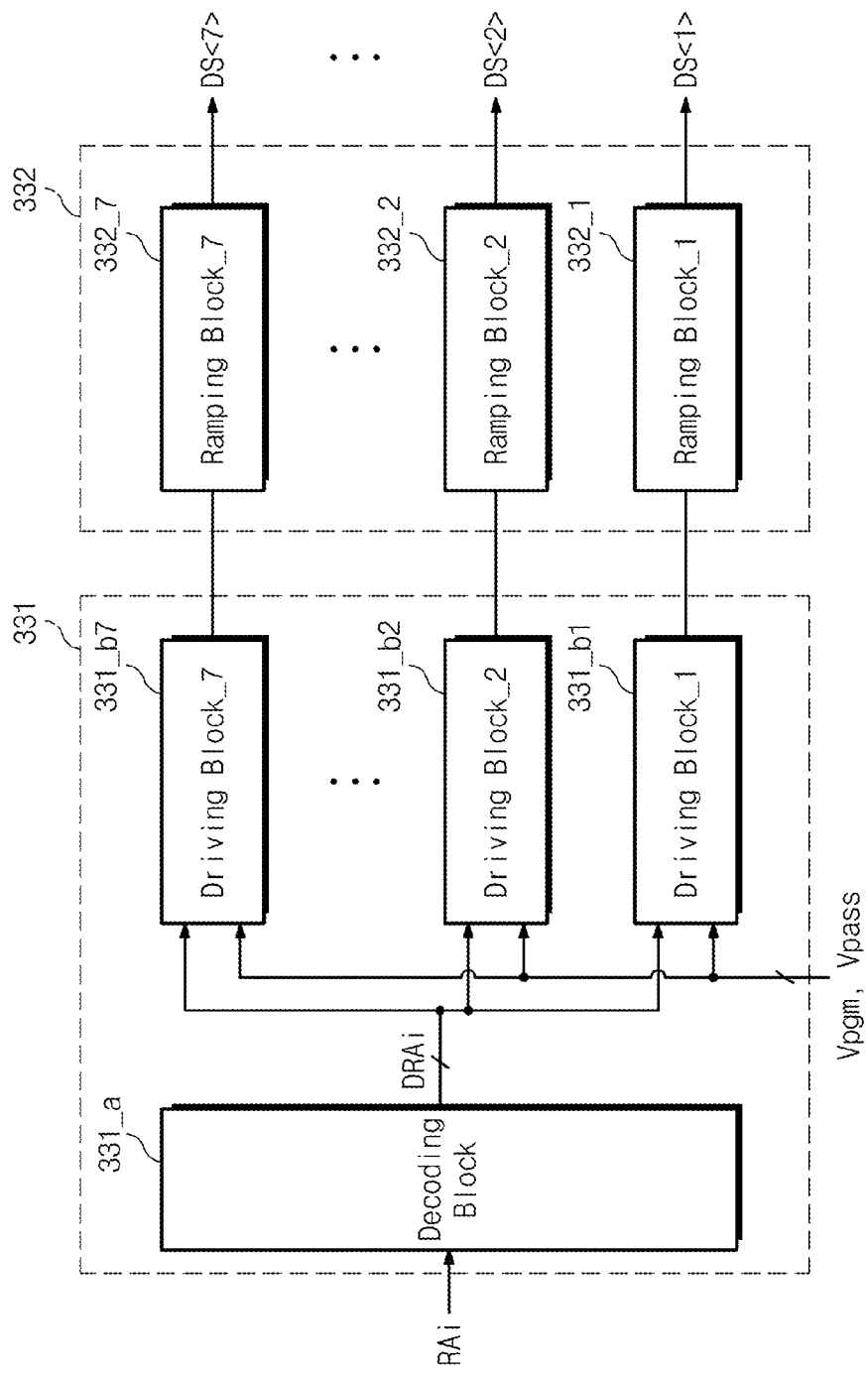
FIG. 23 is a block diagram further illustrating the word line driver and ramper of FIG. 21.

FIG. 23 is a block diagram further illustrating the word line driver and ramper of FIG. 21. Referring to FIG. 23, a word line driver 331 comprises a decoding block 331_a and first to seventh driving blocks 331_b1 to 331_b7. A ramper 332 may include first to seventh ramping blocks 331_1 to 332_7.

The decoding block 331_a receives a row address RAi. The decoding block 331_a then decodes a first row address portion RAi to generate decoded row addresses DRAi. The decoding block 331_a then transfers the decoded row addresses DRAi to the first to seventh driving blocks 331_b1 to 331_b7.

The first to seventh driving blocks 331_b1 to 331_b7 receive a program voltage Vpgm and a pass voltage Vpass from the high voltage generator 320 and the decoded row addresses DRAi from the decoding block 331_a. The first to seventh driving blocks 331_b1 to 331_b7 may then output any one of the program and pass voltages Vpgm and Vpass in response to the decoded row addresses DRAi, respectively.

The first to seventh ramping blocks 332_1 to 332_7 may be connected with the first to seventh driving blocks 331_b1 to 331_b7, respectively. The first to seventh ramping blocks 332_1 to 332_7 may receive the program voltage Vpgm or the pass voltage Vpass from the first to seventh driving blocks 131_b1 to 131_b7, respectively. The first to seventh ramping blocks 332_1 to 332_7 may generate the first to seventh driving signals DS<1> to DS<7>, respectively.

The first to seventh ramping blocks 332_1 to 332_7 may control rising slopes of the first to seventh driving signals DS<1> to DS<7> constantly using the ramping. That is, the first to seventh ramping blocks 332_1 to 332_7 may generate the first to seventh driving signals DS<1> to DS<7> each having a constant rising slope. Herein, the ramping means that a voltage increases stepwise.

For example, referring to FIGS. 3 to 6 and 22, since an area of a first word line WL1 taken along a second/third direction is greater than that of a seventh word line WL7, a corresponding rising slope for the first driving signal DS<1> may be steeper than that of the seventh driving signal DS<7>. In this case, the first ramping block 332_1 may adjust the first driving signal DS<1> to have substantially the same rising slope as the seventh (slowest) driving signal DS<7>. Likewise, the second to sixth ramping block 332_2 to 332_6 may adjust the second to sixth driving signals DS<2> to DS<6> to also have substantially the same rising slope as the seventh driving signal DS<7>.

Figure 24:
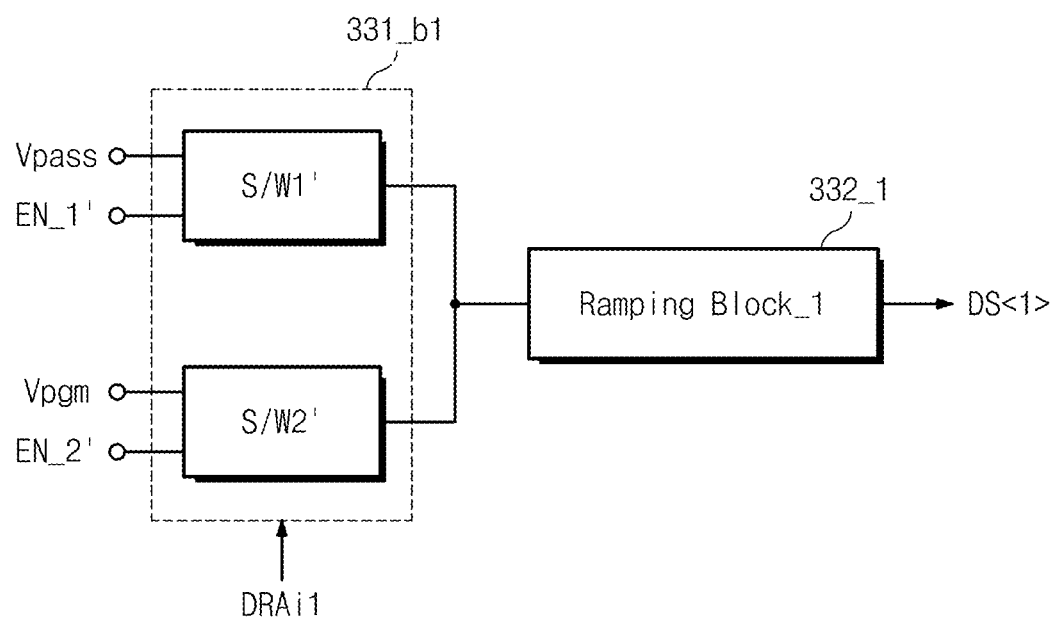
FIG. 24 is a block diagram further illustrating the driving block of FIG. 23.

FIG. 24 is a block diagram further illustrating the driving block of FIG. 23 in the context of a first driving block 331_b1 connected to a first ramping block 332_1. Referring to FIG. 24, the first driving block 331_b1 comprises a first switch S/W1' and a second switch S/W2'. The first switch S/W1' receives the pass voltage Vpass from the high voltage generator 320 and a first enable signal EN_1' from control logic 360. The second switch S/W2' receives a program voltage Vpgm from the high voltage generator 320 and a second enable signal EN_2' from the control logic 360. The first and second switches S/W1' and S/W2' may switch any one of the program voltage Vpgm and the pass voltage Vpass in response to a decoded row address DRAi1 from a decoding block 331_a.

The first ramping block 332_1 may receive the pass voltage Vpass or the program voltage Vpgm. The first ramping block 332_1 may generate a first driving signal DS<1> having a desired input voltage level.

Figure 25:
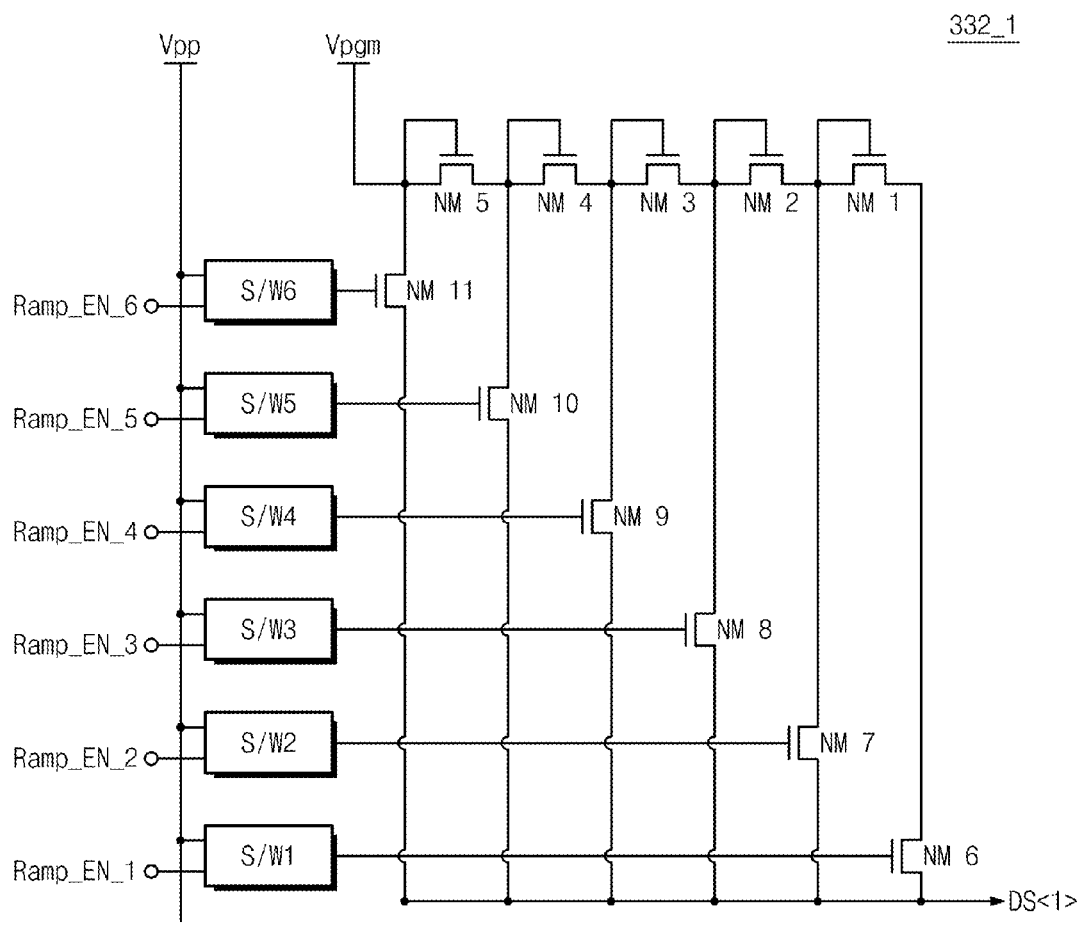
FIG. 25 is a diagram further illustrating the ramping block of FIG. 23.

FIG. 25 is a diagram further illustrating the ramping block of FIG. 23 in the context of a first ramping block 332_1. It is assumed that the first ramping block 332_1 receives a program voltage Vpgm from a first driving block 331_b1. Referring to FIG. 25, the first ramping block 332_1 comprises first to sixth switches S/W1 to S/W6 and first to eleventh transistors NM1 to NM11.

The first to sixth switches S/W1 to S/W6 receive a high voltage Vpp, and operate responsive to first to sixth ramp enable signals Ramp_EN_1 to Ramp_EN_6, respectively. The first to sixth switches S/W1 to S/W6 transfer the high voltage Vpp to gates of the sixth to eleventh transistors NM6 to NM11 in response to corresponding ramp enable signals, respectively.

The first to fifth transistors NM1 to NM5 may be connected in series. That is, a gate and a drain of each of the first to fourth transistors NM1 to NM4 may be connected with a source of each of the second to fifth transistors NM2 to NM5. A source of the first transistor NM1 may be connected with a drain of the sixth transistor NM6, and a drain of the fifth transistor NM5 may be connected with the program voltage Vpgm.

Gates of the sixth to eleventh transistors NM6 to NM11 may be connected with the first to sixth switches S/W1 to S/W6, respectively. Drains of the sixth to eleventh transistors NM6 to NM11 may be connected with sources of the first to fifth transistors NM1 to NM5, respectively. Sources of the sixth to eleventh transistors NM6 to NM11 may be connected with the same node for outputting the first driving signal DS<1>.

Figure 26:
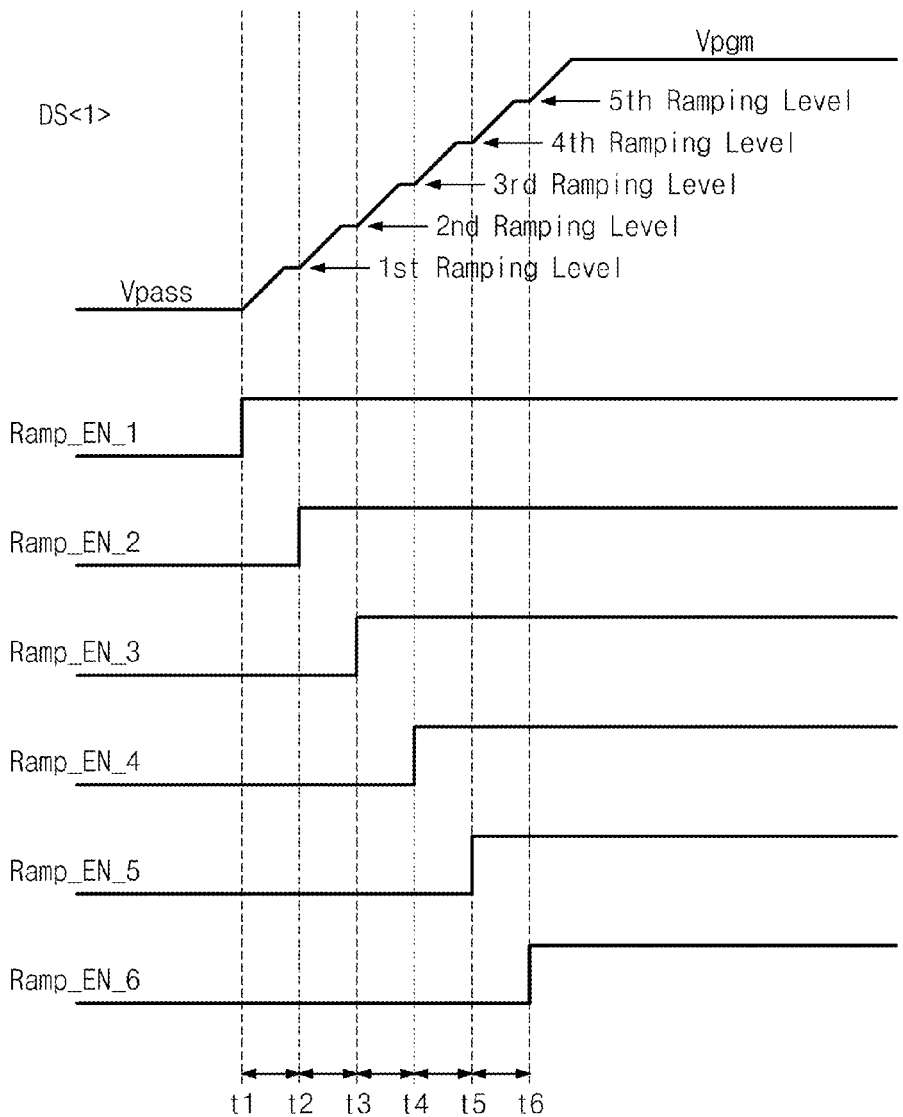
FIG. 26 is a timing diagram further describing the operation of the first ramping block of FIG. 25.

FIG. 26 is a collection of timing waveforms describing one possible operation of the first ramping block of FIG. 25. It is assumed that a voltage level of a first driving signal DS<1> rises up to a program voltage Vpgm from a pass voltage Vpass.

Referring to FIGS. 25 and 26, the first ramp enable signal Ramp_EN_1 is first activated. The first switch S/W1 then transfers the high voltage Vpp to the gate of the sixth transistor NM6 in response to activation of the first ramp enable signal Ramp_EN_1. Accordingly, the sixth transistor NM6 is turned ON. The drain of the sixth transistor NM6 is connected with the drain of a first transistor NM1.

Accordingly, the source of the sixth transistor NM6 is supplied with a voltage Vpgm-5Vth, wherein Vth is a threshold voltage for the first to fifth transistors NM1 to NM5. That is, the first driving signal DS<1> may have a voltage of Vpgm-5Vth. In this case, a voltage level (Vpgm-5Vth) of the first driving signal DS<1> may be referred to as a first ramping level.

If the second ramp enable signal Ramp_EN_2 is then activated, a seventh transistor NM7 is turned ON, so that the first driving signal DS<1> may have a voltage of (Vpgm-4Vth). That is, the first driving signal DS<1> may have a voltage of (Vpgm-4Vth). In this case, a voltage level (Vpgm-4Vth) of the first driving signal DS<1> may be referred to as a second ramping level. The second ramping level may be higher by a threshold voltage of the first transistor NM1 than the first ramping level.

As third to sixth enable signals Ramp_EN_3 to Ramp_EN_6 are sequentially activated, the voltage level of the first driving signal DS<1> may increase stepwise. Accordingly, a voltage level of the first driving signal DS<1> may increase stepwise up to the program voltage Vpgm.

In the illustrated embodiment, the rising slope of the first driving signal DS<1> may be adjusted to be substantially the same as a defined reference driving signal (e.g., a slowest driving signal). For example, the rising slope of the first driving signal DS<1> may be adjusted to be the same as that of a reference driving signal by adjusting transition times t1 to t6 of respective ramp enable signals. In another exemplary embodiment, the rising slope of the first driving signal DS<1> may be adjusted to be the same as that of a reference driving signal by setting the number of transistors of the first ramping block 332_1 to be different from that of the seventh ramping block 332_7.

In particular, in a conventional case (refer to FIG. 22), since a resistance of the seventh word line is more than that of the first word line, a rising slope of a seventh driving signal DS<7> is less than that of the first driving signal DS<1>. It is assumed that since a rising slope of the seventh driving signal DS<7> is less than that of the first driving signal DS<1>, the seventh driving signal DS<7> is set to the reference driving signal. Further, it is assumed that the seventh ramping block 332_7 has the same structure as the first ramping block 332_1.

In this case, intervals among transition times t1 to t6 of ramp enable signals of the first ramping block 332_1 may be set to be longer than those of the seventh ramping block 332_7. Accordingly, a rising slope of the first driving signal DS<1> may become relatively slow such that the rising slope of the first driving signal DS<1> is adjusted the same as that of the seventh driving signal DS<7>.

Figure 27:
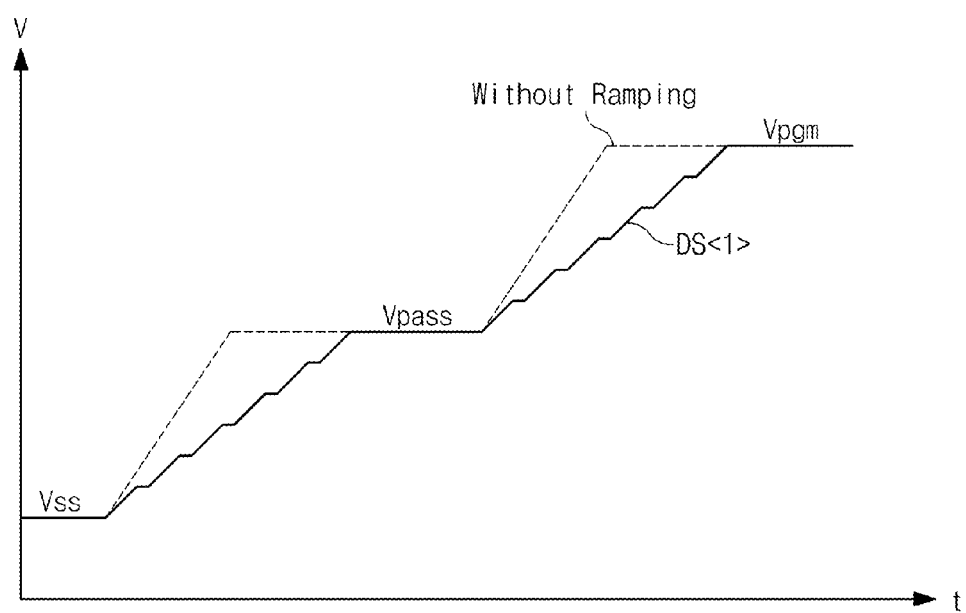
FIGS. 27 and 28 are waveform diagrams showing a first driving signal having a rising slope adjusted by a first ramping block.
Figure 28:
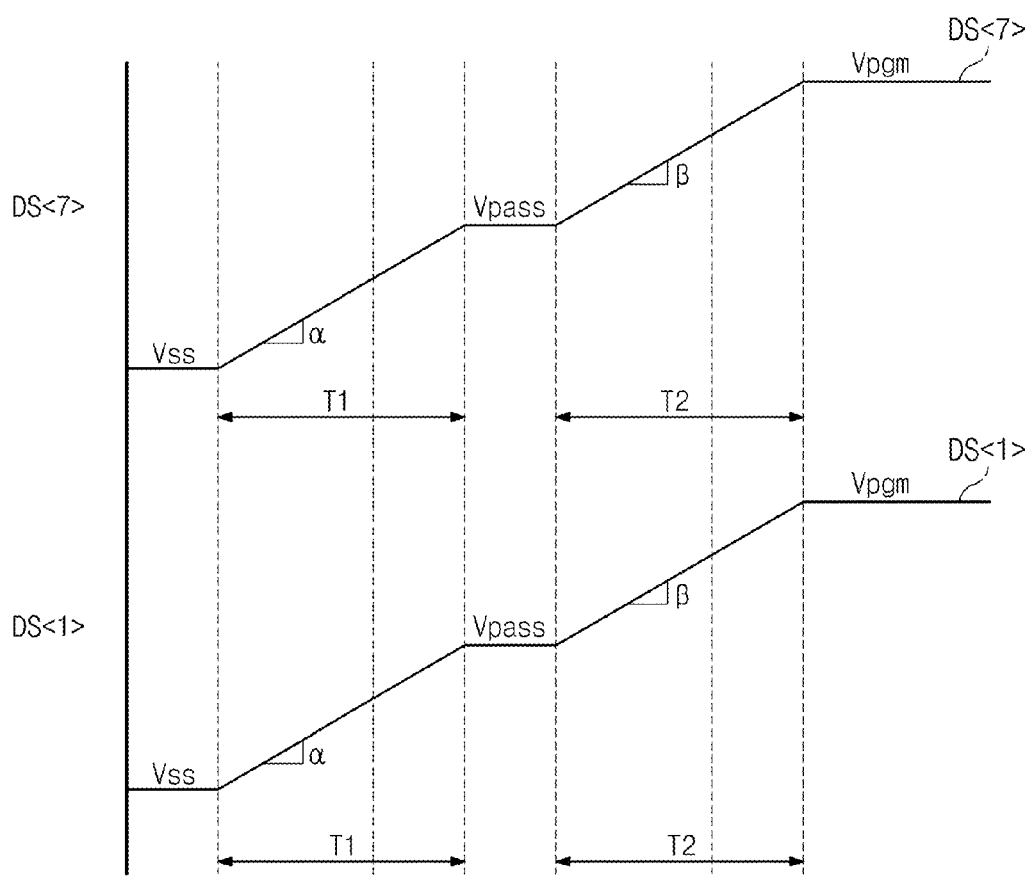

FIGS. 27 and 28 are diagrams further illustrating generation of a first driving signal having a rising slope adjusted by a first ramping block.

As illustrated in FIG. 27, when a first driving signal DS<1> rises up to a pass voltage Vpass, its rising slope may become slower as compared with the case that it is not ramped. When the first driving signal DS<1> rises up to a program voltage Vpgm, its rising slope may become slow as compared with the case that it is not ramped.

Accordingly, as illustrated in FIG. 28, the rising slope of the first driving signal DS<1> may be adjusted to have a rising slope of 'α' until a pass voltage Vpass from a ground voltage VSS and a rising slope of 'β' until a program voltage Vpgm from the pass voltage Vpass. That is, the rising slope of the first driving signal DS<1> may be adjusted to have the same rising slope as a seventh driving signal DS<7>.

Likewise, rising slopes of second to sixth driving signals DS<2> to DS<6> may be adjusted to have the same rising slope of the seventh driving signal DS<7>. This may be accomplished in the same manner as described in FIGS. 24 to 28, and description thereof is thus omitted.

As set forth above, the nonvolatile memory device according to an exemplary embodiment of the inventive concept may adjust rising slopes of driving signals applied to word lines constantly using the ramping. Accordingly, it is possible to prevent reduction of the read margin due to a program-speed difference.

In FIGS. 27 and 28, there is exemplarily illustrated the case that rising slopes α and β are different. However, it is possible to control driving signals such that rising slopes α and β have the same value.

In FIGS. 27 and 28, there is exemplarily described the case that the first to seventh driving signals DS<1> to DS<7> are ramped. It is possible to ramp a driving signal adjacent to a substrate 111 among the first to seventh driving signals DS<1> to DS<7>. This will be more fully described with reference to FIGS. 29 and 30.

Figure 29:
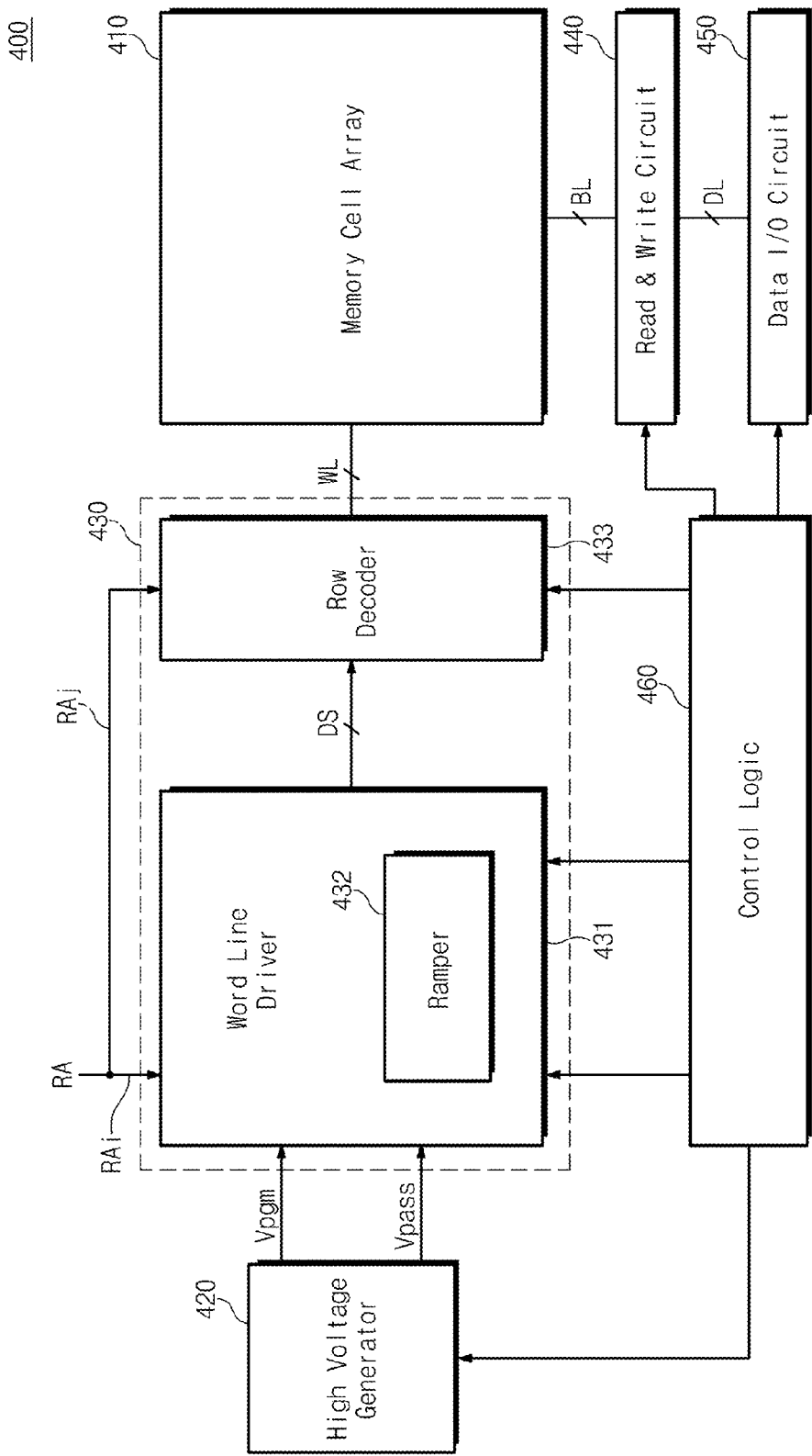
FIG. 29 is a block diagram illustrating a nonvolatile memory device according to still another embodiment of the inventive concept.

FIG. 29 is a block diagram illustrating a nonvolatile memory device according to still another embodiment of the inventive concept.

A nonvolatile memory device 400 of FIG. 29 is similar to the nonvolatile memory of FIG. 21 except that a word line driver 431 is configured to include a ramper 432. That is, the nonvolatile memory device 300 in FIG. 21 ramps all driving signals, while the nonvolatile memory device 400 in FIG. 29 ramps some of driving signals.

Figure 30:
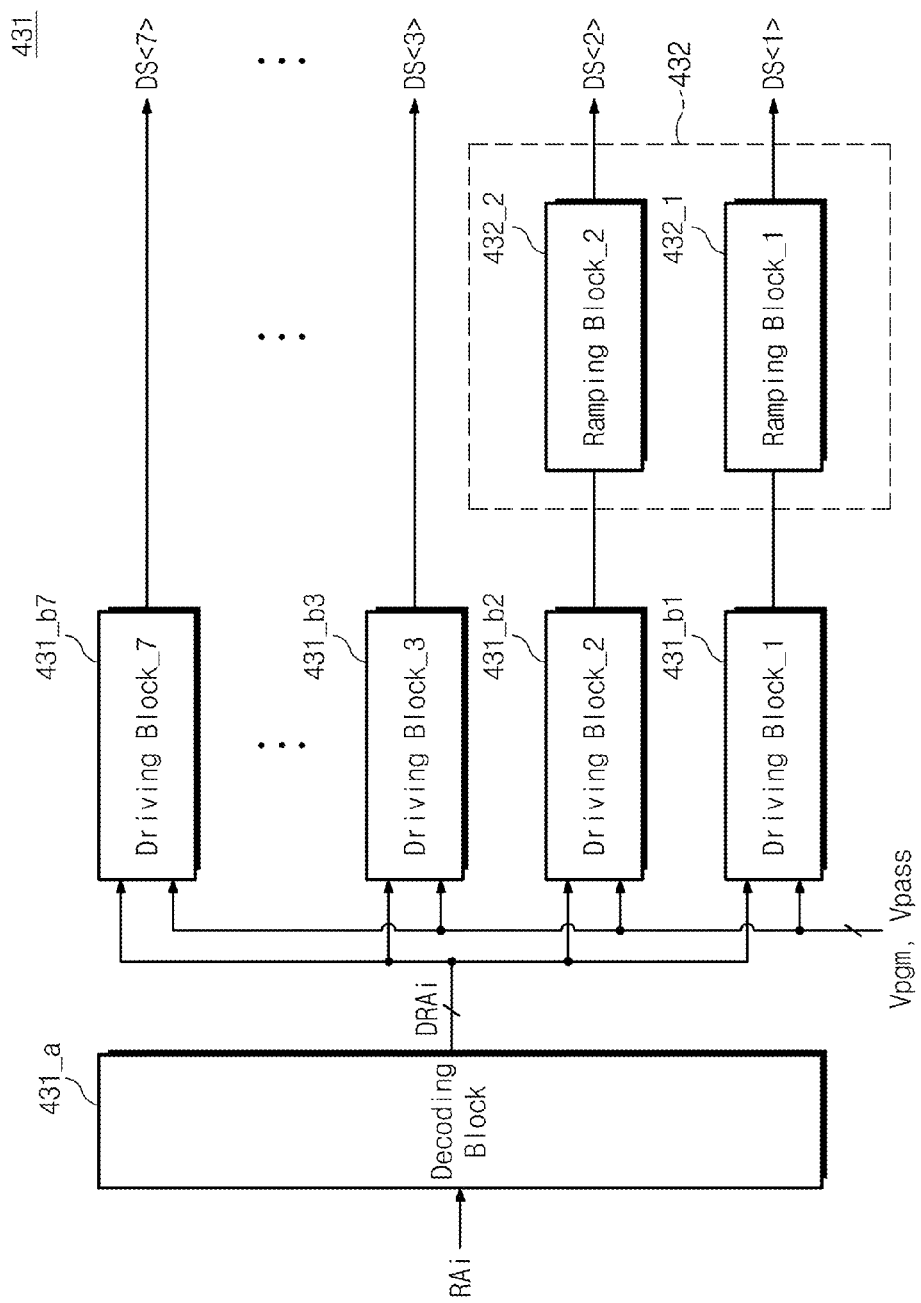
FIG. 30 is a block diagram further illustrating the word line driver of FIG. 29.

FIG. 30 is a block diagram further illustrating the word line driver of FIG. 29.

Referring to FIG. 30, a word line driver 431 comprises a decoding block 431_a, first to seventh driving blocks 431_b1 to 431_b7, and a ramper 432. The ramper 432 may include first and second ramping blocks 432_1 and 432_2. The word line driver 431 and the ramper 432 may be similar to a word line driver 331 and a ramper 332 in FIG. 23 except for interconnection between a driving block and a ramping block. This will be more fully described below.

Referring to FIGS. 23 and 30, the first and second driving blocks 431_b1 and 431_b2 of the first to seventh driving blocks 431_b1 to 431_b7 may be connected with the first and second ramping blocks 432_1 and 432_2. That is, rising slopes of first and second driving signals DS<1> and DS<2> may be adjusted to have a rising slope of a reference driving signal, while rising slopes of third to seventh driving signals DS<3> to DS<7> may be output without adjustment. Herein, the reference driving signal may be any one of the third to seventh driving signals DS<3> to DS<7>.

Referring to FIGS. 4 to 23, the closer to a substrate 111 (refer to FIG. 3), the larger areas of word lines taken along a second/third direction. That is, the closer to the substrate 111, the smaller resistance values of the word lines. Accordingly, in a conventional case, a rising slope of a driving signal applied to a word line close to the substrate 111 may be sharp as compared with that applied to a word line being far apart from the substrate 111. In this case, reduction of the read margin due to a program-speed difference may be caused mainly by a driving signal applied to a word line close to the substrate 111.

Accordingly, as illustrated in FIG. 30, the rising slopes of the first and second driving signals DS<1> and DS<2> applied to word lines close to the substrate 111 may be adjusted to have the rising slope of the reference driving signal. That is, the first and second driving blocks 431_b1 and 431_b2 of the first to seventh driving blocks 431_b1 to 431_b7 may be configured to be connected with the first and second ramping blocks 432_1 and 432_2, respectively. Accordingly, it is possible to prevent the read margin from being reduced due to a program-speed difference.

In FIG. 30, there is exemplarily described the case that the rising slopes of the first and second driving signals DS<1> and DS<2> are adjusted. The nonvolatile memory device 400 can be implemented such that the rising slope of the first driving signal DS<1> of the first to seventh driving signals DS<1> to DS<7> is adjusted only.

At this point it should be noted that the embodiments illustrated in FIGS. 3 to 6 and 21 to 30 assume a vertical pillar structure that penetrates a stack of horizontal memory cells arrays as the result of a single etching process that yields a gradual narrowing of the pillar area. However, other embodiments of the inventive concept may be configured such that two or more serially-connected but separately formed pillars are stacked on the substrate. This type of configuration will be more fully described with reference to FIGS. 31 to 33.

Figure 31:
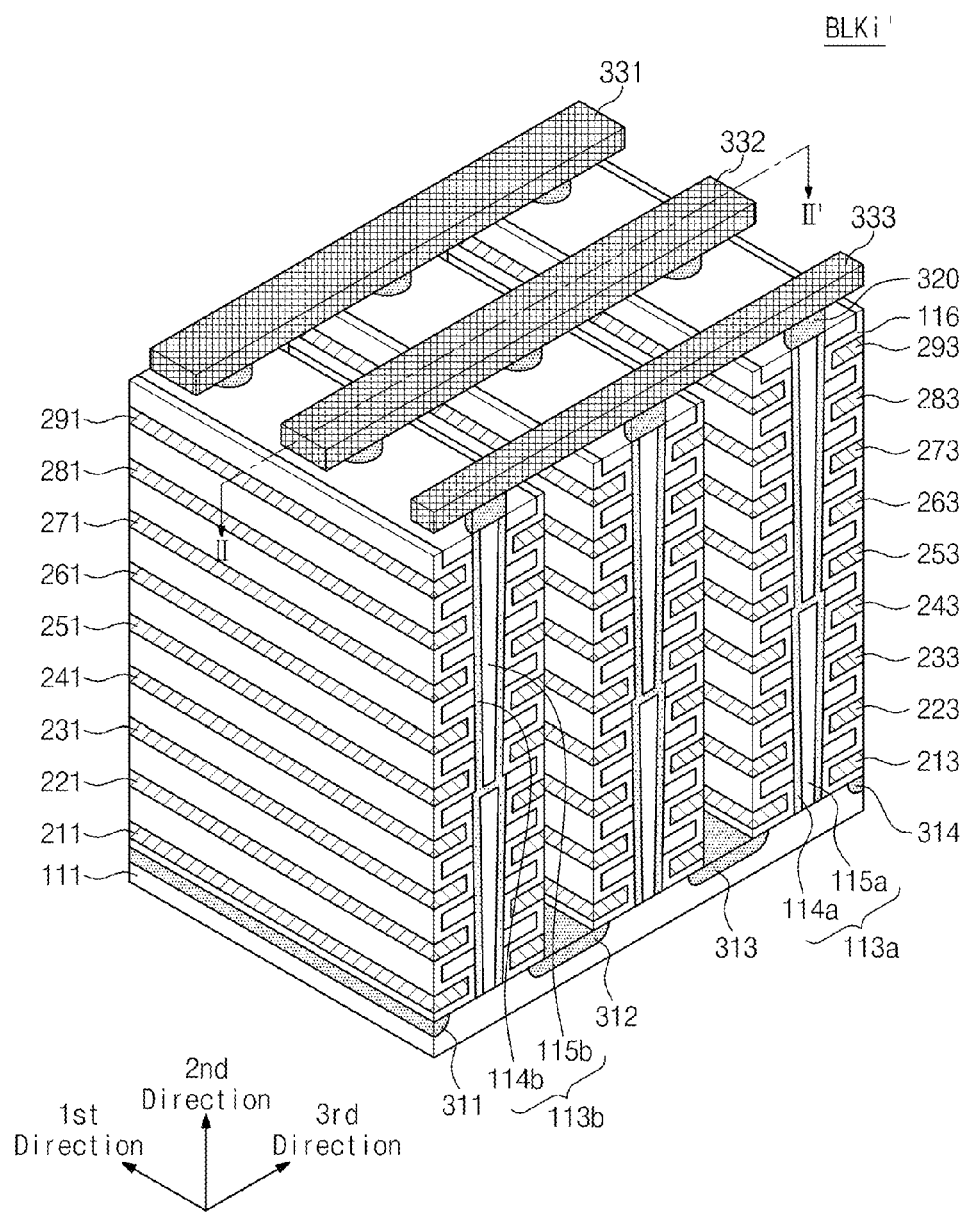
FIG. 31 is a perspective view of a memory block in FIG. 2 according to another embodiment of the inventive concept.
Figure 32:
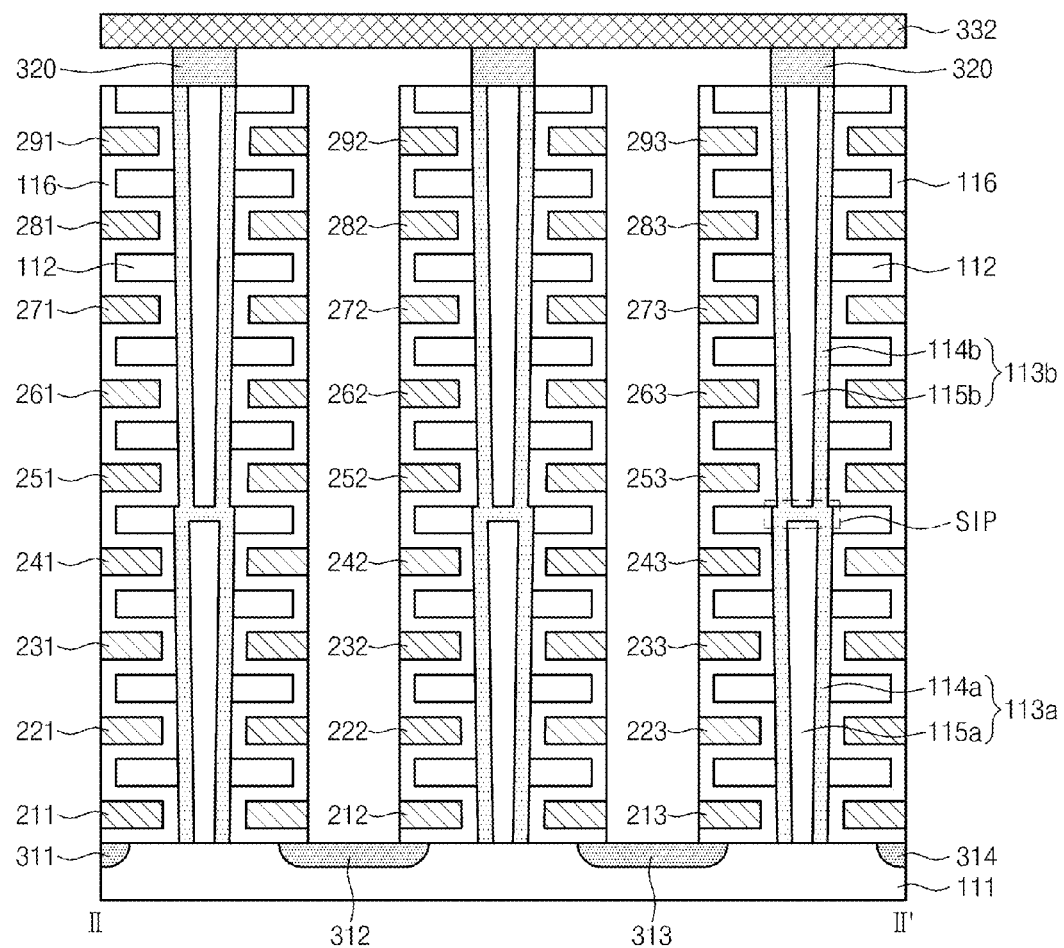
FIG. 32 is a cross-sectional view of a memory block taken along a line II-II' in FIG. 31.

FIG. 31 is a perspective view of a memory block in FIG. 2 according to another embodiment of the inventive concept. FIG. 32 is a cross-sectional view of a memory block taken along a line II-II' in FIG. 31.

A memory block BLKi' may be similar to the memory block described with reference to FIGS. 4 to 6 and 21 to 30, except one or more pillar(s) of the memory block BLKi' is formed from a first sub-pillar 113a and a second sub-pillar 113b.

Referring to FIGS. 31 and 32, the first sub-pillar 113a may be provided on a substrate 111. For example, a surface layer 114a of the first sub-pillar 113a may include a p-type silicon material, and a surface layer 114a of the first sub-pillar 113a may operate as a body of the second direction. An inner layer 115a of the first sub-pillar 113a may be formed of an insulation material.

The second sub-pillar 113b may be provided on the first sub-pillar 113a. For example, a surface layer 114b of the second sub-pillar 113b may include a p-type silicon material, and a surface layer 114b of the second sub-pillar 113b may operate as a body of the second direction. An inner layer 115b of the second sub-pillar 113b may be formed of an insulation material.

In an exemplary embodiment, the surface layers 114a and 114b of the first and second sub-pillars 113a and 113b may be interconnected. For example, as illustrated in FIGS. 31 and 32, the surface layers 114a and 114b of the first and second sub-pillars 113a and 113b may be interconnected through a p-type silicon pad SIP.

Figure 33:
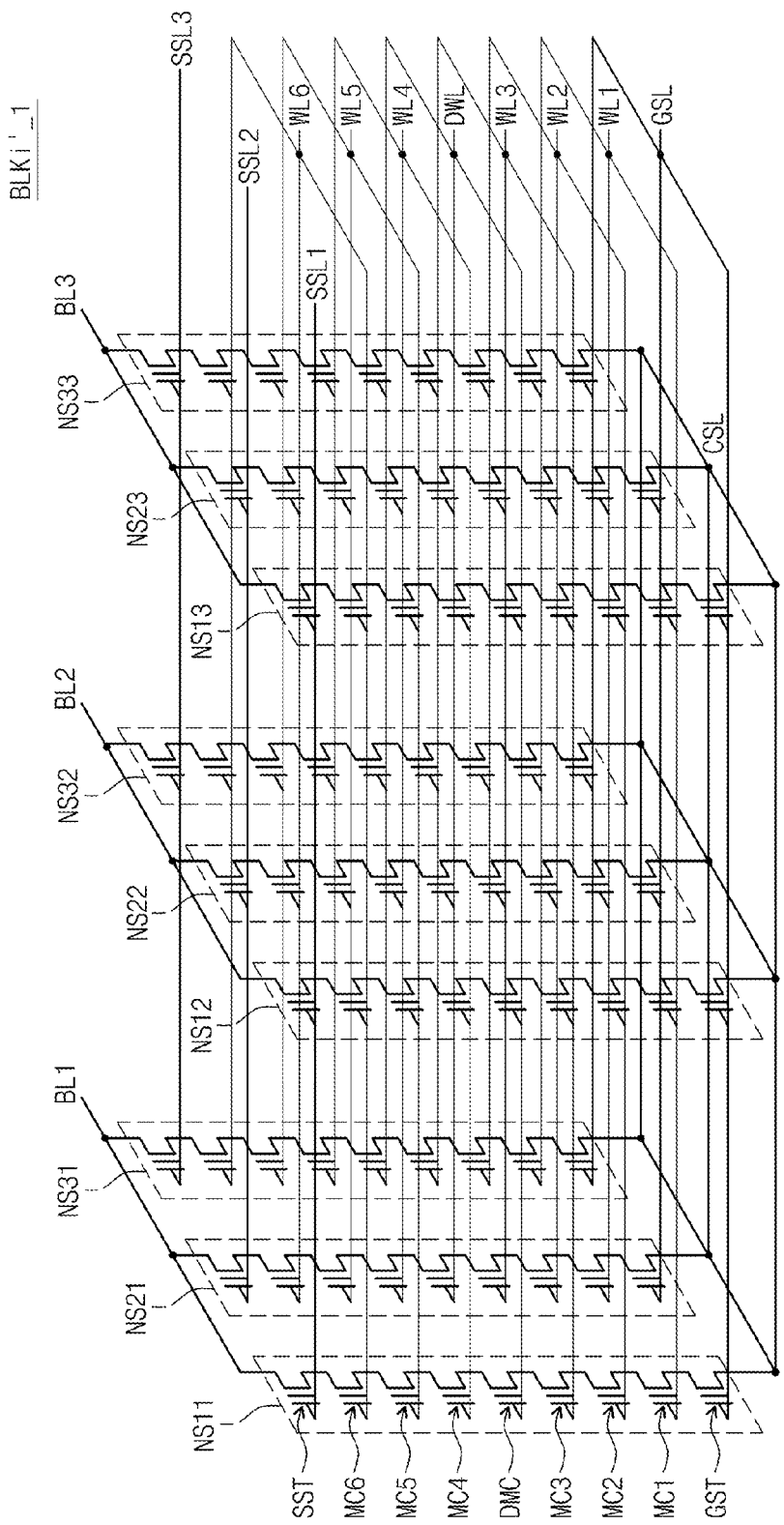
FIG. 33 is an equivalent circuit diagram of the memory block described in FIGS. 31 and 32.

FIG. 33 is an equivalent circuit diagram for the memory block described with reference to FIGS. 31 and 32. As compared with a memory block BLKi in FIG. 6, a memory block BLKi'-1a may include a dummy word line DWL provided between word lines WL3 and WL4 (or, between a group of word lines WL1 to WL3 and a group of word lines WL4 to WL6).

Memory cells MC1 to MC3 having second to fourth heights may be connected in common with first to third word lines WL1 to WL3, respectively. Dummy memory cells DMC may be provided at a fifth height and may be connected in common with a dummy word line DWL. Memory cells MC4 to MC6 having sixth to eighth heights may be connected in common with the fourth to sixth word lines WL4 to WL6.

In the illustrated embodiment, first conductive lines each having a height corresponding to a silicon pad SIP may be connected in common to form the dummy word line DWL. In FIG. 33, there is exemplarily illustrated the case that the dummy word line DWL is formed of the first conductive lines 251 to 253 (refer to FIG. 32) of the fifth height. But, the height of the first conductive lines forming the dummy word line DWL is not limited thereto.

Continuing to refer to FIGS. 31 to 33, as each sub-pillar descends towards the substrate 111, the areas of word lines taken along a second/third direction corresponding to the first and second sub-pillars 113a and 113b increase in size. Further, areas of the first to third word lines WL1 to WL3 taken along a second/third direction corresponding to the first sub-pillar 113a may be identical or similar to areas of the fourth to sixth word lines WL4 to WL6 taken along a second/third direction corresponding to the second sub-pillar 113b.

In particular, an area of the first word line WL1 taken along a second/third direction may be wider than areas of the second and third word lines WL2 and WL3, and may be identical or similar to that of the fourth word line WL4. An area of the second word line WL2 may be wider than that of the third word line WL3, and may be identical or similar to that of the fifth word line WL5. An area of the third word line WL3 may be wider than that of the sixth word line WL6.

Since the first and fourth word lines WL1 and WL4 have the largest area, in a general case, rising slopes of driving signals corresponding to the first and fourth word lines WL1 and WL4 may be sharp as compared with rising slopes of driving signals corresponding to remaining word lines. Accordingly, reduction of the read margin due to a program-speed difference may be caused mainly by driving signals applied to the first and fourth word lines WL1 and WL4. In order to avoid this problem, a nonvolatile memory device 400 according to an exemplary embodiment of the inventive concept may be configured to adjust rising slopes of driving signals corresponding to the first and fourth word lines WL1 and WL4. This will be more fully described with reference to FIG. 34.

Figure 34:
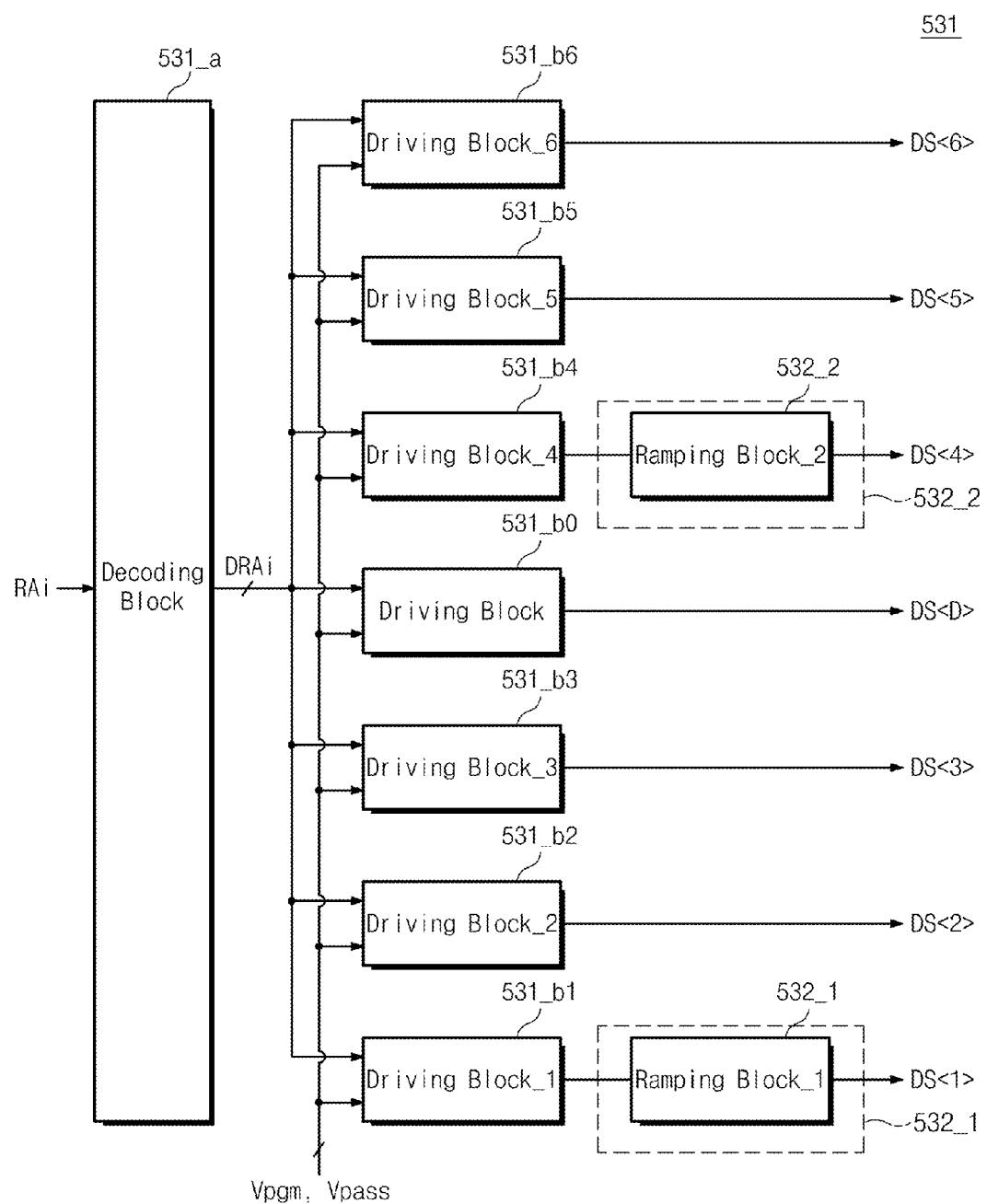
FIG. 34 is a block diagram illustrating a word line driver that provides driving signals to the memory block described in FIGS. 31, 32 and 33.

FIG. 34 is a block diagram further illustrating a word line driver providing driving signals to the memory block described in FIGS. 31 to 33. Referring to FIG. 34, a word line driver 531 comprises a decoding block 531_a, a dummy driving block 531_b0, first to sixth driving blocks 531_b1 to 531_b6, and first and second ramping blocks 532_1 and 532_2. Herein, the first and second ramping blocks 532_1 and 532_2 may be called a ramper.

The word line driver 531 in FIG. 34 may be similar to that in FIG. 30 except for interconnection between driving blocks and ramping blocks, which will be more fully described below.

Referring to FIG. 34, first to third driving signals DS<1> to DS<3> may be provided to first to third word lines WL1 to WL3 (refer to FIG. 33), respectively. Fourth to sixth driving signals DS<4> to DS<6> may be provided to fourth to sixth word lines WL4 to WL6 (refer to FIG. 33), respectively. A dummy driving signal DS<D> may be provided to a dummy word line DWL (refer to FIG. 33). The first to third word lines WL1 to WL3 may constitute a first word line group, and the fourth to sixth word lines WL4 to WL6 may constitute a second word line group. The first and second ramping blocks 532_1 and 532_2 may be connected to the first and fourth driving blocks 531_*b*1 and 531_*b*4, respectively.

As described in FIGS. 31 to 33, since the first word line WL1 in the first word line group has the largest cross-sectional area, in a general case, a rising slope of the first driving signal DS<1> may be largest as compared with remaining word lines in the first word line group. Likewise, since the fourth word line WL4 in the second word line group has the largest cross-sectional area, in a general case, a rising slope of the fourth driving signal DS<4> may be largest as compared with remaining word lines in the second word line group. Accordingly, as illustrated in FIG. 34, the word line driver 531 may be implemented to adjust the rising slopes of the first and fourth driving signals DS<1> and DS<4>. It is possible to prevent the loss of read margin due to a program-speed difference by adjusting the rising slopes of the first and fourth driving signals DS<1> and DS<4>.

Figure 35:
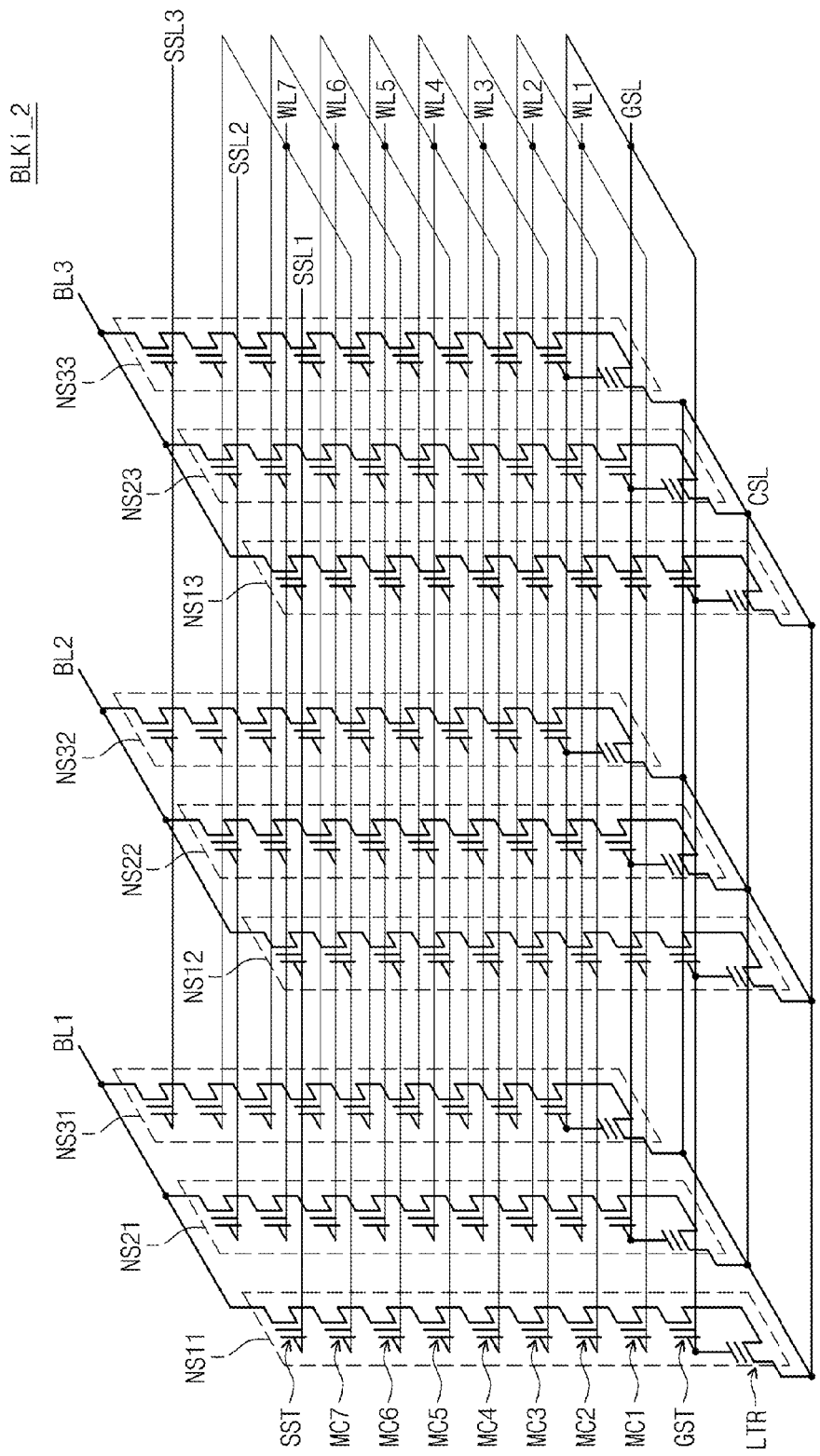
FIG. 35 is an equivalent circuit diagram of the memory block described in FIGS. 3, 4 and 5 according to another embodiment of the inventive concept.

FIG. 35 is an equivalent circuit diagram for the memory block described in FIGS. 3 to 5 according to another embodiment of the inventive concept. As compared with an equivalent circuit described with reference to FIG. 6, a memory block BLKi_2 may further include a lateral transistor LTR associated with each NAND string.

In each NAND string NS, the lateral transistor LTR may be connected between a ground selection transistor GST and a common source line CSL. A gate (or, a control gate) of the lateral transistor LTR may be connected to a ground selection line GSL together with a gate (or, a control gate) of the ground selection transistor GST.

As described with reference to FIGS. 3 to 6, first conductive lines 211, 212, and 213 having a first height may correspond to the ground selection line GSL.

If a specific voltage is applied to the first conductive lines 211, 212, and 213 having the first height, a channel may be formed at a region of a surface layer 114 adjacent to the first conductive lines 211, 212, and 213. That is, a channel may be formed at the ground selection transistors GST. Further, if a specific voltage is applied to the first conductive lines 211, 212, and 213, a channel may be formed at a region of a substrate 111 adjacent to the first conductive lines 211, 212, and 213.

A first doping region 311 may be connected with a channel formed at the substrate 111 by a voltage of the first conductive line 211. The channel formed by a voltage of the first conductive line 211 may be connected with a channel formed at the surface layer 114 by a voltage of the first conductive line 211. The channel formed at the surface layer 114 may operate as a body of the second direction.

Likewise, a channel may be formed at the substrate 111 by voltages of the first conductive lines 211, 212, and 213. First to fourth doping regions 311 to 314 may be connected to surface layers 114, which operate as a body of the second direction, through a channel formed at the substrate 111 by the voltages of the first conductive lines 211, 212, and 213.

As described with reference to FIGS. 3 to 6, the first to fourth doping regions 311 to 314 may be connected in common to form a common source line CSL. The common source line CSL and channels of memory cells MC1 to MC7 may be connected electrically through channels, being vertical to and parallel with the substrate 111, formed by a voltage of the ground selection line GSL. That is, it is understood that transistors, which are vertical to the substrate, parallel with the substrate, and driven by the ground selection line GSL, may be provided between the common source line CSL and the memory cells MC1 to MC3. The transistor vertical to the substrate may be considered to be the ground selection transistor GST, and the transistor parallel with the substrate may be considered to be the lateral transistor LTR.

Figure 36:
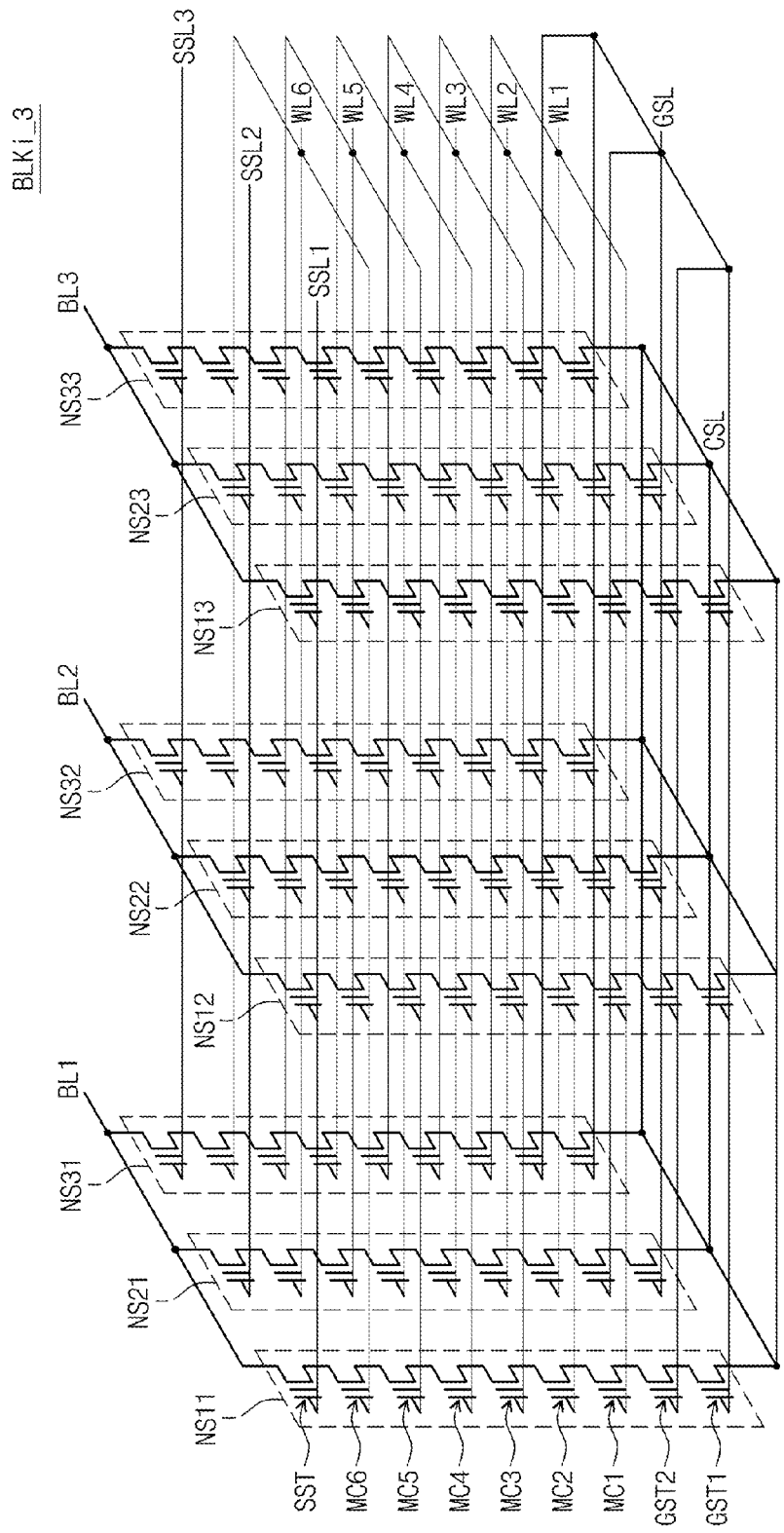
FIG. 36 is another equivalent circuit diagram of the memory block described with reference to FIGS. 3, 4 and 5 according to still another embodiment of the inventive concept.

FIG. 36 is an equivalent circuit diagram for the memory block described with reference to FIGS. 3 to 5 according to still another exemplary embodiment of the inventive concept. As compared with a memory block BLKi_1 in FIG. 6, in each NAND transistor, two ground selection transistors GST1 and GST2 may be provided between a common source line CSL and memory cells MC1 and MC6. The two ground selection transistors GST1 and GST2 may be connected to one ground selection line GSL.

Figure 37:
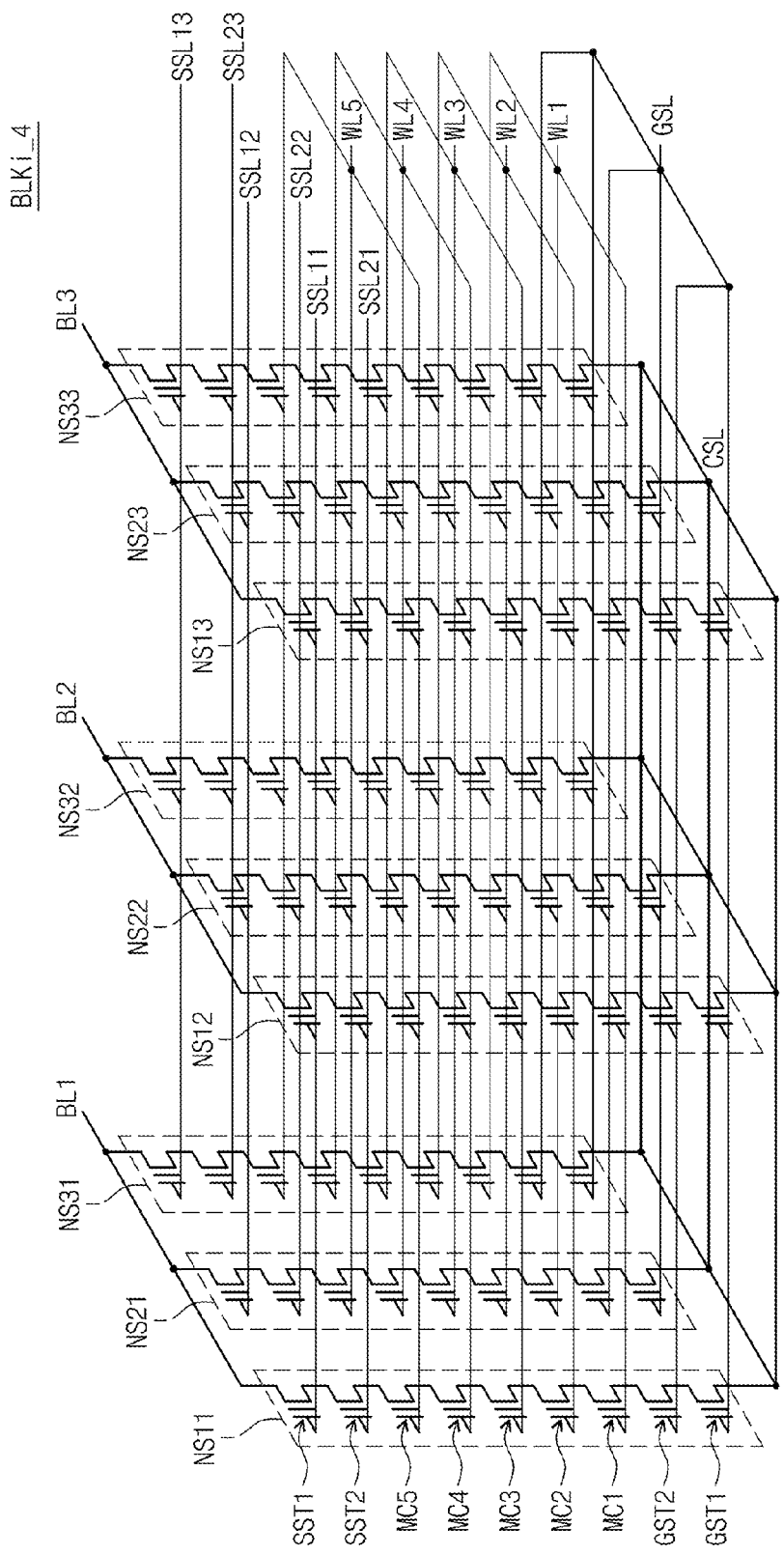
FIG. 37 is yet another equivalent circuit diagram of the memory block described with reference to FIGS. 3, 4 and 5 according to still another embodiment of the inventive concept.

FIG. 37 is an equivalent circuit diagram for the memory block described with reference to FIGS. 3 to 5 according to still another exemplary embodiment of the inventive concept. As compared with a memory block BLKi_3 in FIG. 36, in each NAND string NS, two string selection transistors SST1 and SST2 may be provided between memory cells MC1 to MC5 and a bit line BL.

In case of NAND strings in the same row, string selection transistors SST of the same height may share one string selection line SSL. For example, in NAND strings NS11 to NS13 in the first row, first string selection transistors SST1 may share a string selection line SSL11, and second string selection transistors SST2 may share a string selection line SSL21.

In NAND strings NS21 to NS23 in the second row, the first string selection transistors SST1 may share a string selection line SSL12, and the second string selection transistors SST2 may share a string selection line SSL22.

In NAND strings NS31 to NS33 in the third row, the first string selection transistors SST1 may share a string selection line SSL13, and the second string selection transistors SST2 may share a string selection line SSL23.

Figure 38:
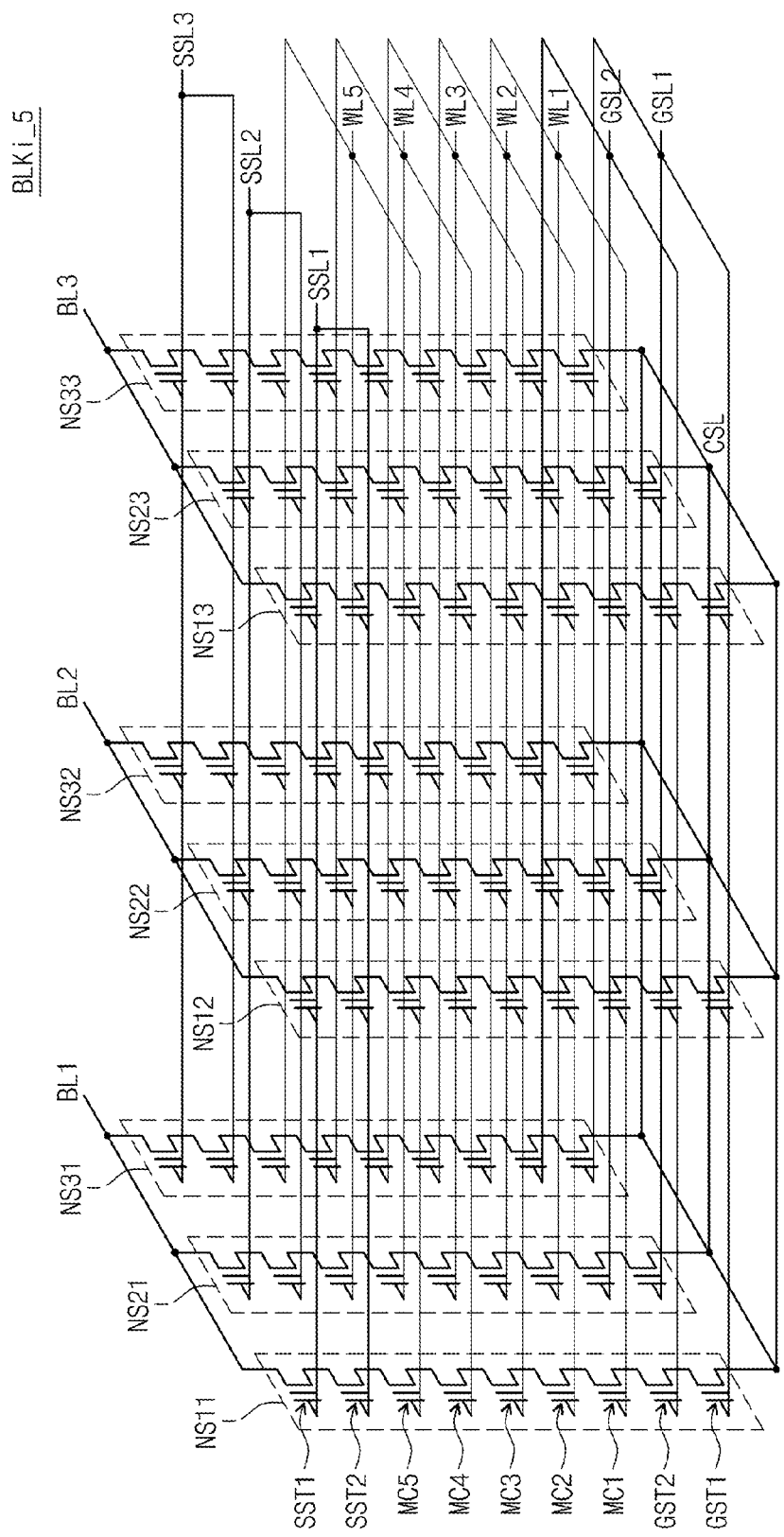
FIG. 38 is still another equivalent circuit diagram of the memory block described with reference to FIGS. 3, 4 and 5 according to still another embodiment of the inventive concept.

FIG. 38 is equivalent circuit diagram for the memory block described with reference to FIGS. 3 to 5 according to still another exemplary embodiment of the inventive concept. As compared with a memory block BLKi_4 in FIG. 37, string selection lines SSL corresponding to NAND strings NS of the same row may be connected in common.

Figure 39:
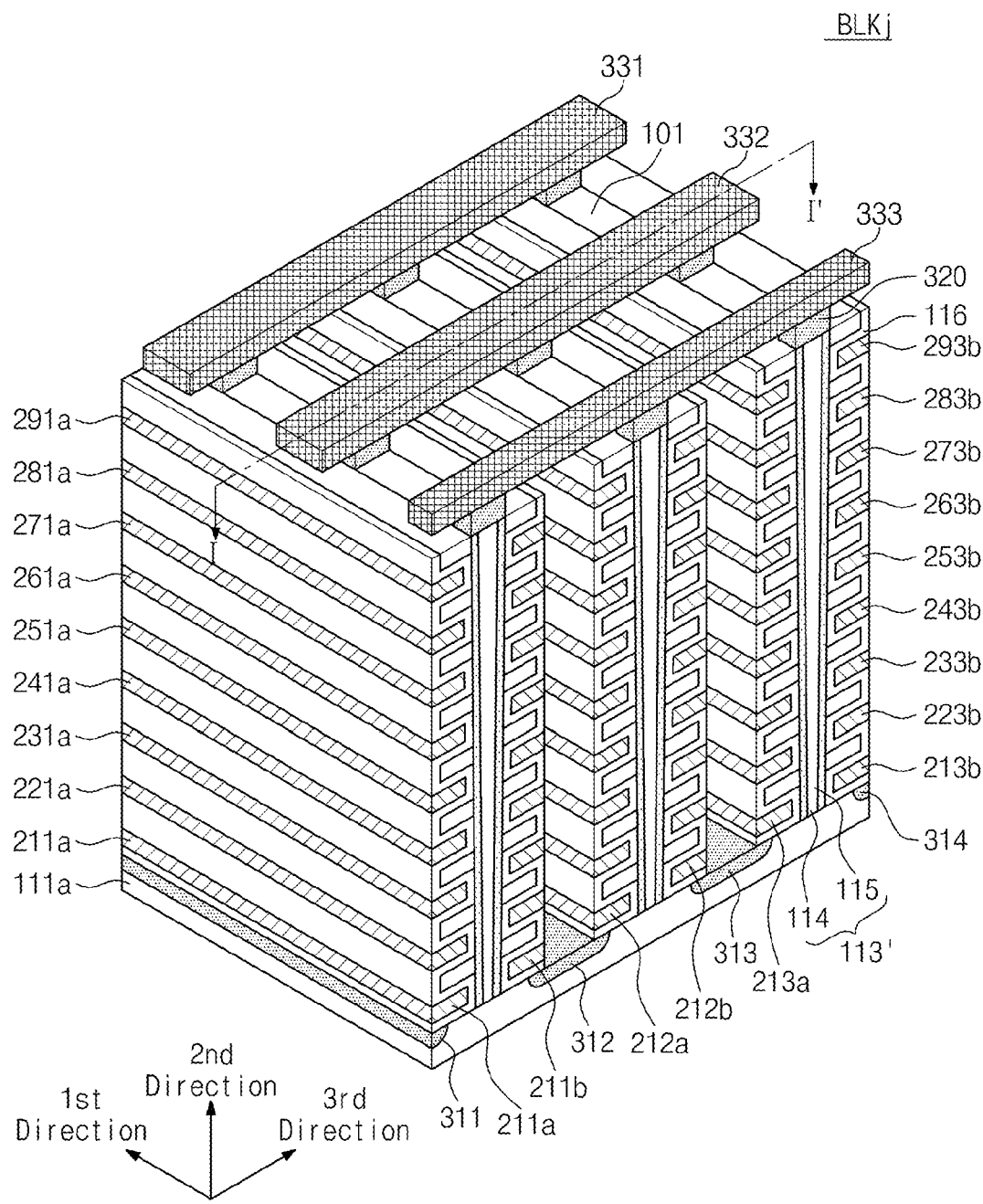
FIG. 39 is a perspective view further illustrating one of the memory blocks of FIG. 2 according to another embodiment of the inventive concept.

FIG. 39 is a perspective view of one of memory blocks in FIG. 2 according to another exemplary embodiment of the inventive concept. A cross section view taken along a line I-I' of a memory block BLKj may be identical to that illustrated in FIG. 4.

As compared with a memory block BLKi in FIG. 3, the memory block BLKj may include square pillars 113'. Insulation materials 101 may be provided between the pillars 113' which are spaced apart along a first direction. For example, the insulation materials 101 may extend along a second direction so as to contact with a substrate 111.

First conductive materials 211 to 291, 212 to 292, and 213 to 293 described in FIG. 3 may be divided into first portions 211a to 291a, 212a to 292a, and 213a to 293a and the second portions 211b to 291b, 212b to 292b, and 213b to 293b by the insulation materials 101.

At a region between the first and second doping regions 311 and 312, each pillar 113' may form one NAND string NS together with the first portions 211a to 291a of the first conductive materials and an insulation film 116 and another NAND string NS together with the second portions 211b to 291b of the first conductive materials and the insulation film 116.

At a region between the second and third doping regions 312 and 313, each pillar 113' may form one NAND string NS together with the first portions 212a to 292a of the first conductive materials and the insulation film 116 and another NAND string NS together with the second portions 212b to 292b of the first conductive materials and the insulation film 116.

At a region between the third and fourth doping regions 313 and 314, each pillar 113' may form one NAND string NS together with the first portions 213a to 293a of the first conductive materials and the insulation film 116 and another NAND string NS together with the second portions 213b to 293b of the first conductive materials and the insulation film 116.

That is, each pillar 113' may form two NAND strings by dividing the first conductive materials, provided at both sides of each pillar 113', into the first and second portions 211a to 291a and 211b to 291b using the insulation material 101.

The memory block BLKj may be implemented by equivalent circuits described in FIG. 6 or FIGS. 21 to 24. It is possible to constantly maintain rising slopes of program and pass voltages Vpgm and Vpass provided to word lines of the memory block BLKj at a program operation. Accordingly, reduction of the read margin due to a program-speed difference can be prevented. It is possible to constantly maintain rising slopes of selection and non-section read voltages Vrd and Vread provided to word lines of the memory block BLKj at a read operation. Accordingly, the read disturbance can be prevented.

Figure 40:
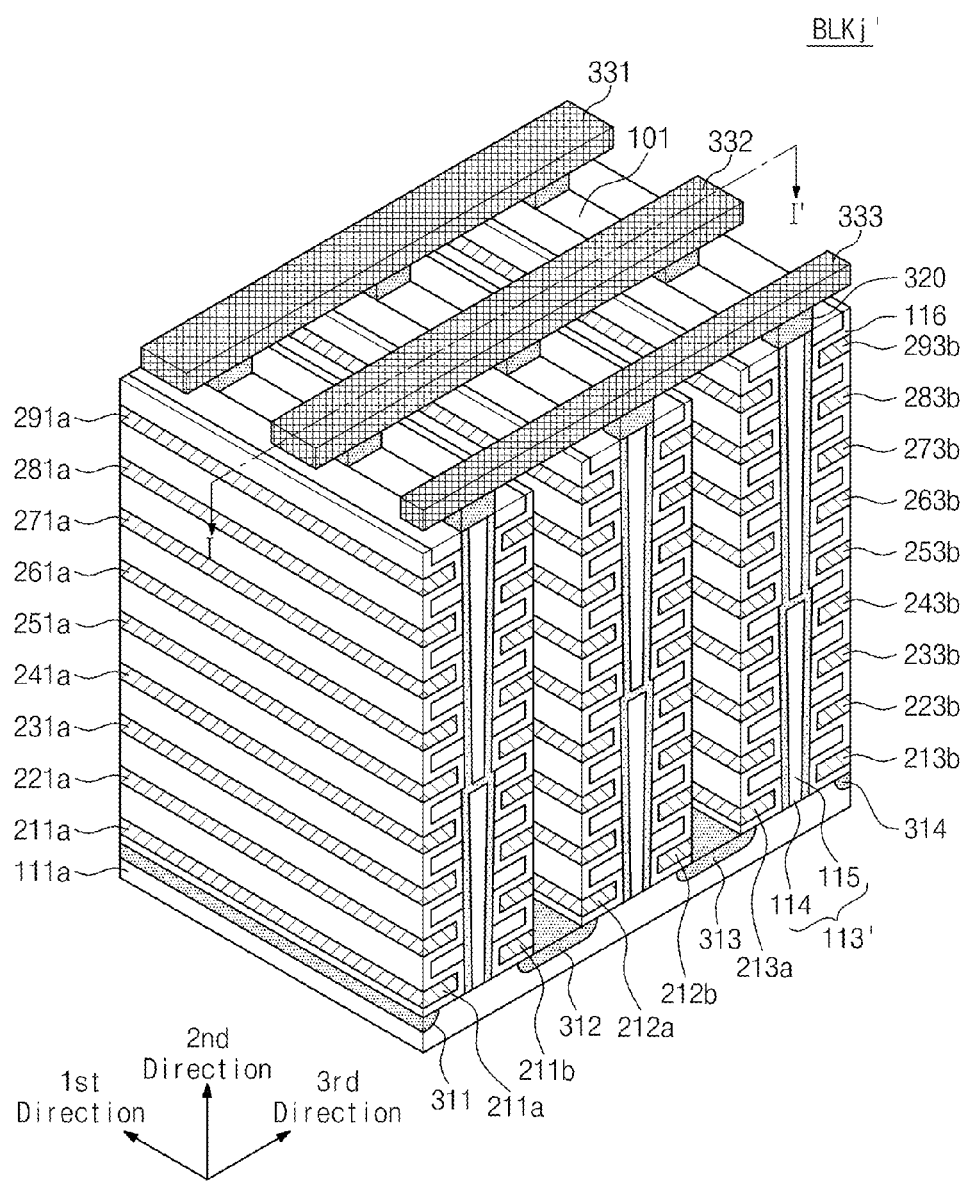
FIG. 40 is a perspective view further illustrating the memory block of FIG. 39 according to another embodiment of the inventive concept.

FIG. 40 is a perspective view further illustrating the memory block of FIG. 39 according to another exemplary embodiment of the inventive concept. A cross-sectional view taken along a line I-I' of a memory block BLKj' may be identical to that illustrated in FIG. 32. The memory block BLKj' may be identical to that described in FIG. 39 except that one pillar of the memory block BLKj' includes a first sub-pillar 113a and a second sub-pillar 113b.

One pillar in a memory block BLKj' may include the first and second sub-pillars 113a and 113b. The first and second sub-pillars 113a and 113b may be configured the same as described in FIGS. 31 and 32.

One pillar 113' may form two NAND strings. First portions 211a to 291a and second portions 211b to 291b, 212b to 292b, and 213b to 293b of first conductive materials may correspond to ground selection lines GSL, word lines WL, and string selection lines SSL. Word lines having the same height may be connected in common.

The memory block BLKj' may be implemented by equivalent circuits described in FIG. 6 or FIGS. 33 to 38. It is possible to constantly adjust rising slopes of program and pass voltages Vpgm and Vpass provided to word lines of the memory block BLKj' at a program operation. Accordingly, reduction of the read margin due to a program-speed difference can be prevented. It is possible to adjust rising slopes of selection and non-selection read voltages Vrd and Vread provided to word lines of the memory block BLKj' at a read operation. Accordingly, the read disturbance can be prevented.

Figure 41:
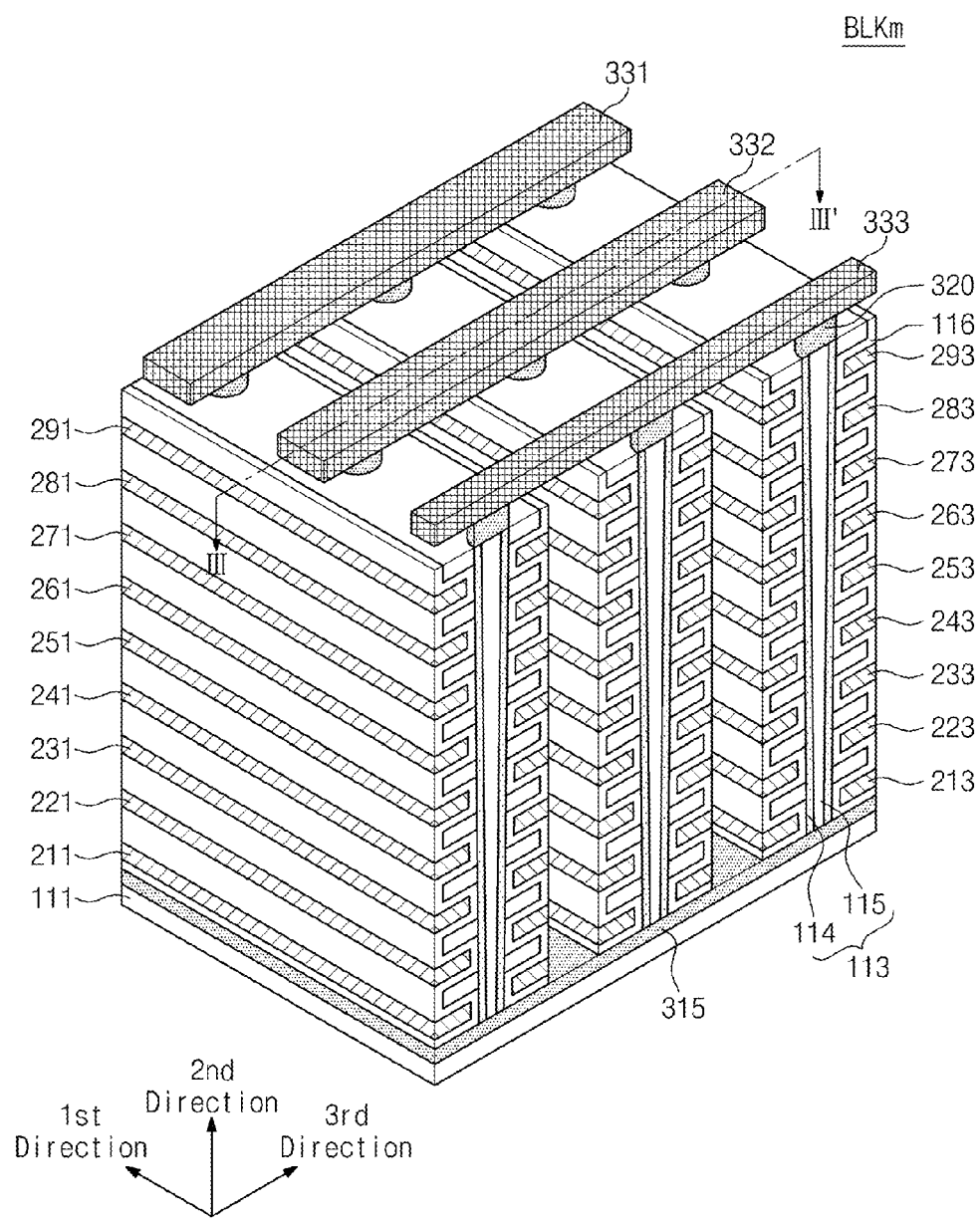
FIG. 41 is a perspective view further illustrating one of the memory blocks of FIG. 3 according to still another embodiment of the inventive concept.
Figure 42:
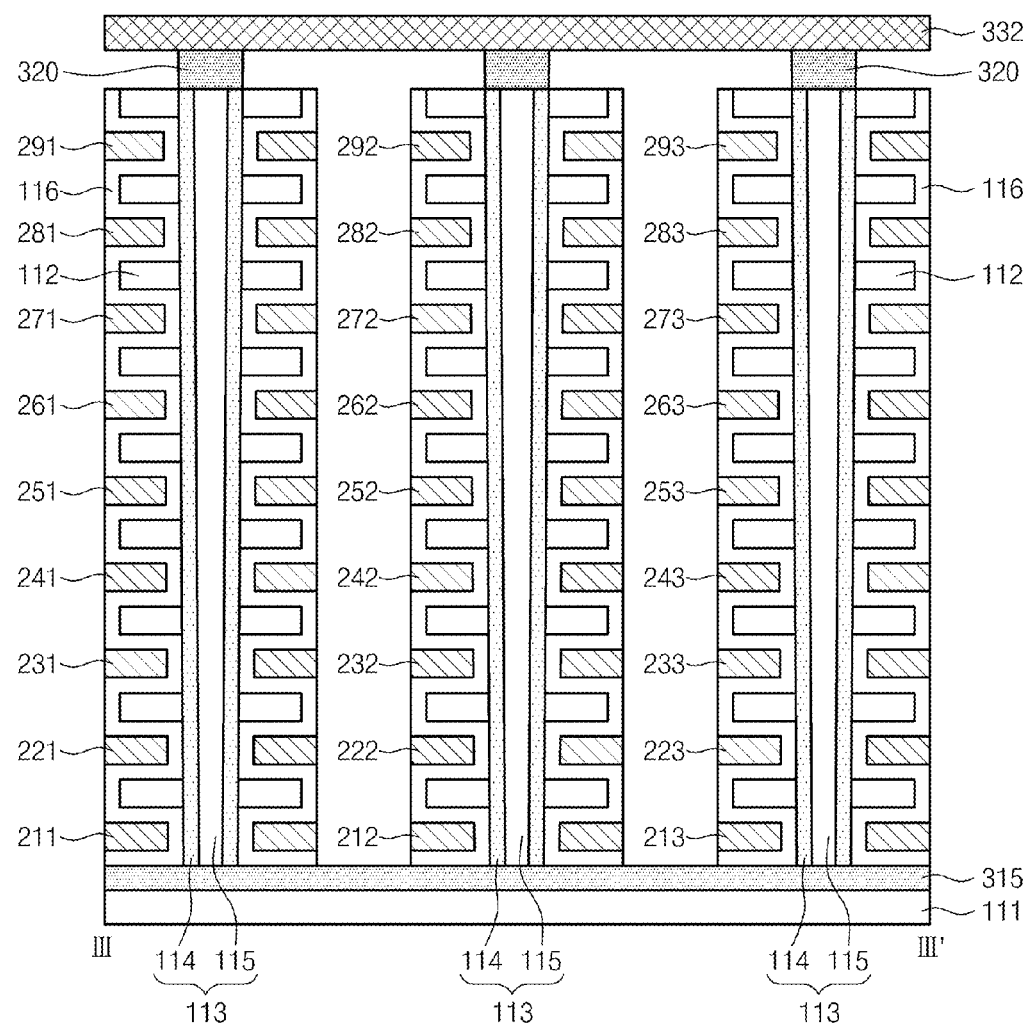
FIG. 42 is a cross-sectional view of a memory block taken along a line III-III' in FIG. 41.

FIG. 41 is a perspective view further illustrating one of the memory blocks of FIG. 3 according to still another exemplary embodiment of the inventive concept. FIG. 42 is a cross-sectional view of a memory block taken along a line III-III' in FIG. 41.

A memory block BLKm may be identical to that described in FIGS. 3 to 5 except that an n-type doping region 315 forming a common source line CSL is configured to have a plate shape. In an exemplary embodiment, the n-type doping region 315 may be formed by an n-type well.

The memory block BLKm may be implemented by equivalent circuits described in FIG. 6 or FIGS. 35 to 38. It is possible to constantly maintain rising slopes of program and pass voltages Vpgm and Vpass provided to word lines of the memory block BLKm at a program operation. Accordingly, a reduction in the loss of read margin due to a program-speed difference may be provided. It is possible to constantly maintain rising slopes of selection and non-selection read voltages Vrd and Vread provided to word lines of the memory block BLKm at a read operation. Accordingly, read disturbances may be prevented.

Figure 43:
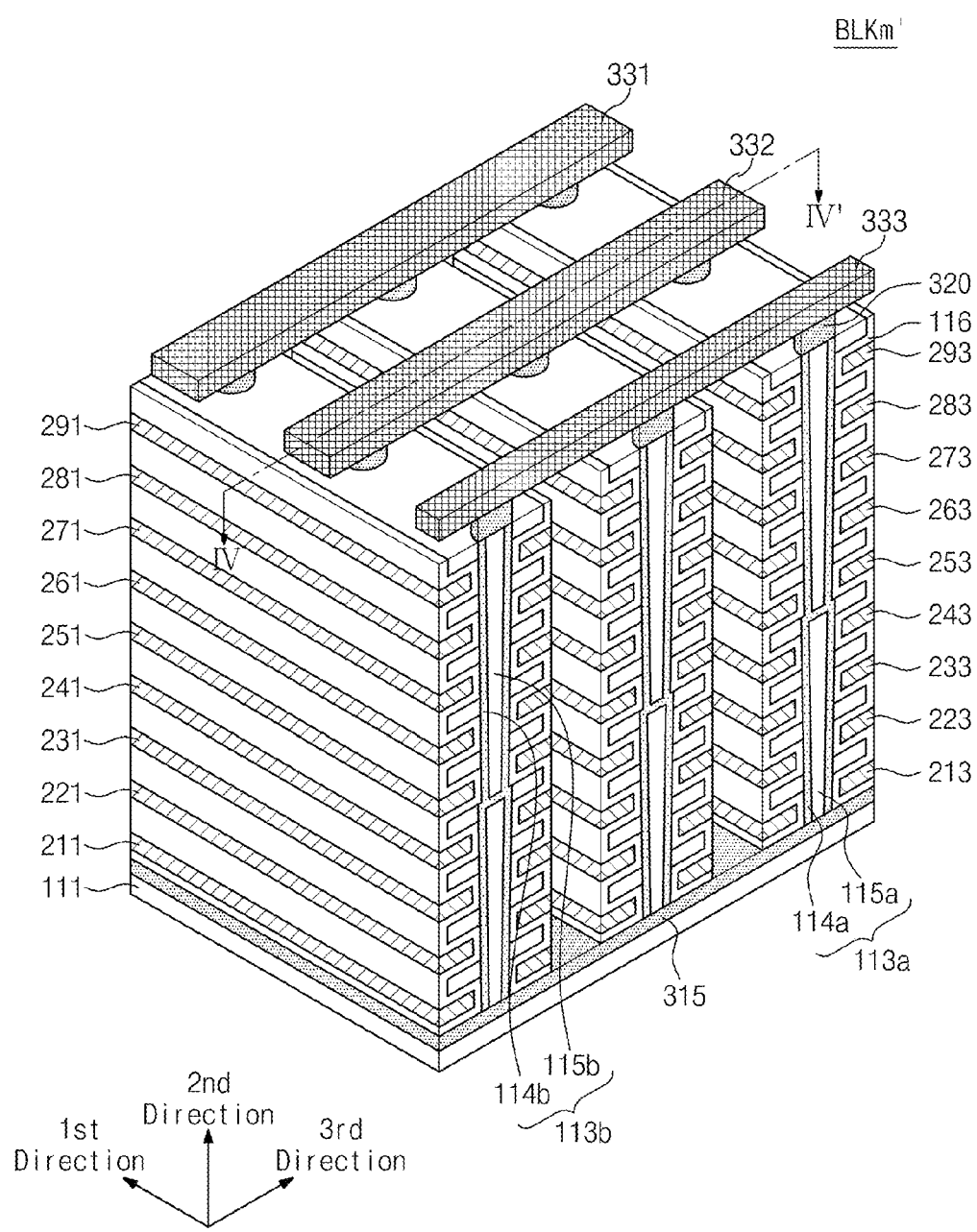
FIG. 43 is a perspective view further illustrating the memory block of FIG. 41 according to another embodiment of the inventive concept.
Figure 44:
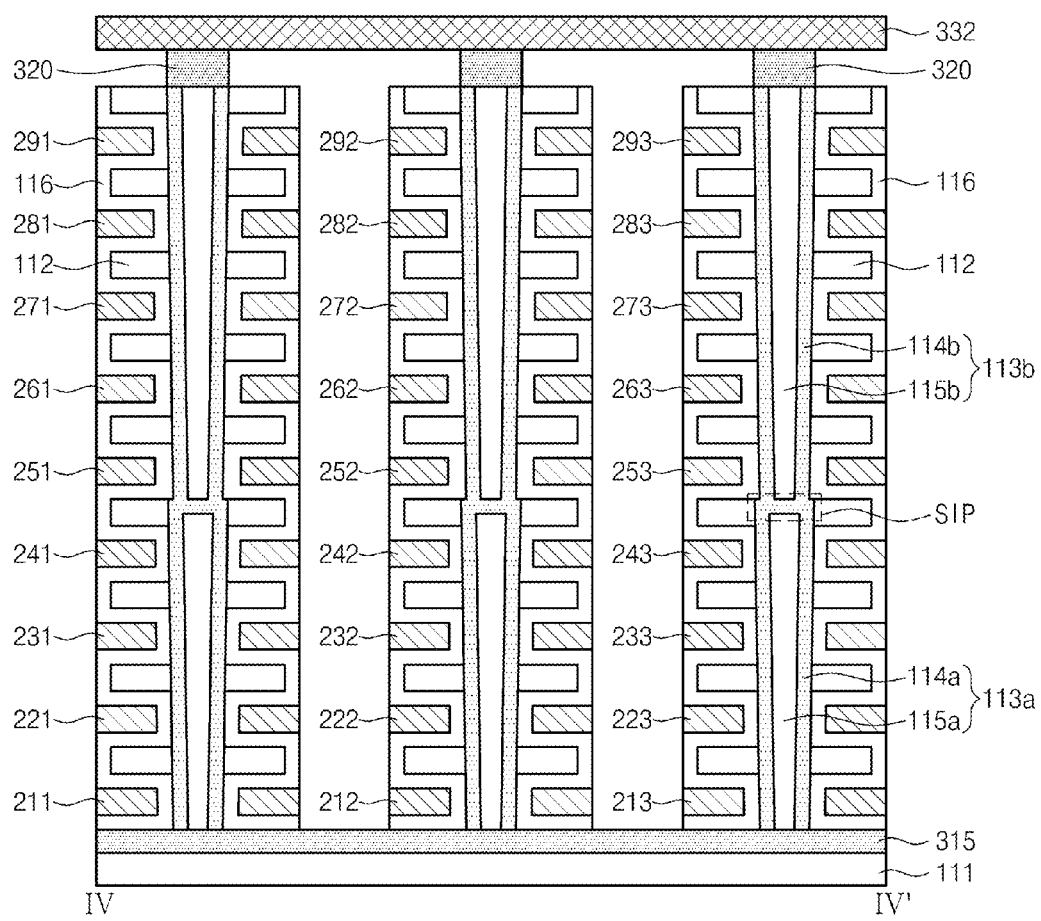
FIG. 44 is a cross-sectional view of a memory block taken along a line IV-IV' in FIG. 43.

FIG. 43 is a perspective view further illustrating the memory block of FIG. 41 according to another exemplary embodiment of the inventive concept. FIG. 44 is a cross-sectional view of a memory block taken along a line IV-IV' in FIG. 43. A memory block BLKm' may be identical to that describe in FIGS. 41 and 42 except that one pillar of the memory block BLKm' may include first and second sub-pillars 113a and 113b.

One pillar of the memory block BLKm' may include the first and second sub-pillars 113a and 113b. The first sub-pillars 113a and the second sub-pillars 113b may be configured the same as that described in FIGS. 35 and 36. As described in FIGS. 41 and 42, an n-type doping region 315 forming a common source line CSL may be provided to have a plate shape.

The memory block BLKm' may be implemented by equivalent circuits described in FIG. 6 or FIGS. 35 to 38. It is possible to constantly adjust rising slopes of program and pass voltages Vpgm and Vpass provided to word lines of the memory block BLKm' at a program operation. Accordingly, a reduction in the loss of read margin due to a program-speed difference may be provided. It is possible to adjust rising slopes of selection and non-selection read voltages Vrd and Vread provided to word lines of the memory block BLKm' at a read operation. Accordingly, read disturbances may be prevented.

Figure 45:
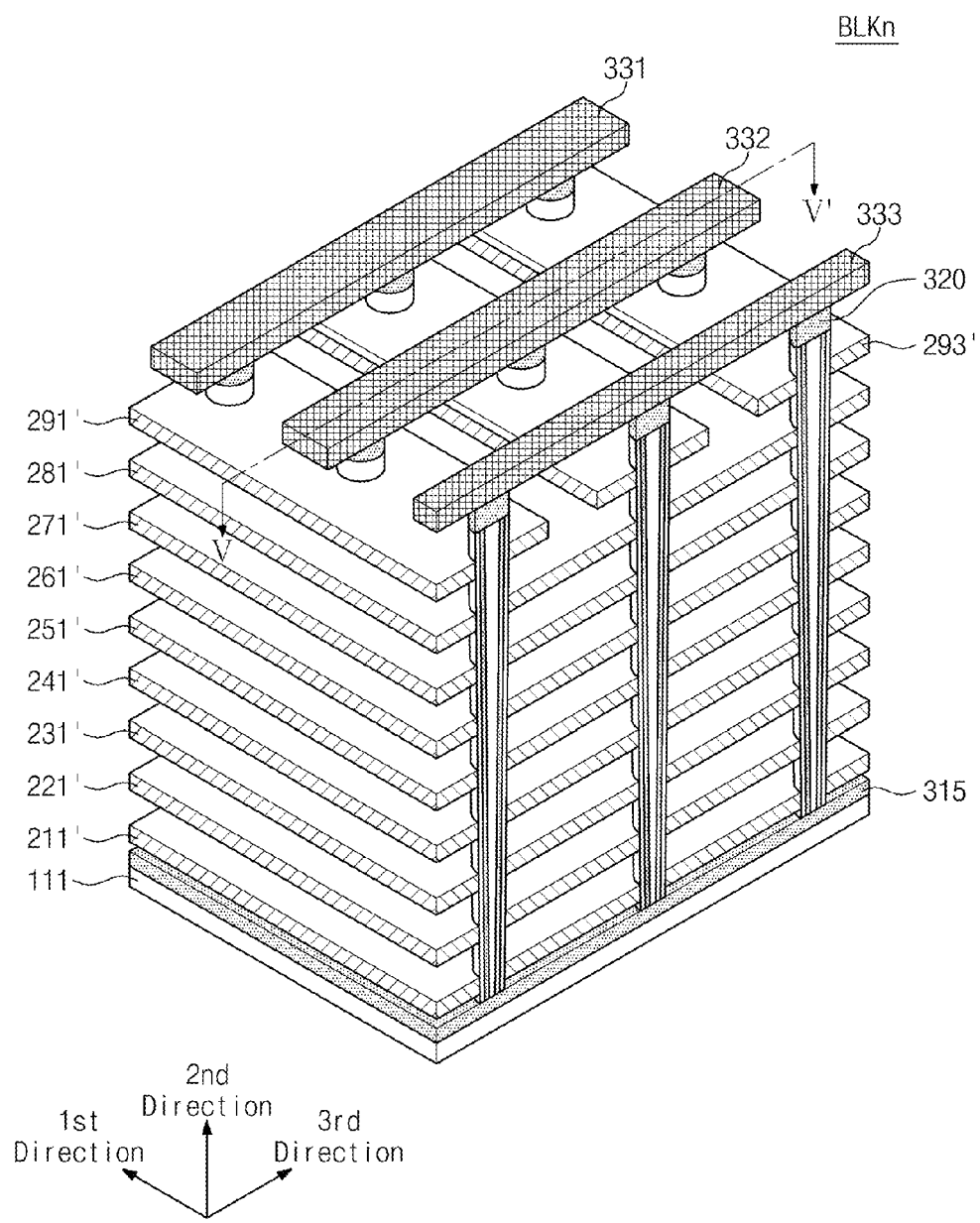
FIG. 45 is a perspective view further illustrating one of the memory blocks of FIG. 3 according to still another embodiment of the inventive concept.
Figure 46:
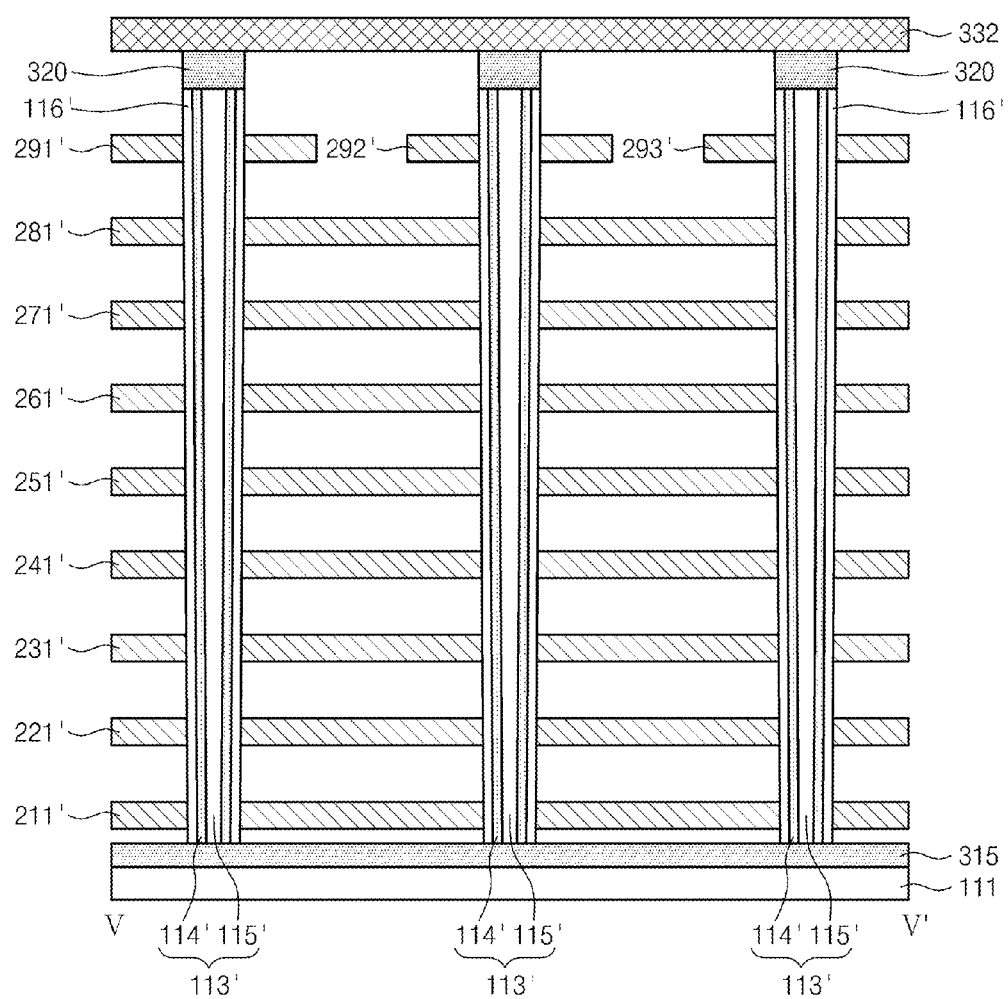
FIG. 46 is a cross-sectional view of a memory block taken along a line V-V' in FIG. 45.

FIG. 45 is a perspective view further illustrating one of memory blocks of FIG. 3 according to still another exemplary embodiment of the inventive concept. FIG. 46 is a cross-sectional view of a memory block taken along a line V-V' in FIG. 45. Referring to FIGS. 45 and 46, an n-type doping region 315 forming a common source line CSL may be provided to have a plate shape as described with reference to FIGS. 41 and 42.

As compared with a memory block BLKi described in FIGS. 3 and 4, first conductive lines 221' to 281' forming word lines WL1 to WL7 may be provided to have a plate shape.

A surface layer 116' of each pillar 113' may include an insulation film. The surface layer 116' may be configured to store data like an insulation film 116 described in FIG. 5. For example, the surface layer 116' may include a tunneling insulation film, a charge storing film, and a blocking insulation film. An intermediate layer 114' of the pillar 113' may include p-type silicon. An intermediate layer 114' of the pillar 113' may operate as a body of the second direction. An inner layer 115' of the pillar 113' may include an insulation material.

In an exemplary embodiment, when used as a string selection line SSL, the first conductive line 281' of the eighth height may be divided like the first conductive line 291' of the ninth height.

Figure 53:
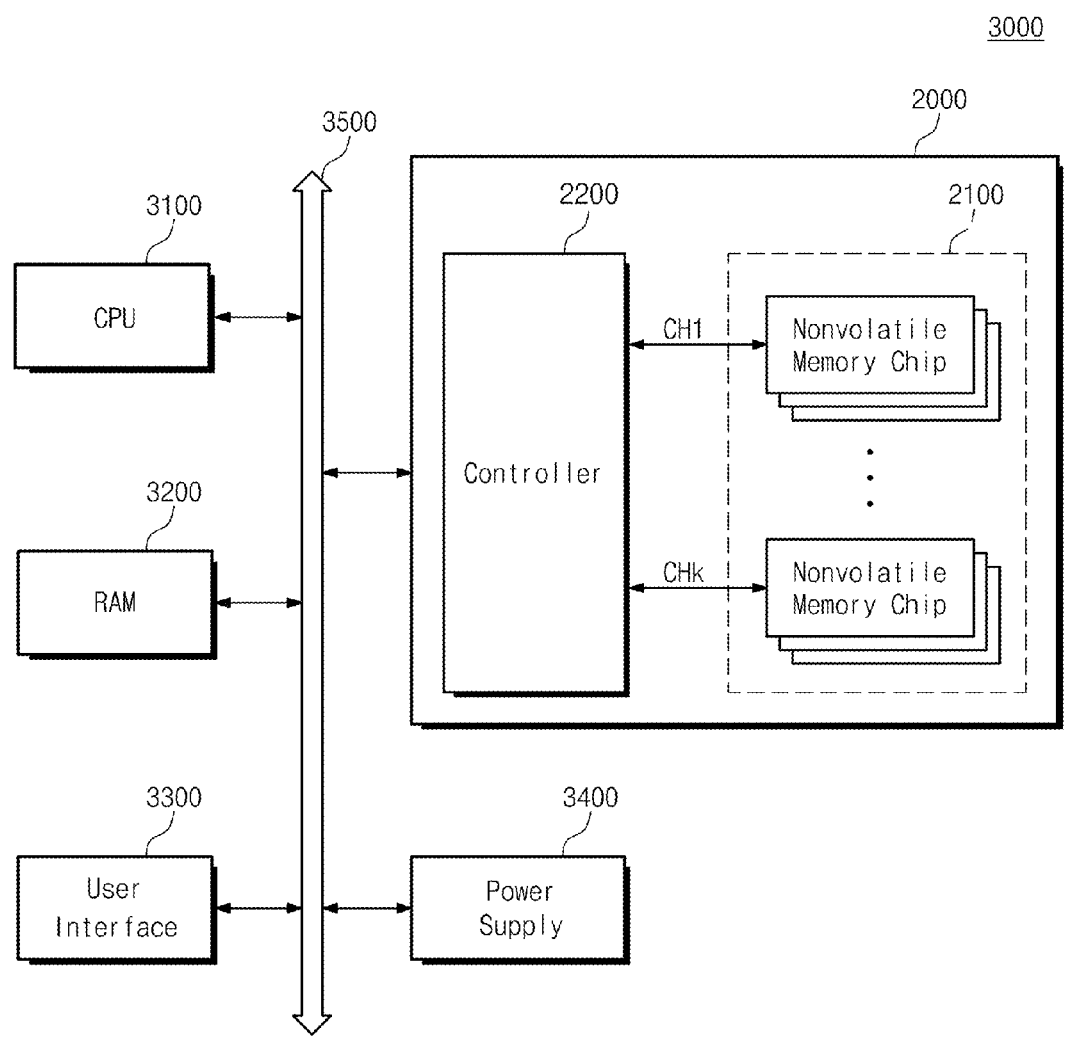
FIG. 53 is a general block diagram illustrating a computational system including a memory system such as the type described with reference to FIG. 52.

The memory block BLKn may be implemented by equivalent circuits described in FIG. 6 or FIGS. 53 to 38. It is possible to constantly maintain rising slopes of program and pass voltages Vpgm and Vpass provided to word lines of the memory block BLKn at a program operation. Accordingly, a reduction in the loss of read margin due to a program-speed difference may be provided. It is possible to constantly maintain rising slopes of selection and non-selection read voltages Vrd and Vread provided to word lines of the memory block BLKn at a read operation. Accordingly, read disturbances may be prevented.

Figure 47:
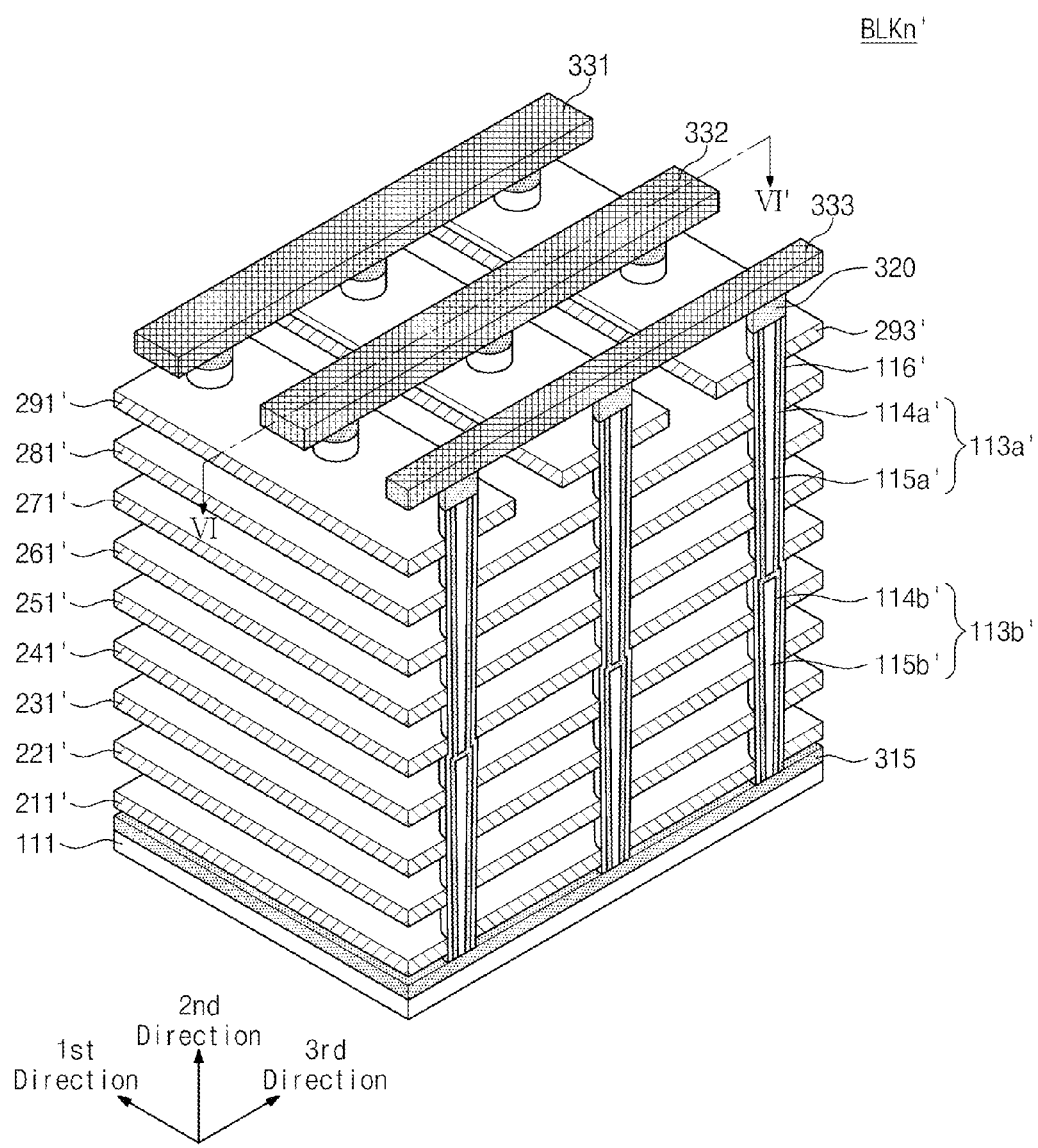
FIG. 47 is a perspective view further illustrating the memory block of FIG. 45 according to an embodiment of the inventive concept.
Figure 48:
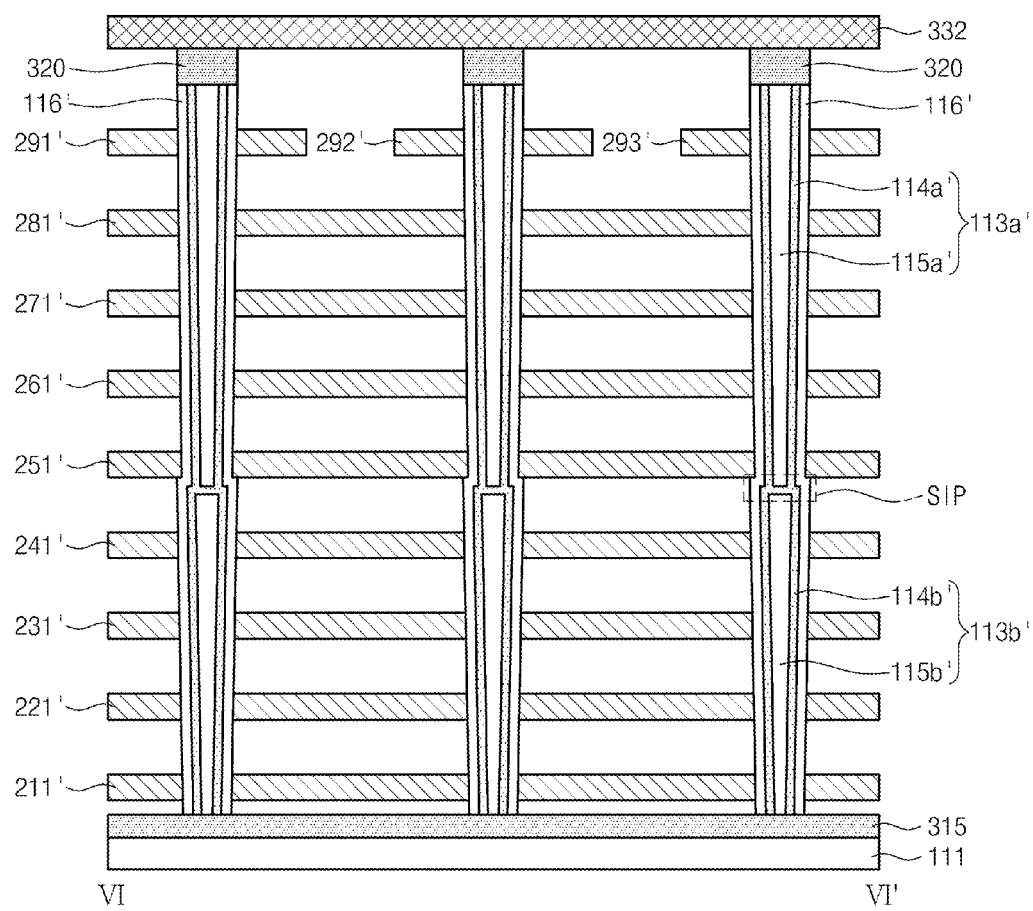
FIG. 48 is a cross-sectional view taken of a memory block along a line VI-VI' in FIG. 47.

FIG. 47 is a perspective view further illustrating the memory block of FIG. 45 according to an exemplary embodiment of the inventive concept. FIG. 48 is a cross-sectional view taken of a memory block along a line VI-VI' in FIG. 47. A memory block BLKn' may be identical to that described in FIGS. 45 and 46 except that one pillar includes first and second sub-pillars 113*a* and 113*b*.

One pillar of the memory block BLKn' may include the first and second sub-pillars 113*a* and 113*b*. The first sub-pillars 113*a* and the second sub-pillars 113*b* may be configured the same as that described in FIGS. 35 and 36.

The memory block BLKn' may be implemented by equivalent circuits described in FIG. 6 or FIGS. 53 to 38. It is possible to constantly maintain rising slopes of program and pass voltages Vpgm and Vpass provided to word lines of the memory block BLKn' at a program operation. Accordingly, a reduction in the loss of read margin due to a program-speed difference may be had. It is possible to constantly maintain rising slopes of selection and non-selection read voltages Vrd and Vread provided to word lines of the memory block BLKn' at a read operation. Accordingly, the read disturbance can be prevented.

Figure 49:
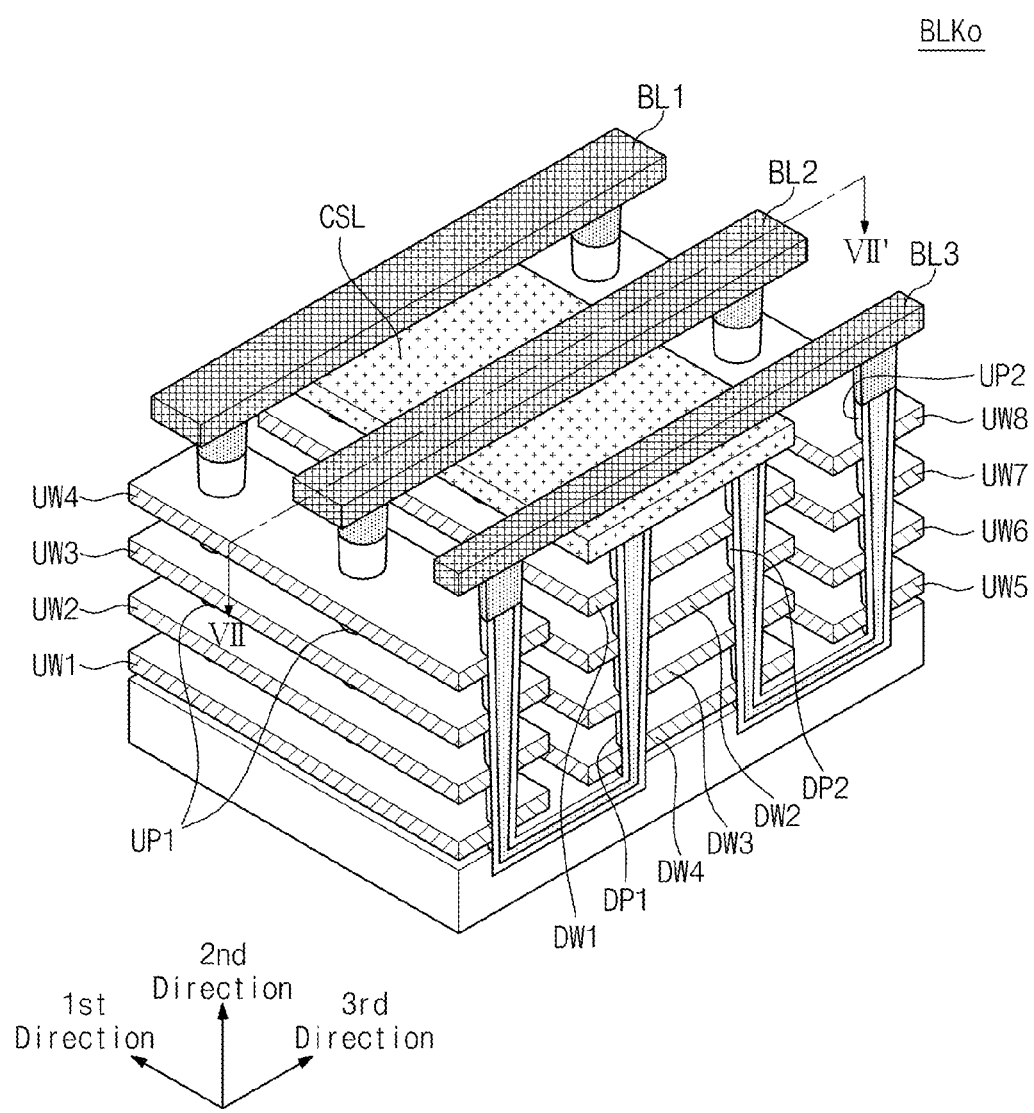
FIG. 49 is a perspective view further illustrating one of the memory blocks of FIG. 2 according to still another embodiment of the inventive concept.
Figure 50:
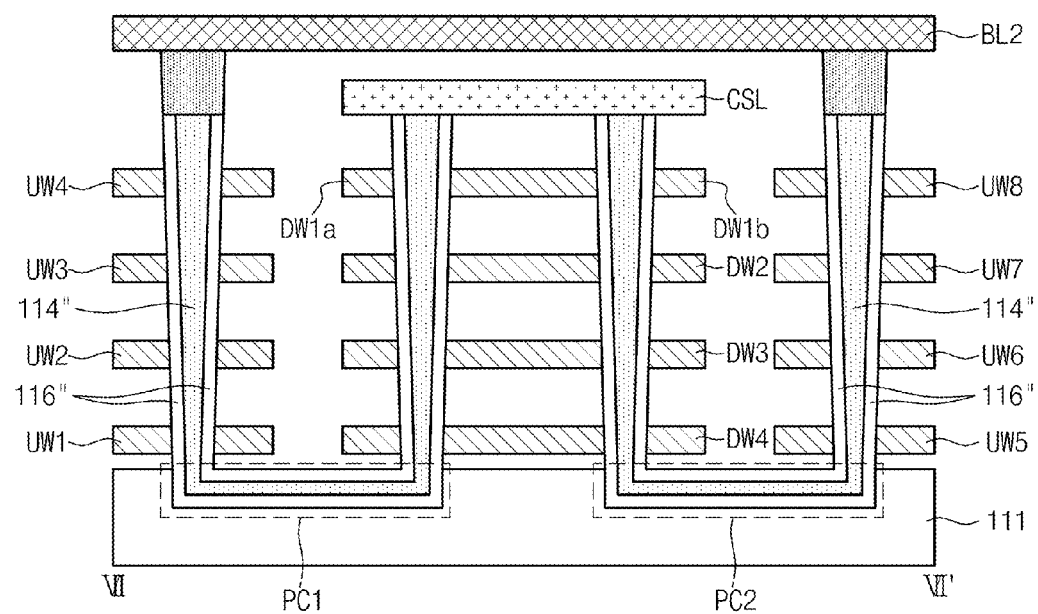
FIG. 50 is a cross-sectional view of a memory block taken along a line VII-VII' in FIG. 49.

FIG. 49 is a perspective view further illustrating one of the memory blocks in FIG. 2 according to still another exemplary embodiment of the inventive concept. FIG. 50 is a cross-sectional view of a memory block taken along a line VII-VII' in FIG. 49.

Referring to FIGS. 49 and 50, first to fourth upper word lines UW1 to UW4 extending along a first direction may be provided on a substrate 111 and sequentially along a second direction. The first to fourth upper word lines UW1 to UW4 may be spaced apart along the second direction, and first upper pillars UP1 may be provided to penetrate the first to fourth upper word lines UW1 to UW4 along the second direction.

First to fourth down word lines DW1 to DW4 extending along the first direction may be provided on the substrate 111 and sequentially along the second direction, so as to be spaced apart from the first to fourth upper word lines UW1 to UW4 in the third direction. The first to fourth down word lines DW1 to DW4 may be spaced apart from one another in the second direction.

The first down pillars DP1 penetrating the first to fourth down word lines DW1 to DW4 may be provided so as to be spaced apart from one another in the first direction. The second down pillars DP2 penetrating the first to fourth down word lines DW1 to DW4 along the second direction may be provided so as to be spaced apart from one another in the first direction. For example, the first down pillars DP1 and the second down pillars DP2 may be disposed to be parallel along the second direction.

Fifth to eighth upper word lines UW5 to UW8 extending along the first direction may be provided on the substrate 111 and sequentially along the second direction, so as to be spaced apart from the down word lines DW1 to DW4 in the third direction. The fifth to eighth upper word lines UW5 to UW8 may be spaced apart from one another along the second direction. The second upper pillars UP2 penetrating the fifth to eighth upper word lines UW5 to UW8 along the second direction may be spaced apart from one another along the first direction.

A common source line CSL extending in the first direction may be provided on the first and second down pillars DP1 and DP2. For example, the common source line CSL may include an n-type silicon material. Alternatively, when the common source line CSL is formed of a conductive material, having no polarity, such as metal or polysilicon, n-type sources may be additionally provided between the common source line CSL and the first and second down pillars DP1 and DP2. In an exemplary embodiment, the common source line CSL and the first and second down pillars DP1 and DP2 may be connected via contact plugs, respectively.

Drains 320 may be provided on the first and second upper pillars UP1 and UP2, respectively. For example, the drains 320 may include an n-type silicon material. A plurality of bit lines BL1 to BL3 extending along the third direction may be provided above the drains 320 sequentially along the first direction. The bit lines BL1 to BL3 may be formed of metal, for example. The bit lines BL1 to BL3 and the drains 320 may be connected through contact plugs.

Each of the first and second upper pillars UP1 and UP2 may include a surface layer 116" and an inner layer 114". Each of the first and second down pillars DP1 and DP2 may include a surface layer 116" and an inner layer 114". The surface layer 116" may be configured to store data like an insulation film 116 described in FIG. 5. Each of the surface layers 116" of the pillars UP1, UP2, DP1, and DP2 may include a blocking insulation film, a charge storage film, and a tunneling insulation film.

The tunneling insulation film may include a thermal oxide film. The charge storage film 118 may include a nitride film or a metal oxide film (for example, an aluminum oxide film, a hafnium oxide film, etc.). The blocking insulation film 119 may be formed of a single layer or multi-layer structure. The blocking insulation film 119 may be a high dielectric film, having a higher dielectric constant than a tunnel insulation film and a charge storage film, such as an aluminum oxide film, a hafnium oxide film, etc. The tunnel insulation film, the charge storage film, and the blocking insulation film may constitute Oxide-Nitride-Oxide (ONO).

Each of the inner layers 114" of the pillars UP1, UP2, DP1, and DP2 may include a p-type silicon material. The inner layers 114" may operate as a body of the second direction.

The first upper pillars UP1 and the first down pillars DP1 are connected via first pipeline contacts PC1 formed at the substrate 111. For example, the surface layers 116" of the pillars UP1 and DP1 may be connected through surface layers of the first pipeline contacts PC1, respectively. The surface layers of the first pipeline contacts PC1 may be formed of the same material as the surface layers 116" of the pillars UP1 and DP1.

In an exemplary embodiment, the inner layers 114" of the pillars UP1 and DP1 may be connected via inner layers of the first pipeline contacts PC1, respectively. The inner layers of the first pipeline contacts PC1 may be formed of the same material as the inner layers 116" of the pillars UP1 and DP1.

That is, the first upper pillars UP1 and the first to fourth upper word lines UW1 to UW4 may constitute first upper strings, and the first down pillars DP1 and the first to fourth down word lines DW1 to DW4 may constitute first down strings. The first upper strings and the first down strings may be connected via the first pipeline contacts PC1, respectively. One ends of the first upper strings may be connected with drains 320 and bit lines BL1 to BL3. One ends of the first down strings may be connected with a common source line CSL. That is, the first upper strings and the first down strings may constitute a plurality of strings connected between the bit lines BL1 to BL3 and the common source line CSL.

Likewise, the second upper pillars UP2 and the fifth to eighth upper word lines UW5 to UW8 may constitute second upper strings, and the second down pillars DP1 and the first to fourth down word lines DW1 to DW4 may constitute second down strings. The second down strings and the second down strings may be connected via the second pipeline contacts PC2, respectively. One ends of the second upper strings may be connected with the drains 320 and the bit lines BL1 to BL3. One ends of the second down strings may be connected with the common source line CSL. That is, the second upper strings and the second down strings may constitute a plurality of strings connected between the bit lines BL1 to BL3 and the common source line CSL.

An equivalent circuit of a memory block BLKo may be identical to that illustrated in FIG. 6 except that eight transistors are provided in one string and two strings are connected to each of the first to third bit lines BL1 to BL3. However, word lines, bit lines, and strings of the memory block BLKo are not limited in number to this disclosure.

The first and second pipeline contact gates (not shown) can be provided to form a channel at an inner layer operating as a body at the first and second pipeline contacts PC1 and PC2. For example, the first and second pipeline contact gates (not shown) may be provided on surfaces of the first and second pipeline contacts PC1 and PC2.

For ease of description, for example, conductive lines UW1 to UW8 and DW1 to DW4 extending in the first direction are described to be word lines. However, upper word lines UW1 and UW8 adjacent to the bit lines BL1 to BL3 can be used as string selection lines SSL.

Figure 51:
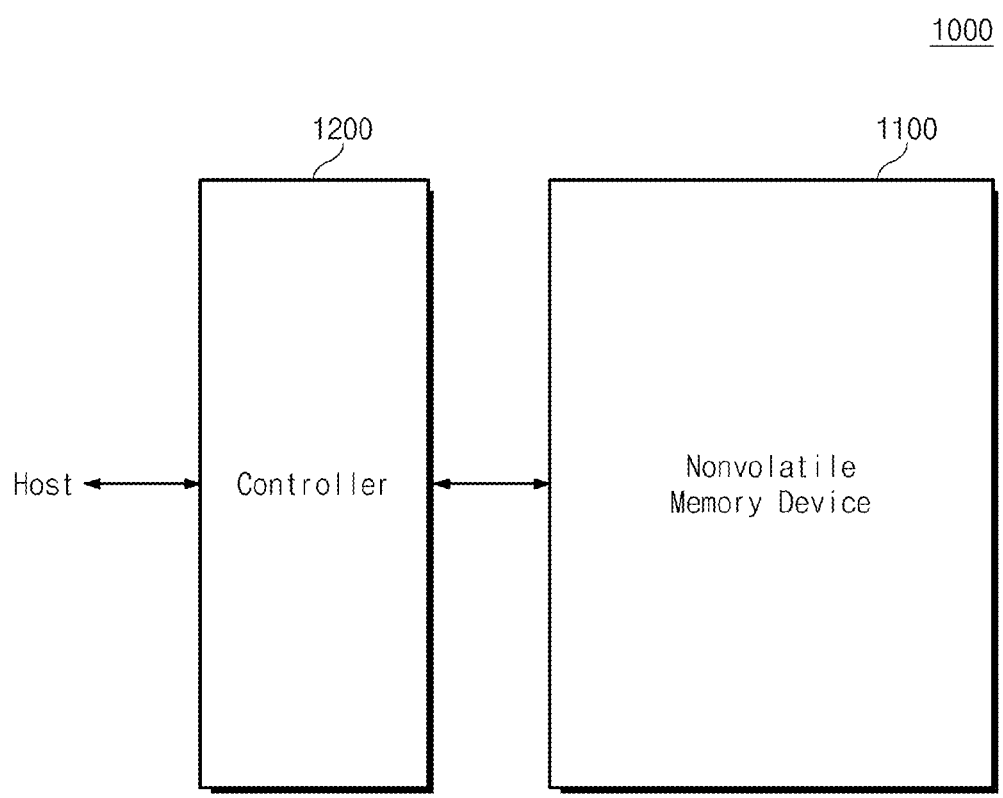
FIG. 51 is a general block diagram of a memory system including a nonvolatile memory device, such as the type described in FIGS. 1, 15, 21, and/or 29.

FIG. 51 is a block diagram illustrating a memory system including a nonvolatile memory device such as the type previously described in relation to the embodiments of FIG. 1, 15, 21, or 29. Referring to FIG. 51, a memory system 1000 generally comprises a nonvolatile memory device 1100 and a controller 1200.

The nonvolatile memory device 1100 may be configured like those described in relation to FIGS. 1 to 50. That is, the nonvolatile memory device 1100 may constantly maintain rising slopes of driving signals provided to word lines by generating voltages (e.g., Vpgm/Vpass or Vrd/Vread) stepwise increasing up to a target voltage. Accordingly, it is possible to prevent reduction of a read margin and a read disturbance.

The controller 1200 may be connected to a host (not shown) and the nonvolatile memory device 1100. The controller 1200 may be configured to access the nonvolatile memory device 1100 in response to a request from the host. For example, the controller 1200 may be configured to control read, write, erase, and background operations of the nonvolatile memory device 1100. The controller 1200 may be configured to provide an interface between the nonvolatile memory device 1100 and the host. The controller 1200 may be configured to drive firmware for controlling the nonvolatile memory device 1100.

In an exemplary embodiment, the controller 1200 may include elements such as RAM, a processing unit, a host interface, a memory interface, etc. The RAM may be used as at least one of an operating memory of the processing unit, a cache memory of the host and the nonvolatile memory device 1100, and a buffer memory between the nonvolatile memory device 1100 and the host. The processing unit may control an overall operation of the controller 1200.

The host interface may include the protocol for executing data exchange between the host and the controller 1200. For example, the controller 1200 may be configured to communicate with an external device (for example, a host) through at least one of various interface protocols such as Universal Serial Bus (USB) protocol, MultiMedia Card (MMC) protocol, Peripheral Component Interconnection (PCI) protocol, PCI-express (PCI-E) protocol, Advanced Technology Attachment (ATA) protocol, Serial-ATA protocol, Parallel-ATA protocol, Small Computer Small Interface (SCSI) protocol, Enhanced Small Disk Interface (ESDI) protocol, Integrated Drive Electronics (IDE) protocol, and the like. The memory interface may interface with the nonvolatile memory device 1100. For example, the memory interface may include a NAND interface or a NOR interface.

The memory system 1000 may further include an ECC block, which is configured to detect and correct errors of data read from the nonvolatile memory device using ECC. In an exemplary embodiment, the ECC block may be provided as an element of the controller 1200. Alternatively, the ECC block can be provided as an element of the nonvolatile memory device 1100.

The controller 1200 and the nonvolatile memory device 1100 may be integrated to one semiconductor device. For example, the controller 1200 and the nonvolatile memory device 1100 may be integrated to one semiconductor device to form a memory card such as a PC (PCMCIA) card, a CF card, an SM card (SMC), a memory stick, an MMC card, an RS-MMC card, an MMCmicro card, an SD card, a miniSD card, a microSD card, an SDHC card, an UFS card, etc.

The controller 1200 and the nonvolatile memory device 1100 may be integrated to one semiconductor device to form a Solid State Drive (SSD). The SSD may include a storage device which is configured to store data in semiconductor memories. In the event that the memory system 1000 is used as the SSD, an operating speed of a host connected with the memory system 1000 may be improved remarkably.

In some embodiments, the memory system 1000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting computing system.

In an exemplary embodiment, the nonvolatile memory device 1100 or the memory system 1000 may be packed by various packages such as PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

Figure 52:
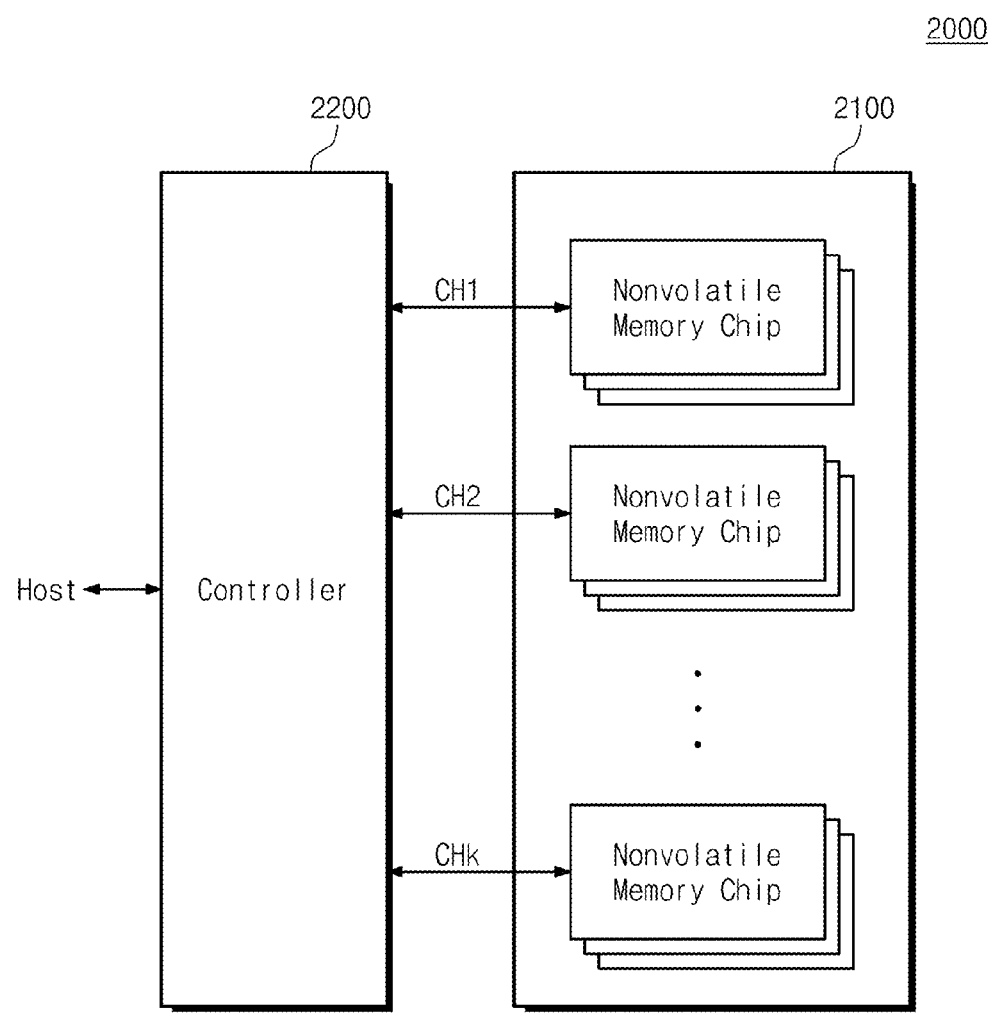
FIG. 52 is a block diagram illustrating one possible application of the memory system in FIG. 51.

FIG. 52 is a block diagram illustrating one possible application for the memory system of FIG. 51. Referring to FIG. 52, a memory system 2000 comprises a nonvolatile memory device 2100 and a controller 2200. The nonvolatile memory device 2100 may be implemented using a plurality of nonvolatile memory chips divided into a plurality of groups (e.g., 4 in the illustrated example). Nonvolatile memory chips in each group may be configured to communicate with the controller 2200 via one common channel. In FIG. 52, the plurality of nonvolatile memory chips communicates with the controller 2200 via a plurality of channels CH1 to CHk.

Each nonvolatile memory chip may be configured the same as nonvolatile memory devices 100, 200, 300, or 400 previously described in FIGS. 1 to 50. That is, the nonvolatile memory chip may constantly maintain rising slopes of driving signals provided to word lines by generating voltages (e.g., Vpgm/Vpass or Vrd/Vread) stepwise increasing up to a target voltage. Accordingly, it is possible to prevent reduction in read margin and the occurrence of read disturbances.

In FIG. 52, a plurality of nonvolatile memory chips are connected via one channel. However, it is understood that the memory system 2000 may be modified such as only one nonvolatile memory chip is connected via any given channel.

FIG. 53 is a general block diagram of a computational system including a memory system such as the one described with reference to FIG. 52. Referring to FIG. 53, a computational system 3000 comprises a CPU 3100, a RAM 3200, a user interface 3300, a power supply 3400, and a memory system 2000.

The memory system 2000 may be connected with the CPU 3100, the RAM 3200, the user interface 3300, and the power supply 3400 via a system bus 3500. The memory system 2000 may store data processed by the CPU 3100 or provided via the user interface 3300.

In FIG. 53, there is exemplarily illustrated such an example that the nonvolatile memory device 2100 is connected with the controller 2200 via the system bus 3500. However, the nonvolatile memory device 2100 can be directly connected to the system bus 3500.

In FIG. 53, there is exemplarily described the case that the memory system 2000 described in FIG. 52 is provided. However, the memory system 200 can be replaced with a memory system 1000 described in FIG. 51.

In an exemplary embodiment, the computational system 3000 may be configured to include any one of the memory systems 1000 and 2000 described in FIGS. 51 and 52.

The above-disclosed subject matter is to be considered illustrative, and not restrictive, and the appended claims are intended to cover all such modifications, enhancements, and other embodiments, which fall within their scope. Thus, to the maximum extent allowed by law, the scope is to be determined by the broadest permissible interpretation of the following claims and their equivalents, and shall not be restricted or limited by the foregoing detailed description.

What is claimed is:

1. A nonvolatile memory device comprising:
a three-dimensional memory cell array including a plurality of memory cells arranged in a plurality memory cell array layers stacked on a substrate, such that a plurality of words lines extends across the plurality of memory cell array layers from a lowest memory cell array layer closest to the substrate to a highest memory cell array layer farthest from the substrate;
a voltage generator circuit that generates a first voltage signal and a second voltage signal; and
a row selecting circuit that simultaneously applies the first voltage signal to a selected word line among the plurality of word lines and the second voltage signal to an unselected word line among the plurality of word lines,
wherein the selected word line and the unselected word line have different resistances,
the first voltage signal is applied to the selected word line and the second voltage signal is applied to the unselected word line with a same rising slope over a defined period of time, and
during the defined period of time the voltage generator circuit increases the first voltage signal and the second voltage signal from a first level to a second level.

2. The nonvolatile memory device of claim 1, wherein the first level is ground and the second level is a pass voltage level.

3. The nonvolatile memory device of claim 1, wherein the first level is a pass voltage level and the second level is a program voltage level.

4. The nonvolatile memory device of claim 1, wherein the voltage generator circuit comprises:
a first voltage generator that stepwise generates the first voltage signal to a program voltage level; and
a second voltage generator that stepwise generates the second voltage signal stepwise to a pass voltage level.

5. The nonvolatile memory device of claim 1, further comprising control logic that controls operation of the voltage generator circuit and the row selecting circuit.

6. The nonvolatile memory device of claim 5, wherein the control logic comprises ramping logic that defines the rising slope.

7. The nonvolatile memory device of claim 5, further comprising a ramping control unit separate from the control logic that controls the voltage generator circuit to define the rising slope.

8. The nonvolatile memory device of claim 5, wherein the row selecting circuit comprises:
a word line driver that receives the first and second voltage signals;
a ramper configured to adjust respective first and second rising slopes for the first and second voltage signals to generate first and second driving signals; and
a row decoder that selectively applies the first and second driving signals to the plurality of word lines.

9. The nonvolatile memory device of claim 8, wherein the ramper is configured within the word line driver.

10. The nonvolatile memory device of claim 8, wherein the ramper is configured within the word line driver.

11. The nonvolatile memory device of claim 1, wherein the first level is ground and the second level is a non-selection read voltage level.

12. The nonvolatile memory device of claim 1, wherein the first level is a non-selection read level and the second level is a selection read level.

13. A nonvolatile memory device comprising:
a three-dimensional (3D) memory cell array including a plurality of memory cells arranged in a plurality memory cell array layers stacked on a substrate, such that a plurality of words lines extends across the plurality of memory cell array layers from a lowest memory cell array layer closest to the substrate to a highest memory cell array layer farthest from the substrate, wherein the 3D memory cell array comprises a pillar that extends through the plurality of memory cell array layers and that progressively narrows in width as it extends from the highest memory cell array layer to the lowest memory cell array layer;

a voltage generator circuit that generates a first voltage signal and a second voltage signal; and a row selecting circuit that simultaneously applies the first voltage signal to a selected word line among the plurality of word lines and the second voltage signal to an unselected word line among the plurality of word lines, wherein each one of the plurality of words lines intersects the pillar with a different cross-sectional area, such that the selected word line and the unselected word line have different resistances, and the first voltage signal is applied to the selected word line and the second voltage signal is applied to the unselected word line with a same rising slope over a defined period of time.

14. The nonvolatile memory device of claim 13, wherein during the defined period of time the voltage generator circuit increases the first voltage signal and the second voltage signal from a first level to a second level.

15. The nonvolatile memory device of claim 14, wherein the first level is ground and the second level is a pass voltage level.

16. The nonvolatile memory device of claim 15, wherein the first level is a pass voltage level and the second level is a program voltage level.

17. The nonvolatile memory device of claim 13, wherein the voltage generator circuit comprises:

a first voltage generator that stepwise generates the first voltage signal to a program voltage level; and a second voltage generator that stepwise generates the second voltage signal stepwise to a pass voltage level.

18. The nonvolatile memory device of claim 13, further comprising control logic that controls operation of the voltage generator circuit and the row selecting circuit.

19. The nonvolatile memory device of claim 18, wherein the row selecting circuit comprises:

a word line driver that receives the first and second voltage signals;

a ramper configured to adjust respective first and second rising slopes for the first and second voltage signals to generate first and second driving signals; and a row decoder that selectively applies the first and second driving signals to the plurality of word lines.

* * * * *